(12) United States Patent
Koyanagi

(10) Patent No.: US 10,964,671 B2
(45) Date of Patent: Mar. 30, 2021

(54) STACKED CHIPS COMPRISING INTERCONNECTS

(71) Applicant: Toshiba Memory Corporation, Tokyo (JP)

(72) Inventor: Masaru Koyanagi, Ota Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/288,072

(22) Filed: Feb. 27, 2019

(65) Prior Publication Data

US 2020/0020670 A1 Jan. 16, 2020

(30) Foreign Application Priority Data

Jul. 12, 2018 (JP) .............................. JP2018-132427

(51) Int. Cl.
*H01L 23/48* (2006.01)
*H01L 23/522* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC .............. H01L 21/76898; H01L 23/481; H01L 23/5226; H01L 24/09; H01L 24/17; H01L 25/043; H01L 25/0652; H01L 25/0657; H01L 25/071; H01L 25/074; H01L 25/0756; H01L 25/112; H01L 25/117; H01L 27/0688; H01L 27/0694; H01L 27/1128; H01L 27/11514; H01L 27/11551; H01L 27/11578; H01L 27/11597;
(Continued)

(56) References Cited

U.S. PATENT DOCUMENTS 5,757,080 A 5/1998 Sota
7,259,451 B2 8/2007 Seng et al.
(Continued)

FOREIGN PATENT DOCUMENTS

JP 3129928 B2 1/2001
JP 3668165 B2 7/2005
(Continued)

*Primary Examiner* — Eduardo A Rodela
*Assistant Examiner* — Christopher M Roland
(74) *Attorney, Agent, or Firm* — Kim & Stewart LLP

(57) ABSTRACT

A semiconductor device includes first and second chips that are stacked such that first surfaces of their element layers face each other. Each chip has a substrate, an element layer on a first surface of the substrate, pads on the element layer, and vias that penetrate through the substrate and the element layer. Each via is exposed from a second surface of the substrate and directly connected to one of the pads. The vias include a first via of the first chip directly connected to a first pad of the first chip and a second via of the second chip directly connected to a second pad of the second chip. The pads further include a third pad of the second chip which is electrically connected to the second pad by a wiring in the element layer of the second chip and to the first pad through a micro-bump.

7 Claims, 50 Drawing Sheets

(51) Int. Cl.

| | | |
|---|---|---|
| *H01L 27/11578* | (2017.01) | |
| *H01L 27/11551* | (2017.01) | |
| *H01L 25/065* | (2006.01) | |
| *H01L 23/00* | (2006.01) | |
| *H01L 27/11573* | (2017.01) | |
| *H01L 21/768* | (2006.01) | |
| H01L 25/04 | (2014.01) | |
| H01L 25/075 | (2006.01) | |
| H01L 25/07 | (2006.01) | |
| H01L 25/11 | (2006.01) | |
| H01L 27/11514 | (2017.01) | |
| H01L 27/06 | (2006.01) | |
| H01L 27/112 | (2006.01) | |
| H01L 27/11597 | (2017.01) | |
| H01L 27/24 | (2006.01) | |

(52) U.S. Cl.
CPC ........... *H01L 23/5226* (2013.01); *H01L 24/09* (2013.01); *H01L 24/17* (2013.01); *H01L 27/11573* (2013.01); H01L 25/043 (2013.01); H01L 25/0652 (2013.01); H01L 25/071 (2013.01); H01L 25/074 (2013.01); H01L 25/0756 (2013.01); H01L 25/112 (2013.01); H01L 25/117 (2013.01); H01L 27/0688 (2013.01); H01L 27/0694 (2013.01); H01L 27/1128 (2013.01); H01L 27/11514 (2013.01); H01L 27/11551 (2013.01); H01L 27/11578 (2013.01); H01L 27/11597 (2013.01); H01L 27/2481 (2013.01); H01L 2225/06506 (2013.01); H01L 2225/06513 (2013.01); H01L 2225/06541 (2013.01); H01L 2225/06544 (2013.01); H01L 2225/1052 (2013.01); H01L 2225/1058 (2013.01)

(58) Field of Classification Search
CPC ....... H01L 27/2481; H01L 2225/06506; H01L 2225/06513; H01L 2225/06541; H01L 2225/06544; H01L 2225/1052; H01L 2225/1058
See application file for complete search history.

(56) References Cited

U.S. PATENT DOCUMENTS

| | | | |
|---|---|---|---|
| 9,653,430 B2 | 5/2017 | Kim et al. | |
| 2007/0155048 A1* | 7/2007 | Lee | H01L 21/76898 438/106 |
| 2010/0065949 A1 | 3/2010 | Thies et al. | |
| 2011/0248396 A1* | 10/2011 | Liu | H01L 25/0657 257/686 |
| 2013/0076387 A1* | 3/2013 | Ishikawa | H01L 25/0657 324/762.03 |
| 2014/0049280 A1* | 2/2014 | Kim | H01L 24/17 324/754.19 |
| 2014/0062587 A1* | 3/2014 | Koyanagi | G11C 16/08 327/595 |
| 2015/0021785 A1* | 1/2015 | Lin | H01L 25/0657 257/774 |
| 2017/0110159 A1* | 4/2017 | Hamada | G11C 8/12 |
| 2019/0385966 A1* | 12/2019 | Gao | H01L 24/80 |

FOREIGN PATENT DOCUMENTS

| | | |
|---|---|---|
| JP | 2006332342 A | 12/2006 |
| JP | 2012114214 A | 6/2012 |
| JP | 2014187220 A | 10/2014 |

* cited by examiner

FIG. 32
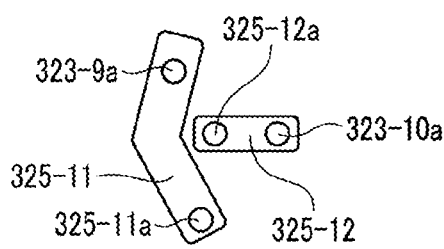
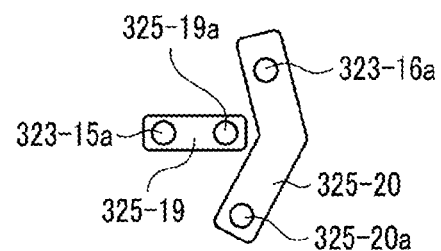

STACKED CHIPS COMPRISING INTERCONNECTS

CROSS-REFERENCE TO RELATED APPLICATION

This application is based upon and claims the benefit of priority from Japanese Patent Application No. 2018-132427, filed Jul. 12, 2018, the entire contents of which are incorporated herein by reference.

FIELD

Embodiments described herein relate generally to a semiconductor device.

BACKGROUND

A NAND flash memory is one type of a semiconductor device.

DESCRIPTION OF THE DRAWINGS

FIG. 32 is a top view illustrating an example of a wiring pattern of the sub-chips of the semiconductor device according to the modification example of the second embodiment.

DETAILED DESCRIPTION

Figure 1:
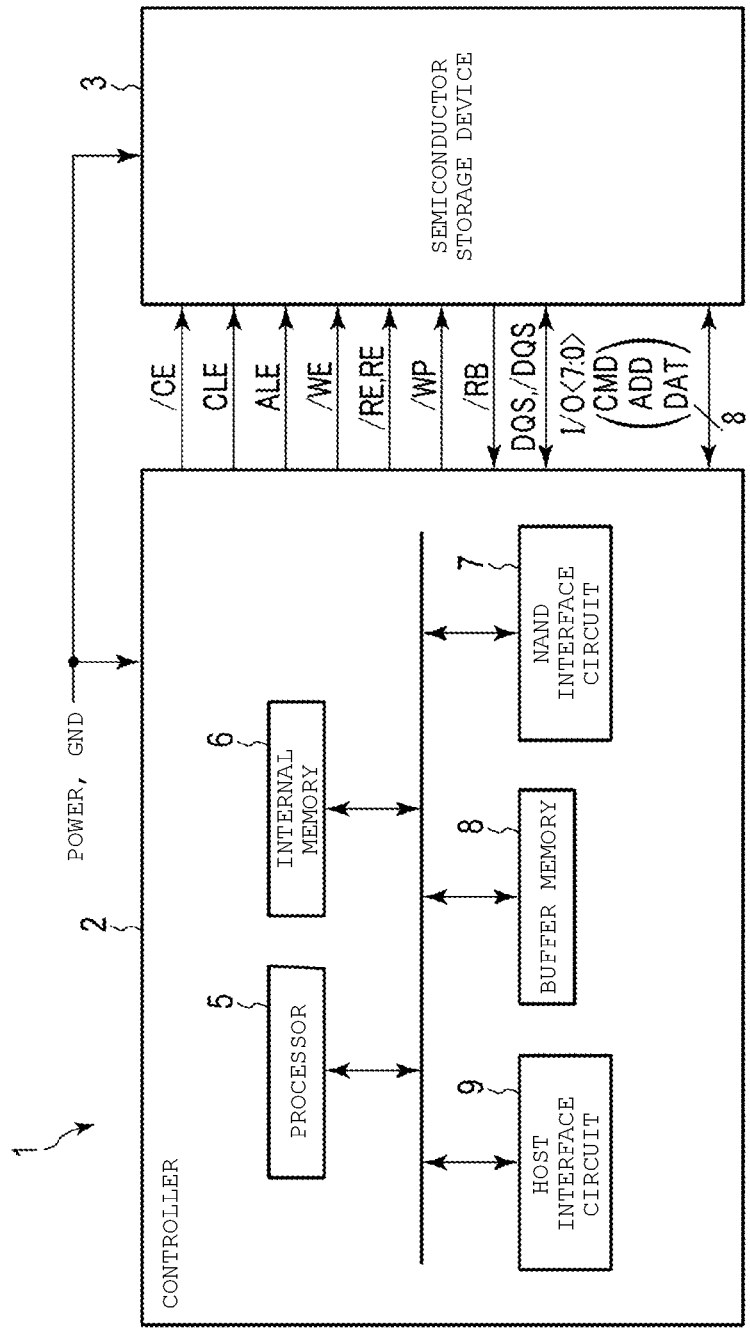
FIG. 1 is a block diagram illustrating a configuration of a memory system according to a first embodiment.

Embodiments provide a semiconductor device capable of reducing manufacturing cost.

In general, according to one embodiment, there is provided a semiconductor device including first and second chips. The first chip has a first substrate, a first element layer on a first surface of the first substrate, a plurality of pads, including a first pad, that are exposed from a first surface of the first element layer, and a plurality of vias, including a first via, that penetrate through the first substrate and the first element layer, each via being exposed from a second surface of the first substrate and being directly connected to one of the pads of the first chip. The second chip has a second substrate, a second element layer on a first surface of the second substrate, a plurality of pads, including a second pad and a third pad, that are exposed from a first surface of the second element layer, and a plurality of vias, including a second via, that penetrate through the second substrate and the second element layer, each via being exposed from a second surface of the second substrate and being directly connected to one of the pads of the second chip. The first pad is directly connected to the first via and the second pad is directly connected to the second via, and a first wiring provided in the second element layer electrically connects the second pad and the third pad. The first chip and the second chip are stacked on each other such that the first surface of the first element layer faces the first surface of the second element layer, and a first conductor is in direct contact with the first pad and the third pad.

Hereinafter, embodiments will be described with reference to the drawings. In the following description, elements having substantially the same function and configuration are given the same reference numeral. In a case where a plurality of elements having the same reference numeral are differentiated from each other, the elements are differentiated from each other by adding suffixes to the reference numeral. In a case where a plurality of elements having substantially the same function and configuration are not required to be differentiated from each other, they are described using the reference numeral given to them without suffixes added thereto.

1. First Embodiment

A semiconductor device according to a first embodiment will be described.

1-1. Configuration

First, a description will be made of a configuration of the semiconductor device according to the first embodiment.

1-1-1. Overall Configuration of Memory System

With reference to FIG. 1, a description will be made of a configuration example of a memory system according to the first embodiment. FIG. 1 is a block diagram illustrating an example of a configuration of a memory system according to the first embodiment. A memory system 1 is provided on, for example, an external substrate system (not illustrated). The memory system 1 is operated on the basis of a power source voltage and a ground voltage GND supplied from the substrate system, and performs communication with an external host apparatus (not illustrated). The memory system 1 stores data from the host apparatus (not illustrated), and reads data requested from the host apparatus.

As illustrated in FIG. 1, the memory system 1 includes a controller 2 and a semiconductor storage device (e.g., a NAND flash memory) 3. The controller 2 receives a command from the host apparatus, and controls the semiconductor storage device 3 on the basis of the received command. Specifically, the controller 2 writes data instructed to be written by the host apparatus, into the semiconductor storage device 3, and reads data instructed to be read by the host apparatus, from the semiconductor storage device 3, and transmits the data to the host apparatus. The controller 2 is connected to the semiconductor storage device 3 via a NAND bus. The semiconductor storage device 3 includes a plurality of memory cells, and stores data in a nonvolatile manner.

The NAND bus performs transmission and reception of signals /CE, CLE, ALE, /WE, /RE, RE, /WP, /RB, DQS, /DQS, I/O<7:0> based on a NAND interface standard. The signal /CE is a signal for enabling the semiconductor storage device 3. The signals CLE and ALE are used to notify the semiconductor storage device 3 that the signals I/O<7:0> which are input into the semiconductor storage device 3 along with the signals CLE and ALE contain respectively command CMD and an address ADD. The signal /WE is used to notify the semiconductor storage device 3 that the signals I/O<7:0> are input signals into the semiconductor storage device 3. The signals /RE and RE are used to instruct the semiconductor storage device 3 to output the signals I/O<7:0>. The signal /WP is used to give an instruction to the semiconductor storage device 3 that data writing and erasing in the semiconductor storage device 3 are to be prohibited. The signal /RB indicates whether the semiconductor storage device 3 is in a ready state (a state of being ready to receive a command from the outside) or in a busy state (a state of not being ready to receive a command from the outside). The signals I/O<7:0> are, for example, an 8-bit signal. The signals DQS and /DQS are reference signals used as timing indicators for the signals I/O<7:0> that are input into and output from the semiconductor storage device 3. The signals I/O<7:0> contain data transmitted and received between the semiconductor storage device 3 and the controller 2, and include the command CMD, the address ADD, data DAT, and a status STS. The data DAT includes write data and read data.

1-1-2. Configuration of Controller

A description will be made of the controller of the memory system according to the first embodiment. As illustrated in FIG. 1, the controller 2 includes a processor (e.g., central processing unit (CPU)) 5, an internal memory (e.g., random access memory (RAM)) 6, a NAND interface circuit 7, a buffer memory 8, and a host interface circuit 9.

The processor 5 controls the overall operation of the controller 2. The processor 5 issues, for example, a write command based on a NAND interface standard to the semiconductor storage device 3 in response to a data write command received from the host apparatus. The control flow is similar for reading and erasing.

The internal memory 6 is, for example, a semiconductor memory such as a dynamic RAM (DRAM), and is used as a work area of the processor 5. The internal memory 6 stores firmware for managing the semiconductor storage device 3, and various management tables.

The NAND interface circuit 7 is connected to the semiconductor storage device 3 via the NAND bus, and performs communication with the semiconductor storage device 3. The NAND interface circuit 7 transmits the command CMD, the address ADD, and write data to the semiconductor storage device 3 in response to an instruction from the processor 5. The NAND interface circuit 7 receives read data from the semiconductor storage device 3.

The buffer memory 8 temporarily stores data or the like received by the controller 2 from the semiconductor storage device 3 and the host apparatus.

The host interface circuit 9 is connected to the host apparatus, and performs communication with the host apparatus. The host interface circuit 9 transmits, for example, a command and data received from the host apparatus, to the processor 5 and the buffer memory 8, respectively.

1-1-3. Configuration of Semiconductor Device

Figure 2:
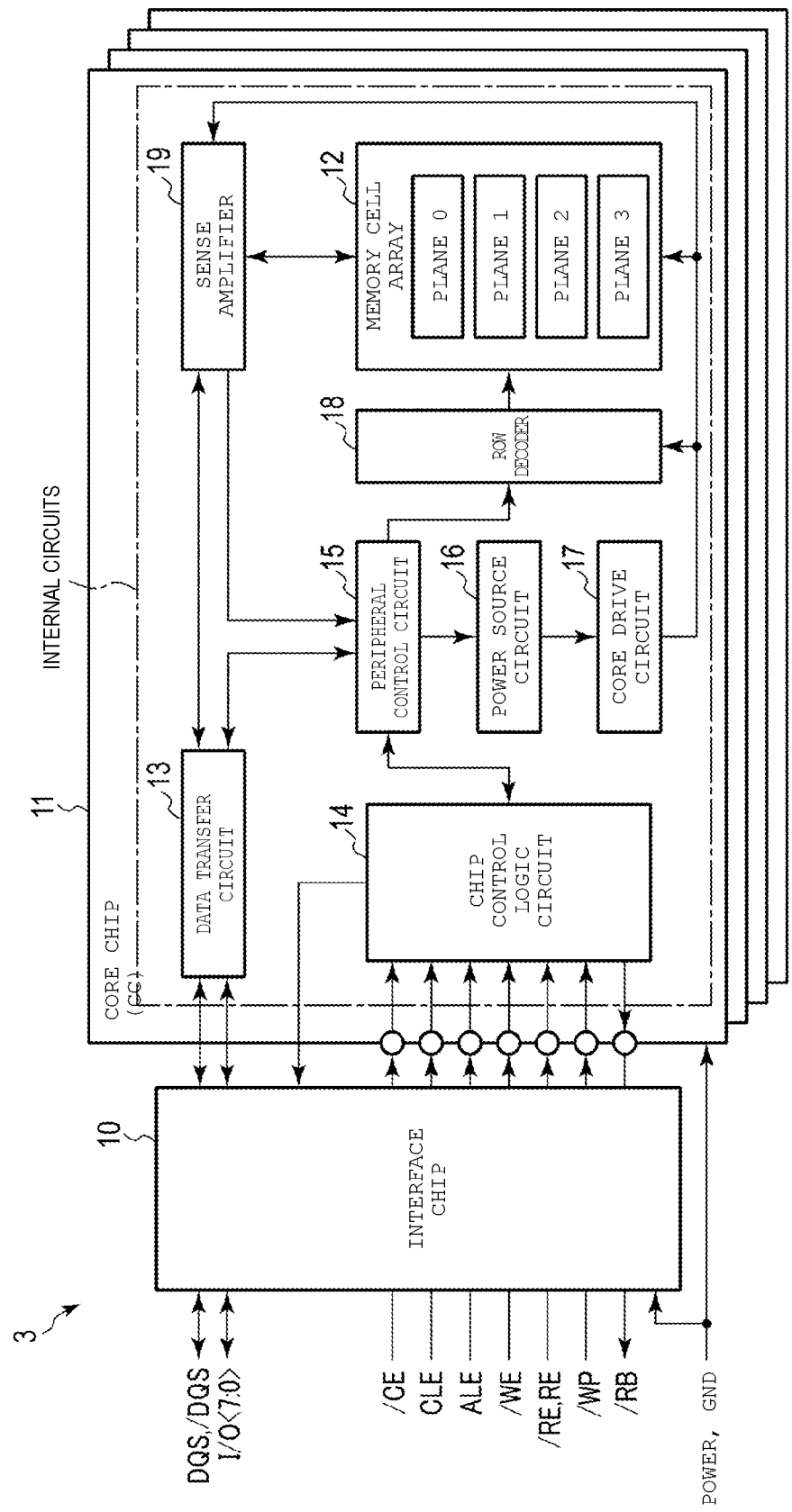
FIG. 2 is a block diagram illustrating a configuration of a semiconductor device according to the first embodiment.

Next, a description will be made of a configuration example of the semiconductor device according to the first embodiment with reference to FIG. 2. FIG. 2 is a block diagram illustrating an example of a configuration of the semiconductor device according to the first embodiment.

The semiconductor storage device 3 includes, for example, an interface chip 10 and a core chip group 11 which are operated on the basis of the power source voltage and the ground voltage GND supplied from the substrate system. The core chip group 11 includes, for example, a plurality of core chips CC (four chips CC0, CC1, CC2, and CC3 in the present embodiment). The number of core chips CC is not limited to four, and may be any number. Here, each of the "core chips CC" represent a unit of a semiconductor integrated circuit (chip) which may function as a single NAND flash memory along with the interface chip 10.

The interface chip 10 has a function of interfacing the signals /CE, CLE, ALE, /WE, /RE, RE, /WP, /RB, DQS, /DQS, I/O<7:0> between the controller 2 and the core chip group 11. The interface chip 10 transfers, for example, the command CMD and the address ADD in the signals I/O<7:0> to the core chip group 11 along with the signals DQS and /DQS. The interface chip 10 transmits and receives write data and read data in the signals I/O<7:0> to and from the core chip group 11 along with the signals DQS and /DQS.

Each of the core chips CC includes a memory cell array 12, a data transfer circuit 13, a chip control logic circuit 14, a peripheral control circuit 15, a power source circuit 16, a core drive circuit 17, a row decoder 18, and a sense amplifier 19. In the following description, various circuits provided in each core chip, including the memory cell array 12, the data transfer circuit 13, the chip control logic circuit 14, the peripheral control circuit 15, the power source circuit 16, the core drive circuit 17, the row decoder 18, and the sense amplifier 19 are collectively referred to as "internal circuits".

The memory cell array 12 includes a plurality of planes (herein, four planes including a plane 0, a plane 1, a plane 2, and a plane 3). Each plane includes a plurality of nonvolatile memory cell transistors (not illustrated) correlated with word lines and bit lines. For each plane, a write operation and a read operation may be performed simultaneously, for example, in a single write operation or a single read operation. The number of planes in the memory cell array 12 is not limited to four, and may be, for example, one, two, or eight.

The data transfer circuit 13 transfers the command CMD and the address ADD to the peripheral control circuit 15. The data transfer circuit 13 transmits and receives write data and read data to and from the sense amplifier 19.

The chip control logic circuit 14 receives signals corresponding to the signals /CE, CLE, ALE, /WE, /RE, RE, and /WP Via the interface chip 10. The chip control logic circuit 14 transfers the signal /RB to the controller 2 via the interface chip 10, so as to notify the outside a state of the core chip.

The peripheral control circuit 15 receives the command CMD, and controls the core chip according to an order based on the command CMD.

The power source circuit 16 generates voltages required for operations such as writing, reading, and erasing of data on the basis of instructions from the peripheral control circuit 15. The power source circuit 16 supplies the generated voltages to the row decoder 18 and the sense amplifier 19.

The row decoder 18 receives a row address in the address ADD from the peripheral control circuit 15, and selects a portion of each plane on the basis of the row address. A voltage from the power source circuit 16 is transferred to the selected portion of each plane via the row decoder 18.

The sense amplifier 19 senses read data which is read to a bit line from a memory cell transistor during data reading, and transfers the sensed read data to the data transfer circuit 13. The sense amplifier 19 transfers write data to be written to the memory cell transistor via the bit line. The sense amplifier 19 receives a column address in the address ADD from the peripheral control circuit 15, and outputs data corresponding to the column address.

In the example illustrated in FIG. 2, a description has been made of a configuration in which the interface chip 10 and the core chip group 11 are provided as different chips, but this is merely an example. In another example, the core chip group 11 may include a circuit having the same function as that of the interface chip 10. In this case, the core chip group 11 may perform communication of various signals with the controller 2 without using the interface chip 10.

1-1-4. Core Chip Group

Next, the core chip group of the semiconductor device according to the first embodiment will be described.

1-1-4-1. Signal Path in Core Chip

The core chips of the core chip group are electrically connected to each other through signal paths in each core chip.

Figure 3:
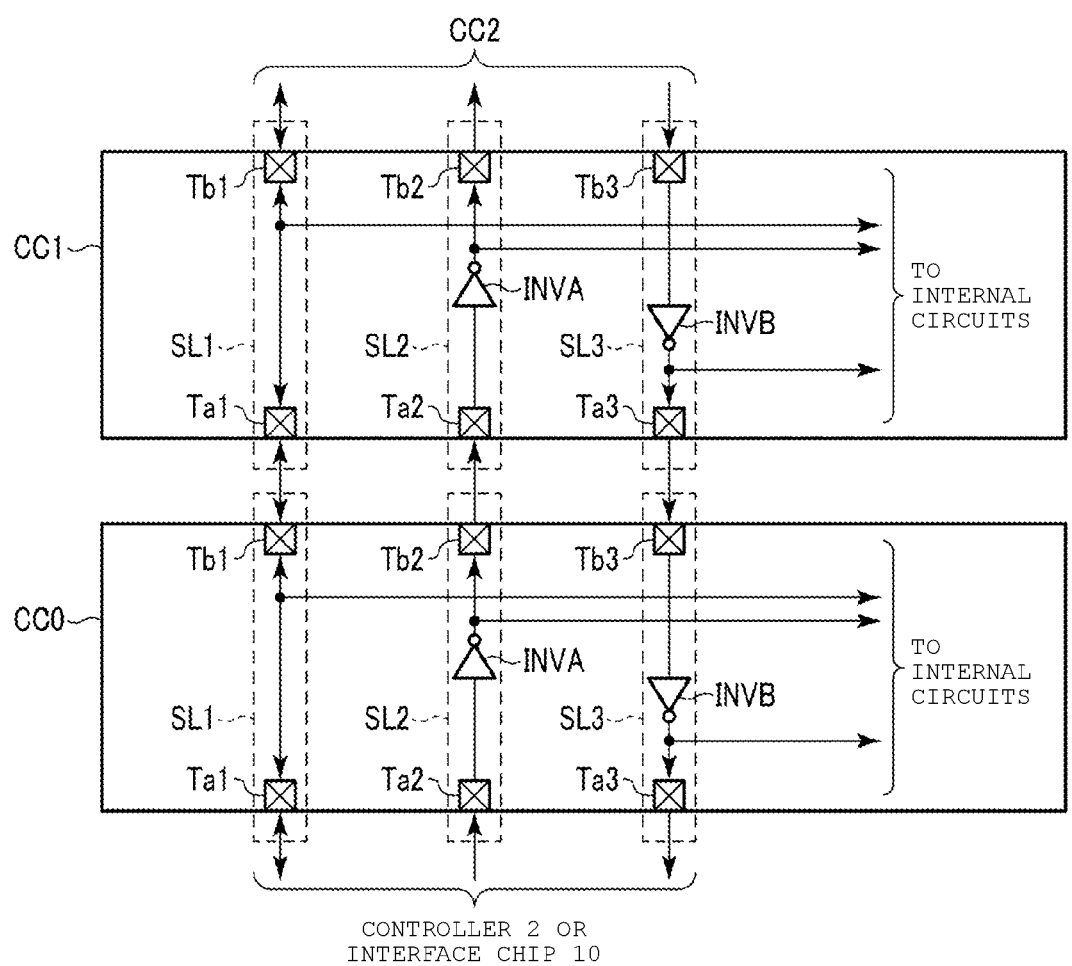
FIG. 3 is a circuit diagram illustrating signal paths of core chips of the semiconductor device according to the first embodiment.

Therefore, with reference to FIG. 3, a description will be made of signal paths of the core chips of the semiconductor device according to the first embodiment. FIG. 3 is a circuit diagram illustrating signal paths of the core chips of the semiconductor device according to the first embodiment.

As illustrated in FIG. 3, three types of signal paths SL1 to SL3 are provided in each of the core chips of the semiconductor device according to the first embodiment.

The signal path SL1 includes terminals Ta1 and Tb1, and a wiring layer (also referred to as a wiring, or more specifically as a metal wiring layer, a metal wiring, a metal layer, or a metal) which connect the terminals Ta1 and Tb1 to each other and are provided in the core chip CC. The signal path SL1 is used to supply the power source voltage and the ground voltage GND.

The signal path SL2 includes terminals Ta2 and Tb2, a wiring layer which connects the terminals Ta2 and Tb2 to each other in the core chip CC, and an inverter (more generally referred to as a logic element or a logic element layer) INVA which is provided on a wiring layer between the terminals Ta2 and Tb2, and has an input end connected to the terminal Ta2 and an output end connected to the terminal Tb2.

The signal path SL3 includes terminals Ta3 and Tb3, a wiring layer which connects the terminals Ta3 and Tb3 to each other in the core chip CC, and an inverter (more generally referred to as a logic element or a logic element layer) INVB which is provided on a wiring layer between the terminals Ta3 and Tb3, and has an output end connected to the terminal Ta3 and an input end connected to the terminal Tb3.

1-1-4-2. Configuration of Core Chip Group

Figure 4:
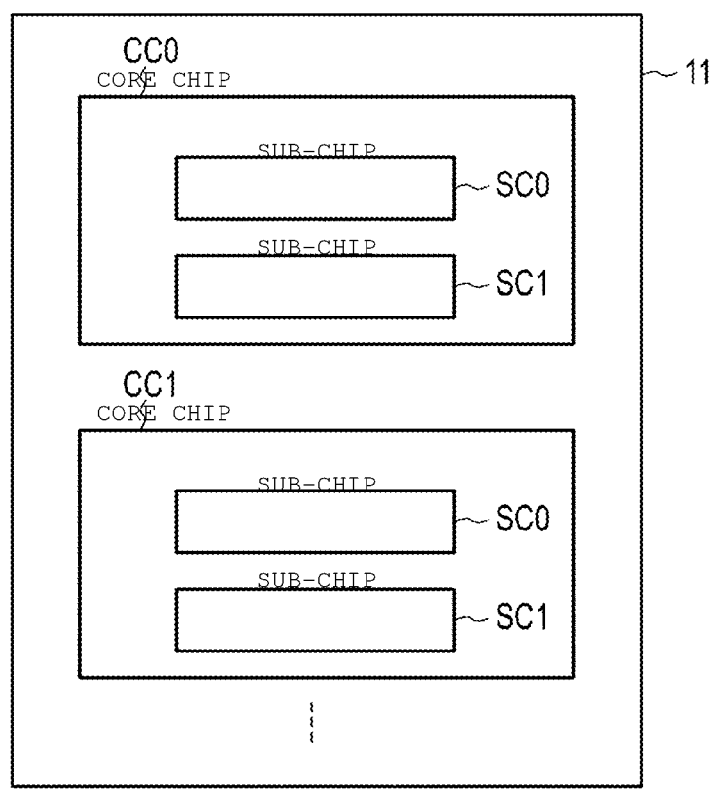
FIG. 4 is a block diagram illustrating an example of a configuration of a core chip group of the semiconductor device according to the first embodiment.

With reference to FIG. 4, a description will be made of a configuration example of the core chip group of the semiconductor device according to the first embodiment. FIG. 4 is a block diagram illustrating an example of a configuration of the core chip group of the semiconductor device according to the first embodiment.

As illustrated in FIG. 4, each of the core chips CC (that is, CC0, CC1, of the core chip group 11 includes a plurality of sub-chips SC. For example, the core chip CC includes sub-chips SC0 and SC1. The number of core chips CC may be any natural number.

Here, the "sub-chip SC" is a semiconductor integrated circuit provided on a single semiconductor substrate, and provides a component function of the core chip CC.

1-1-4-3. Configuration of Sub-Chip

Next, a description will be made of a configuration of the sub-chip of the semiconductor device according to the first embodiment.

A circuit configuration of the sub-chip includes, for example, a semiconductor integrated circuit provided on a semiconductor substrate and an element layer on the semiconductor substrate. The semiconductor integrated circuit is specifically designed according to the arrangement (also referred to as a "layout pattern") of internal circuits and the arrangement (also referred to as "wiring pattern") of a wiring layer connecting the internal circuits to each other. More specifically, for example, the layout pattern is used to determine the arrangement of the memory cell array 12 on the semiconductor substrate, the data transfer circuit 13, the chip control logic circuit 14, the peripheral control circuit 15, the power source circuit 16, the core drive circuit 17, the row decoder 18, the sense amplifier 19, and the signal paths in the core chip. For example, the wiring pattern is used to determine input and output relationships of internal circuits that are arranged according to the layout pattern. Information regarding the entire design of the sub-chip SC including the layout pattern and the wiring pattern will also be referred to as "chip design". In the following description, it is assumed that, for example, a region corresponding to a single semiconductor substrate is the unit of a single pattern in a chip which is cut out of a wafer in a dicing process.

In the following description, in a semiconductor substrate, a surface on which internal circuits are provided is defined as an "upper surface", and a surface opposite to the upper surface is defined as a "lower surface". On the other hand, in each layer of the internal circuits on the semiconductor substrate, a surface thereof on the semiconductor substrate side is defined as a "lower surface", and a surface opposite to the lower surface is defined as an "upper surface". A surface of a sub-chip on the semiconductor substrate side is defined as a "lower surface", and a surface of the sub-chip on the internal circuit side is defined as an "upper surface". A plane parallel to the upper surface and the lower surface of the semiconductor substrate is defined as an xy plane, and a direction perpendicular to the xy plane is defined as a z axis direction. An x axis direction and a y axis direction are assumed to be orthogonal to each other in the xy plane.

1-1-4-3-1. Layout of Sub-Chip SC0

Figure 5:
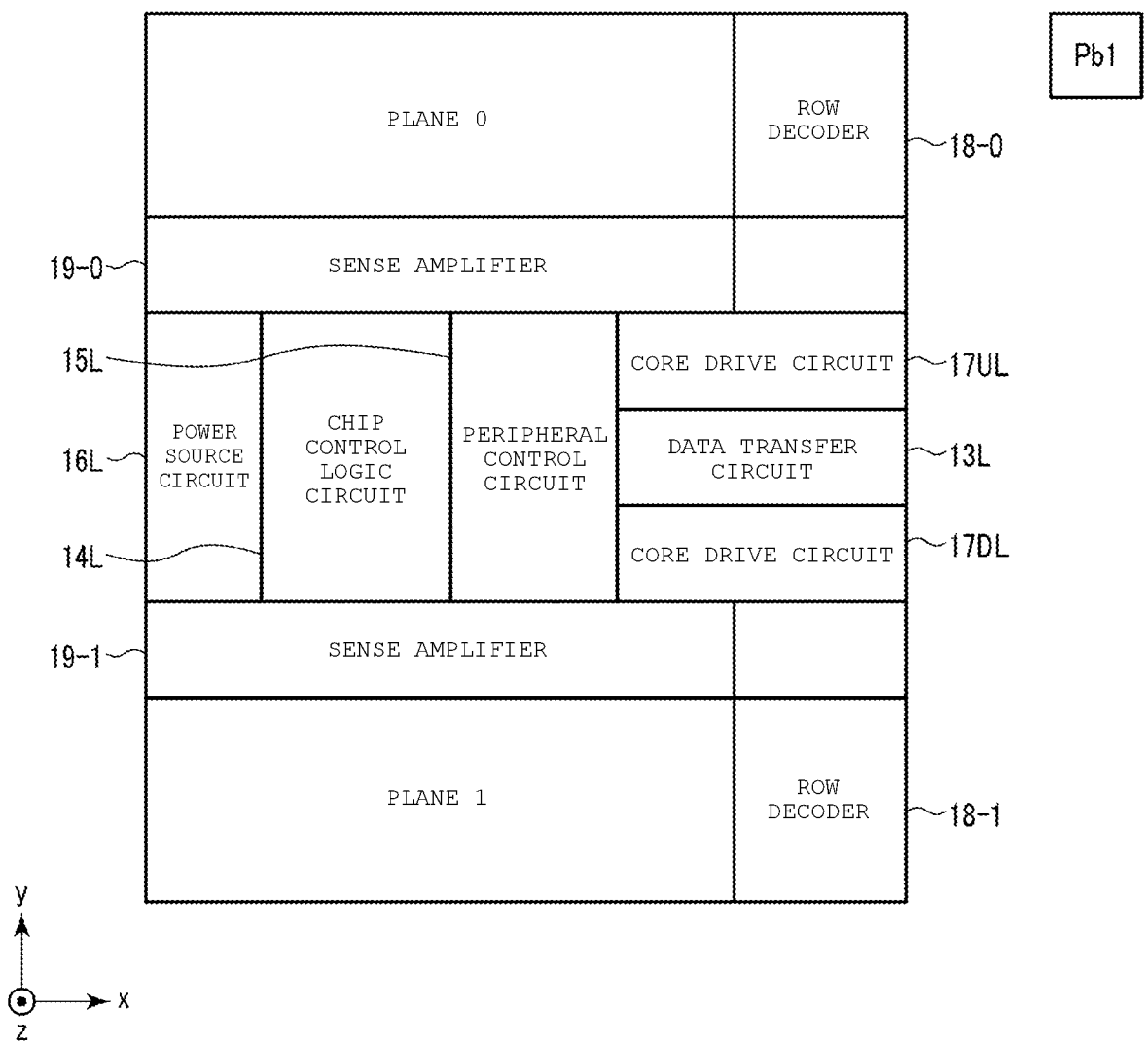
FIG. 5 is a top view illustrating a layout pattern of sub-chips of the semiconductor device according to the first embodiment.

First, a description will be made of a layout of the sub-chip SC0, which is one of the two sub-chips of the core chip. FIG. 5 is a top view illustrating a layout pattern of the sub-chip SC0 of the semiconductor device according to the first embodiment.

As illustrated in FIG. 5, a layout pattern of the sub-chip SC0 is a part of a layout pattern of the core chip CC, and is provided in a rectangular region having two sides along the x axis direction and two sides along the y axis direction on the xy plane.

The plane 0 and the plane 1 are respectively provided at two corners (for example, an upper left corner and a lower left corner in FIG. 5) of the rectangular region. The row decoder 18 and the sense amplifier 19 are divided into portions corresponding to the plane 0 and the plane 1. In the following description, portions of the row decoder 18 and portions of the sense amplifier 19 corresponding to the plane 0 and the plane 1 will be respectively referred to as row decoders 18-0 and 18-1, and sense amplifiers 19-0 and 19-1. One side of each of the row decoders 18-0 and 18-1 along the y axis direction is in contact with, for example, one side of each of the plane 0 and the plane 1 that extends along the y axis direction. The sense amplifiers 19-0 and 19-1 are in contact with, for example, the sides of the plane 0 and the plane 1 that extend along the x axis direction.

The data transfer circuit 13, the chip control logic circuit 14, the peripheral control circuit 15, the power source circuit 16, and the core drive circuit 17 are disposed in a region interposed between the sense amplifiers 19-0 and 19-1 in the y axis direction. In the following description, the data transfer circuit 13, the chip control logic circuit 14, the peripheral control circuit 15, the power source circuit 16, the core drive circuit 17 will be referred to as "peripheral circuits" of the memory cell array 12, the row decoder 18, and the sense amplifier 19.

The core drive circuit 17 is divided into a portion corresponding to the plane 0 and a portion corresponding to the plane 1. In the following description, the portion of the core drive circuit 17 corresponding to the plane 0 and the portion of the core drive circuit 17 corresponding to the plane 1 will be respectively referred to as core drive circuits 17UL and 17DL. The core drive circuits 17UL and 17DL are in contact with, for example, sides of the data transfer circuit 13 extending along the x axis direction.

The data transfer circuit 13 corresponding to the sub-chip SC0 will be referred to as a data transfer circuit 13L. The data transfer circuit 13L is provided in a region interposed between the core drive circuits 17UL and 17DL in the y axis direction.

The peripheral control circuit 15 corresponding to the sub-chip SC0 will be referred to as a peripheral control circuit 15L. The peripheral control circuit 15L is provided in a region adjacent to the data transfer circuit 13L and the core drive circuits 17UL and 17DL.

The chip control logic circuit 14 corresponding to the sub-chip SC0 will be referred to as a chip control logic circuit 14L. The chip control logic circuit 14L is provided in a region adjacent to the peripheral control circuit 15L.

The power source circuit 16 corresponding to the sub-chip SC0 will be referred to as a power source circuit 16L. The power source circuit 16L is provided in a region adjacent to the chip control logic circuit 14L.

The layout pattern of the sub-chip SC0 disposed as mentioned above is correlated with, for example, a symbol Pb1 illustrated in FIG. 5. The symbol is used in a case of indicating a direction of a layout pattern or the like. For example, when a layout pattern is horizontally rotated by 180 degrees for illustration purposes, the symbol is also horizontally rotated by 180 degrees in the illustration.

1-1-4-3-2. Section of Sub-Chip SC0

Figure 6:
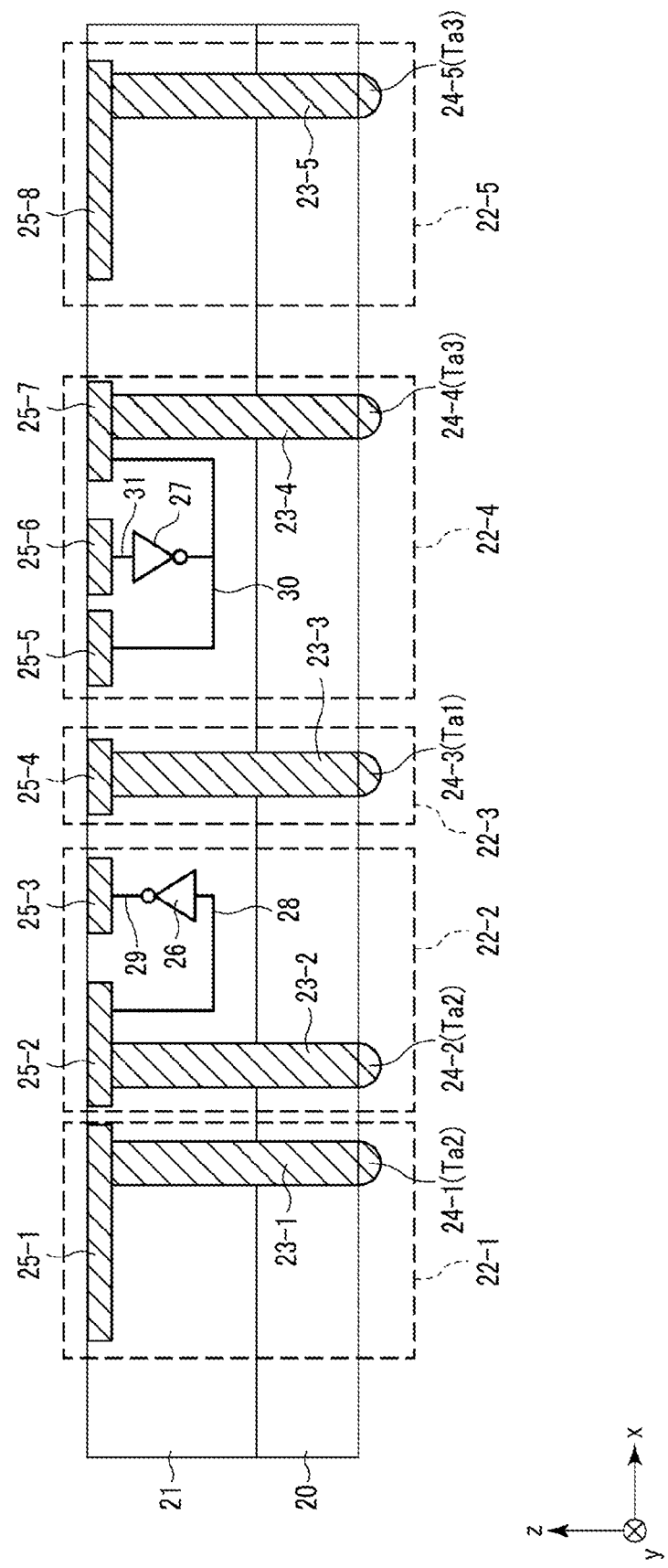
FIG. 6 is a sectional view illustrating an example of a wiring pattern of the sub-chips of the semiconductor device according to the first embodiment.

With reference to FIG. 6, a description will be made of an example of a wiring pattern of the sub-chip of the semiconductor device according to the first embodiment. FIG. 6 is a sectional view illustrating an example of a wiring pattern of the sub-chip of the semiconductor device according to the first embodiment. FIG. 6 illustrates a wiring pattern that makes up parts of the signal paths SL1 to SL3 as an example.

As illustrated in FIG. 6, an element layer 21 is provided on an upper surface of a semiconductor substrate 20. For simplification, FIG. 6 does not illustrate internal circuits other than the signal paths.

FIG. 6 illustrates a plurality of signal paths 22 (for example, 22-1, 22-2, 22-3, 22-4, and 22-5).

The semiconductor substrate 20 and the element layer 21 are provided with a plurality of vias 23 (for example, 23-1, 23-2, 23-3, 23-4, and 23-5) which are through silicon vias (TSVs). A plurality of bumps (also referred to as terminals or chip bottoms) 24 (for example, 24-1, 24-2, 24-3, 24-4, and 24-5) functioning as the terminals Ta1 to Ta3 are provided at portions to which the vias 23-1 to 23-5 are exposed on the lower surface of the semiconductor substrate 20. A plurality of pads (also referred to as terminals, the uppermost wirings, the uppermost wiring layers, or the uppermost metal wiring layers, and more specifically as the uppermost metal wirings, the uppermost metal layers, or the uppermost metals) 25 (for example, 25-1, 25-2, 25-3, 25-4, 25-5, 25-6, 25-7, and 25-8) are provided on an upper surface of the element layer 21. Upper surfaces of the pads 25 are exposed to the upper surface of the element layer 21. A logic element layer 26 including a logic element functioning as the inverter INVA), a logic element layer 27 including a logic element functioning as the inverter INVB, and wiring layers 28 to 31 are provided in the element layer 21.

A bump provided on a lower surface of the sub-chip and a pad which is provided on an upper surface of the sub-chip and is bonded (adhered) to another sub-chip are connected to each other through a via without using a wiring layer under the pad. The term "bonded (adhered)" indicates direct connection.

In general, wiring layers of the lower surface and the upper surface of the sub-chip are connected to each other by using a via, and thus a bump provided on the lower surface of the sub-chip is not directly connected to a wiring layer under a pad provided on the upper surface of the sub-chip.

The signal path 22-1 includes the bump 24-1 (Ta2), the via 23-1 connected to the bump 24-1, and the pad 25-1 connected to the via 23-1. In the pad 25-1, a region which is directly opposite the region connected to the via 23-1 and is exposed to the upper surface of the element layer 21 is a first region which is not directly connected to another chip. In the pad 25-1, for example, a region which extends in the x axis direction from the first region which is not directly connected to another chip and is exposed to the upper surface of the element layer 21 is a second region (also referred to as an another-chip connection region) which is directly connected to another chip.

Connection of a pad of a chip to a pad of another chip through a micro-bump (terminal) or the like will be referred to as "direct connection". Here, "another chip" indicates the sub-chip SC1.

The signal path 22-2 includes the bump 24-2 (Ta2), the via 23-2 connected to the bump 24-2, the pad 25-2 connected to the via 23-2, the logic element layer 26, the wiring layer 28 connecting the pad 25-2 to the input end of the logic element layer 26, the pad 25-3, and the wiring layer 29 connecting the pad 25-3 to the output end of the logic element layer 26. The pad 25-2 is not directly connected to another chip. In other words, the pad 25-2 does not have an another-chip connection region. The pad 25-3 has an another-chip connection region which is directly connected to another chip.

The signal path 22-3 includes the bump 24-3 (Ta1), the via 23-3 connected to the bump 24-3, and the pad 25-4 connected to the via 23-3. The pad 25-4 has an another-chip connection region which is directly connected to another chip.

The signal path 22-4 includes the bump 24-4 (Ta3), the via 23-4 connected to the bump 24-4, the pad 25-7 connected to the via 23-4, the pad 25-6, the logic element layer 27, the wiring layer 30 which connects the pad 25-7 to the output end of the logic element layer 27 and connects the pad 25-5 to the output end of the logic element layer 27, and the wiring layer 31 which connects the pad 25-6 to the input end of the logic element layer 27. The pads 25-5 and 25-6 have another-chip connection regions which are directly connected to another chip. The pad 25-7 is not directly connected to another chip. In other words, the pad 25-7 does not have an another-chip connection region. The pad 25-5 is a pad through which a signal flows to an internal circuit.

The signal path 22-5 includes the bump 24-5 (Ta3), the via 23-5 connected to the bump 24-5, and the pad 25-8 connected to the via 23-5. In the pad 25-8, a region which is directly opposite the region connected to the via 23-5 and is exposed to the upper surface of the element layer 21 is a first region which is not directly connected to another chip. In the pad 25-8, for example, a region which extends in the x axis direction from the first region which is not directly connected to another chip and is exposed to the upper surface of the element layer 21 is a second region (that is, an another-chip connection region) which is directly connected to another chip.

The wiring pattern of the sub-chip SC0 disposed as mentioned above is correlated with a symbol P1 illustrated in FIG. 6. The symbol is used to indicate a direction of a wiring pattern or the like. For example, when a wiring pattern is illustrated in a vertically reverse direction, the symbol is also illustrated in the vertically reverse direction.

Although not illustrated here, each pad 25 or the wiring layers 28 to 31 may be connected to the internal circuits.

1-1-4-3-3. Layout of Sub-Chip SC1

Figure 7:
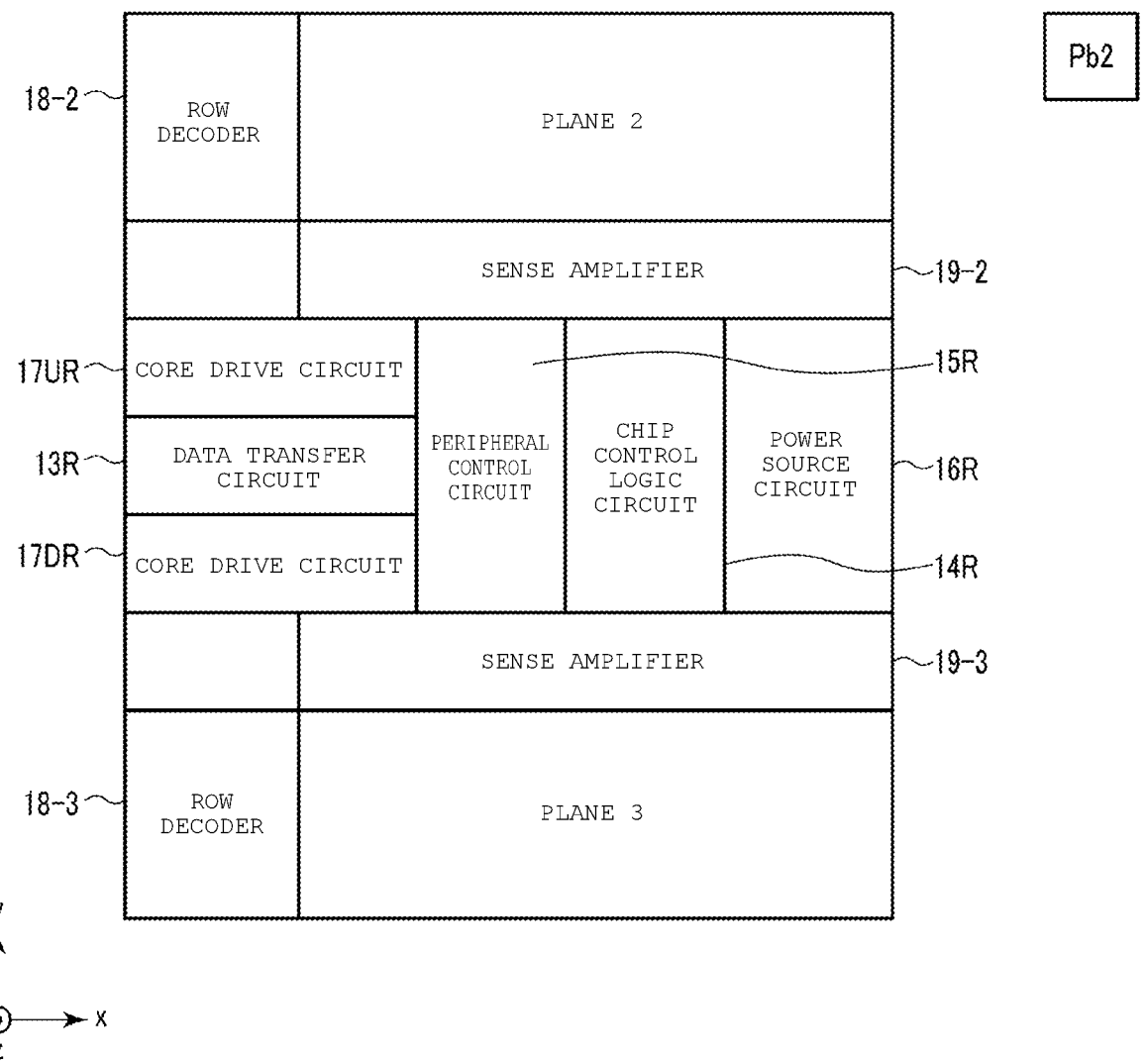
FIG. 7 is a top view illustrating a layout pattern of the sub-chips of the semiconductor device according to the first embodiment.

Next, with reference to FIG. 7, a description will be made of a layout of the sub-chip SC1, which is another one of the two sub-chips of the core chip. FIG. 7 is a sectional view illustrating an example of a layout pattern of the sub-chip SC1 of the semiconductor device according to the first embodiment.

As illustrated in FIG. 7, a layout pattern of the sub-chip SC1 is a part of a layout pattern of the core chip CC, and is provided in a rectangular region having two sides along the x axis direction and two sides along the y axis direction on the xy plane.

The plane 2 and the plane 3 are respectively provided at two corners (for example, an upper right corner and a lower right corner in FIG. 7) of the rectangular region. The row decoder 18 and the sense amplifier 19 are divided into portions corresponding to the plane 2 and the plane 3. In the following description, portions of the row decoder 18 and portions of the sense amplifier 19 corresponding to the plane 2 and the plane 3 will be respectively referred to as row decoders 18-2 and 18-3, and sense amplifiers 19-2 and 19-3. One side of each of the row decoders 18-2 and 18-3 along the y axis direction is in contact with, for example, one side of each of the plane 2 and the plane 3 that extends along the y axis direction. The sense amplifiers 19-2 and 19-3 are in contact with, for example, the sides of the plane 2 and the plane 3 that extend along the x axis direction.

The data transfer circuit 13, the chip control logic circuit 14, the peripheral control circuit 15, the power source circuit 16, and the core drive circuit 17 are disposed in a region interposed between the sense amplifiers 19-2 and 19-3 in the y axis direction. In the following description, the data transfer circuit 13, the chip control logic circuit 14, the peripheral control circuit 15, the power source circuit 16, the core drive circuit 17 will be referred to as "peripheral circuits" of the memory cell array 12, the row decoder 18, and the sense amplifier 19.

The core drive circuit 17 is divided into a portion corresponding to the plane 2 and a portion corresponding to the plane 3. In the following description, the portion of the core drive circuit 17 corresponding to the plane 2 and the portion of the core drive circuit 17 corresponding to the plane 3 will be respectively referred to as core drive circuits 17UR and 17DR. The core drive circuits 17UR and 17DR are in contact with, for example, sides of the data transfer circuit 13 extending along the x axis direction.

The data transfer circuit 13 corresponding to the sub-chip SC1 will be referred to as a data transfer circuit 13R. The data transfer circuit 13R is provided in a region interposed between the core drive circuits 17UR and 17DR in the y axis direction.

The peripheral control circuit 15 corresponding to the sub-chip SC1 will be referred to as a peripheral control circuit 15R. The peripheral control circuit 15R is provided in a region adjacent to the data transfer circuit 13R and the core drive circuits 17UR and 17DR.

The chip control logic circuit 14 corresponding to the sub-chip SC1 will be referred to as a chip control logic circuit 14R. The chip control logic circuit 14R is provided in a region adjacent to the peripheral control circuit 15R.

The power source circuit 16 corresponding to the sub-chip SC1 will be referred to as a power source circuit 16R. The power source circuit 16R is provided in a region adjacent to the chip control logic circuit 14R.

The layout pattern of the sub-chip SC1 disposed as mentioned above is correlated with, for example, a symbol Pb2 illustrated in FIG. 7.

The layout pattern of the sub-chip SC1 is a pattern obtained by horizontally rotating the layout pattern of the sub-chip SC0 by 180 degrees. In other words, the layout pattern of the sub-chip SC0 and the layout pattern of the sub-chip SC1 are designed in mirror-image symmetry with respect to a plane where upper surfaces thereof face each other. This is because the upper surface of the sub-chip SC0 is to be stacked on the upper surface of the sub-chip SC1 as will be described later.

1-1-4-3-4. Section of Sub-Chip SC1

Figure 8:
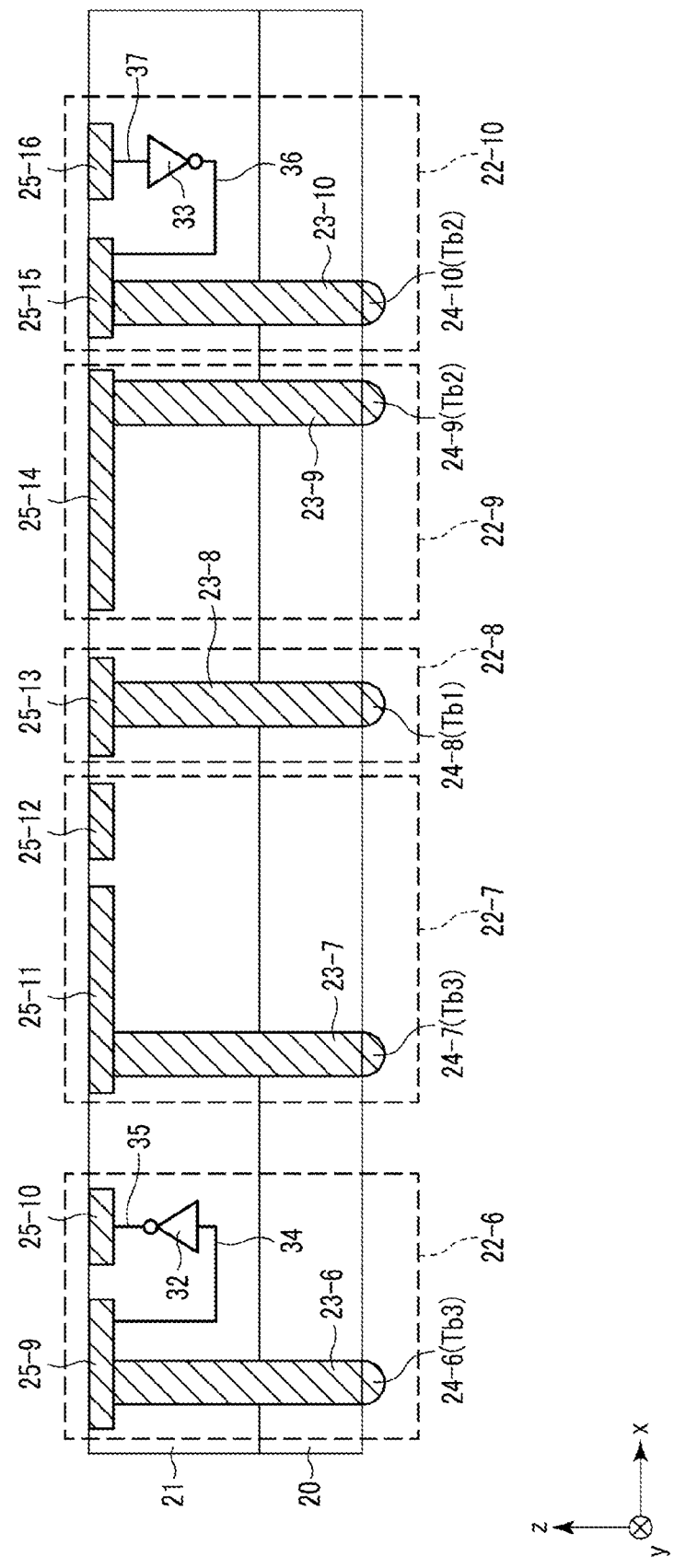
FIG. 8 is a sectional view illustrating an example of a wiring pattern of the sub-chips of the semiconductor device according to the first embodiment.

With reference to FIG. 8, a description will be made of an example of a wiring pattern of the sub-chip of the semiconductor device according to the first embodiment. FIG. 8 is a sectional view illustrating an example of a wiring pattern of the sub-chip of the semiconductor device according to the first embodiment. FIG. 8 illustrates a wiring pattern that makes up parts of the signal paths SL1 to SL3 as an example.

As illustrated in FIG. 8, the element layer 21 is provided on the upper surface of a semiconductor substrate 20. For simplification, FIG. 8 does not illustrate internal circuits other than the signal paths.

FIG. 8 illustrates a plurality of signal paths 22 (for example, 22-6, 22-7, 22-8, 22-9, and 22-10).

The semiconductor substrate 20 and the element layer 21 are provided with a plurality of vias 23 (for example, 23-6, 23-7, 23-8, 23-9, and 23-10) which are through silicon vias (TSVs). A plurality of bumps 24 (for example, 24-6, 24-7, 24-8, 24-9, and 24-10) functioning as the terminals Tb1 to Tb3 are provided at portions to which the vias 23-6 to 23-10 are exposed on the lower surface of the semiconductor substrate 20. A plurality of pads 25 (for example, 25-9, 25-10, 25-11, 25-12, 25-13, 25-14, 25-15, and 25-16) are provided on an upper surface of the element layer 21. Upper surfaces of the pads 25 are exposed to the upper surface of the element layer 21. A logic element layer 32 including a logic element functioning as the inverter INVB, a logic element layer 33 including a logic element functioning as the inverter INVA, and wiring layers 34 to 37 are provided in the element layer 21.

The signal path 22-6 includes the bump 24-6 (Tb3), the via 23-6 connected to the bump 24-6, the pad 25-9 connected to the via 23-6, the logic element layer 32, the wiring layer 34 connecting the pad 25-9 to the input end of the logic element layer 32, the pad 25-10, and the wiring layer 35 connecting the pad 25-10 to the output end of the logic element layer 32. The pad 25-9 is not directly connected to another chip. In other words, the pad 25-9 does not have an another-chip connection region. The pad 25-10 has an another-chip connection region which is directly connected to another chip. In the embodiment illustrated herein, "another chip" indicates the sub-chip SC0.

The signal path 22-7 includes the bump 24-7 (Tb3), the via 23-7 corresponding to the bump 24-7, and the pad 25-11 connected to the via 23-7, and the pad 25-12. In the pad 25-11, a region which is directly opposite the region connected to the via 23-7 and is exposed to the upper surface of the element layer 21 is a first region which is not directly connected to another chip. In the pad 25-11, for example, a region which extends in the x axis direction from the first region which is not directly connected to another chip and is exposed to the upper surface of the element layer 21 is a second region (also referred to as an another-chip connection region) which is directly connected to another chip. The pad 25-12 is directly connected to another chip. The pad 25-12 is a pad through which a signal flows to an internal circuit.

The signal path 22-8 includes the bump 24-8 (Tb1), the via 23-8 connected to the bump 24-8, and the pad 25-13 connected to the via 23-8. The pad 25-13 has an another-chip connection region which is directly connected to another chip.

The signal path 22-9 includes the bump 24-9 (Tb2), the via 23-9 connected to the bump 24-9, and the pad 25-14 connected to the via 23-9. In the pad 25-14, a region which is directly opposite the region connected to the via 23-9 and is exposed to the upper surface of the element layer 21 is a first region which is not directly connected to another chip. In the pad 25-14, for example, a region which extends in the x axis direction from the first region which is not directly connected to another chip and is exposed to the upper surface of the element layer 21 is a second region (that is, an another-chip connection region) which is directly connected to another chip.

The signal path 22-10 includes the bump 24-10 (Tb2), the via 23-10 connected to the bump 24-10, the pad 25-15 connected to the via 23-10, the logic element layer 33, the wiring layer 36 which connects the pad 25-15 to the output end of the logic element layer 33, the pad 25-16, and the wiring layer 37 which connects the pad 25-16 to the input end of the logic element layer 33. The pad 25-15 is not directly connected to another chip. In other words, the pad 25-15 does not have an another-chip connection region. The pad 25-16 has an another-chip connection region which is directly connected to another chip.

The vias of the sub-chip SC0 and the vias of the sub-chip SC1 are designed in mirror-image symmetry with respect to a plane where lower surfaces thereof face each other.

The wiring pattern of the sub-chip SC1 disposed as mentioned above is correlated with a symbol P2 illustrated in FIG. 8.

Although not illustrated here, each pad 25 or the wiring layers 34 to 37 may be connected to the internal circuits.

1-1-4-4. Stacking Structure

Figure 9:
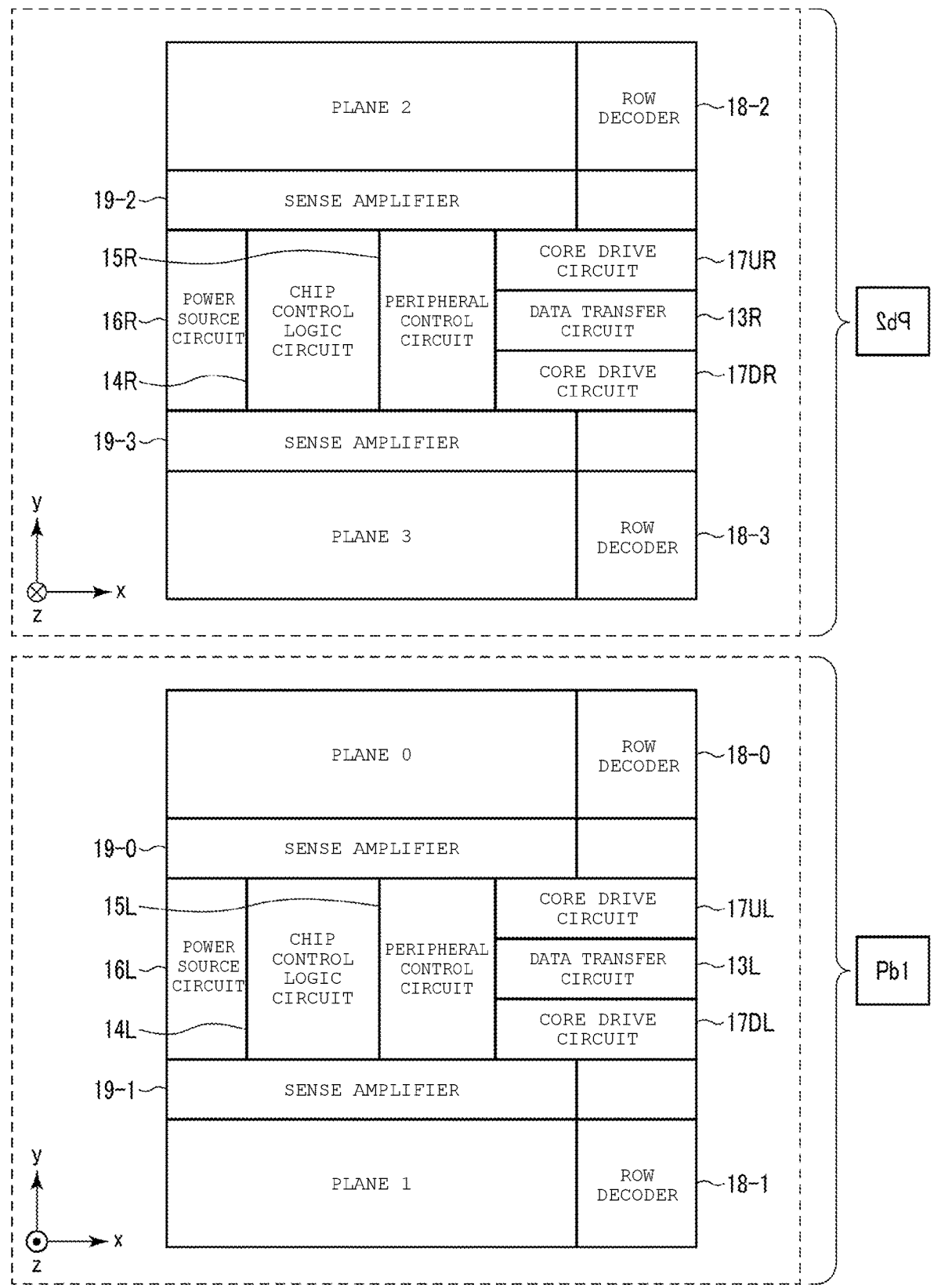
FIG. 9 is a top view illustrating a layout pattern of the sub-chips of the semiconductor device according to the first embodiment before they are stacked.
Figure 10:
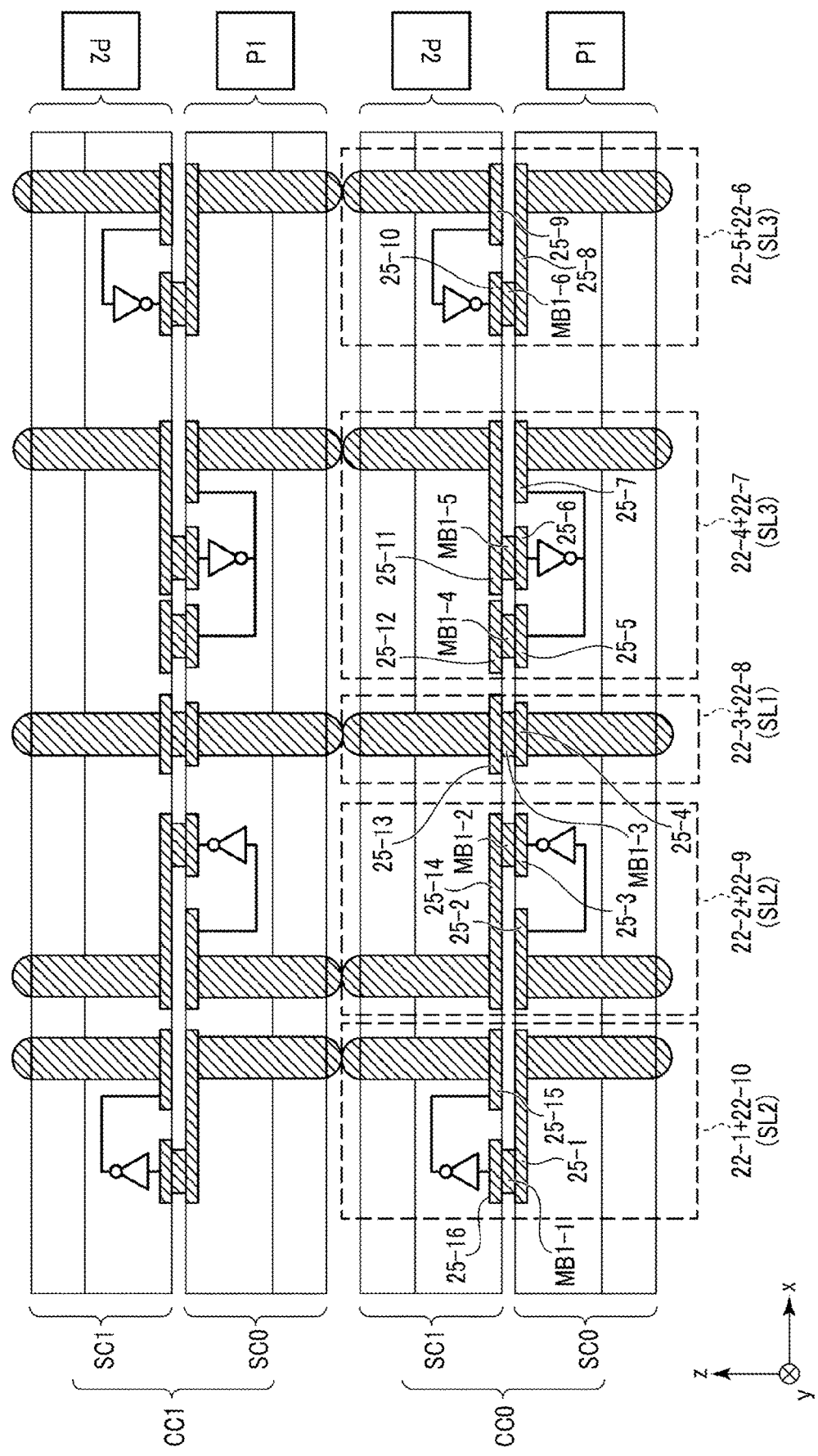
FIG. 10 is a sectional view illustrating a stacking structure of the core chip group of the semiconductor device according to the first embodiment.

Next, with reference to FIGS. 9 and 10, a description will be made of a stacking structure of the core chip group of the semiconductor device according to the first embodiment. FIG. 9 is a diagram illustrating an xy plane of the sub-chip SC0 and an xy plane of the sub-chip SC1 before the sub-chip SC0 and the sub-chip SC1 are stacked on each other. As will be described later, the sub-chip SC0 and the sub-chip SC1 are stacked by overlapping the upper surfaces thereof with each other. Thus, in FIG. 9, the layout pattern of the sub-chip SC1 illustrated in FIG. 7 is illustrated in a state of being horizontally rotated by 180 degrees. FIG. 10 is a sectional view illustrating a stacking structure of the core chip group of the semiconductor device according to the first embodiment. FIG. 10 illustrates a structure in which two pairs of the sub-chips SC0 and SC1 illustrated in FIGS. 6 and 8 are stacked in this order. The stacking indicates that the sub-chips are stacked to overlap each other in the z axis direction.

As illustrated in FIG. 9, the sub-chip SC0 and the sub-chip SC1 are stacked such that respective elements overlap each other. Specifically, in the z axis direction, the data transfer circuit 13R is located over the data transfer circuit 13L. In the z axis direction, the core drive circuit 17UR is located over the core drive circuit 17UL. In the z axis direction, the core drive circuit 17DR is located over the core drive circuit 17DL. In the z axis direction, the peripheral control circuit 15R is located over the peripheral control circuit 15L. In the z axis direction, the chip control logic circuit 14R is located over the chip control logic circuit 14L. In the z axis direction, the power source circuit 16R is located over the power source circuit 16L.

More specifically, as illustrated in FIG. 10, the upper surface of the sub-chip SC0 is stacked on the upper surface of the sub-chip SC1. A position of each of the pads 25 having another-chip connection regions of the sub-chip SC0 matches a position of each of the pads 25 having another-chip connection regions of the sub-chip SC1. Details thereof will be described below.

The lower surface of the sub-chip SC0 is stacked on the lower surface of the sub-chip SC1. Positions of the bumps 24 of the sub-chip SC0 and positions of the bumps 24 of the sub-chip SC1 are designed in mirror-image symmetry with respect to a plane where upper surfaces thereof face each other. Thus, positions of the bumps 24-1 to 24-5 of the sub-chip SC0 respectively match positions of the bumps 24-10 to 24-6 of the sub-chip SC1.

In the above-described configuration, the signal path 22-1 of the sub-chip SC0 and the signal path 22-10 of the sub-chip SC1 are electrically connected to each other through a micro-bump MB1-1 provided between the pad 25-1 and the pad 25-16, and thus form the signal path SL2 for performing communication with each internal circuit.

Here, positions of the vias 23-1 and 23-10 face each other. However, an insulator (not illustrated) is provided between the pad 25-1 directly connected to the via 23-1 and the pad 25-15 directly connected to the via 23-10, and thus the pads 25-1 and 25-15 are not directly connected to each other. As mentioned above, in the two sub-chips, there is a region in which pads directly connected to TSVs facing each other on the mutual upper surfaces are not directly connected to each other. The pad 25-15 of the one sub-chip SC1 is connected to another pad 25-16 provided on the upper surface of the sub-chip SC1 via the wiring layers 36 and 37 in the sub-chip SC1. The pad 25-16 of the one sub-chip SC1 is connected to the pad 25-1 of the other sub-chip SC0 through the micro-bump MB1-1. In other words, in the two sub-chips, two pads directly connected to TSVs facing each other on the mutual upper surfaces are electrically connected to each other indirectly. The logic element layer 33 may be provided between the pad 25-15 and another pad 25-16 of the one sub-chip SC1. In other words, in the two sub-chips, a logic element layer may be electrically inserted between two pads directly connected to TSVs facing each other on the mutual upper surfaces.

As mentioned above, in the signal path 22-1 of the sub-chip SC0 and the signal path 22-10 of the sub-chip SC1, a signal path is bypassed such that pads directly connected to TSVs are not directly connected to each other by extending a pad, and thus a logic element layer can be inserted.

In the signal path SL2 that includes the signal path 22-1 of the sub-chip SC0 and the signal path 22-10 of the sub-chip SC1, the logic element layer is provided in the sub-chip SC1.

The signal path 22-2 of the sub-chip SC0 and the signal path 22-9 of the sub-chip SC1 are electrically connected to each other through a micro-bump MB1-2 provided between the pad 25-3 and the pad 25-14, and thus form the signal path SL2 for performing communication with each internal circuit.

Here, positions of the vias 23-2 and 23-9 in the xy plane match each other. However, an insulator is provided between the pad 25-2 directly connected to the via 23-2 and the pad 25-14 directly connected to the via 23-9, and thus the pads 25-2 and 25-14 are not directly connected to each other. As mentioned above, in the two sub-chips, there is a region in which pads directly connected to TSVs facing each other on the mutual upper surfaces are not directly connected to each other. The pad 25-2 of the one sub-chip SC0 is connected to the pad 25-3 provided on the upper surface of the sub-chip SC0 through the wiring layers 28 and 29 in the sub-chip SC0. The pad 25-3 of the one sub-chip SC0 is connected to the pad 25-14 of the other sub-chip SC1 through the micro-bump MB1-2. In other words, in the two sub-chips, two pads directly connected to TSVs facing each other on the mutual upper surfaces are electrically connected to each other indirectly. The logic element layer 26 may be provided between the pad 25-2 and another pad 25-3 of the one sub-chip SC0. In other words, in the two sub-chips, a logic element layer may be electrically inserted between two pads directly connected to TSVs facing each other on the mutual upper surfaces.

As mentioned above, in the signal path 22-2 of the sub-chip SC0 and the signal path 22-9 of the sub-chip SC1, a signal path is bypassed such that pads directly connected to TSVs are not connected to each other by extending a pad, and thus a logic element layer can be inserted.

In the signal path SL2 that includes the signal path 22-2 of the sub-chip SC0 and the signal path 22-9 of the sub-chip SC1, the logic element layer is provided in the sub-chip SC0.

As mentioned above, in the signal path SL2 including two sub-chips, a logic element layer may be provided in at least one sub-chip.

The signal path 22-3 of the sub-chip SC0 and the signal path 22-8 of the sub-chip SC1 are electrically connected to each other through a micro-bump MB1-3 provided between the pad 25-4 and the pad 25-13, and thus form the signal path SL1 for performing communication with each internal circuit. In the signal path SL1, a pad and a bump are directly connected to each other through a via without using a wiring layer under the pad. The signal path SL1 is, for example, a signal path related to the power source voltage and the ground voltage GND.

The signal path 22-4 of the sub-chip SC0 and the signal path 22-7 of the sub-chip SC1 are electrically connected to each other through a micro-bump MB1-4 provided between the pad 25-5 and the pad 25-12, and a micro-bump MB1-5 provided between the pad 25-6 and the pad 25-11, and thus form the signal path SL3 for performing communication with each internal circuit.

Here, positions of the vias 23-4 and 23-7 in the xy plane match each other. However, an insulator is provided between the pad 25-7 directly connected to the via 23-4 and the pad 25-11 directly connected to the via 23-7, and thus the pads 25-7 and 25-11 are not directly connected to each other. As mentioned above, in the two sub-chips, there is a region in which pads directly connected to TSVs facing each other on the mutual upper surfaces are not directly connected to each other. The pad 25-7 of the one sub-chip SC0 is connected to another pad 25-5 or 25-6 provided on the upper surface of the sub-chip SC0 through the wiring layer 30 or 31 in the sub-chip SC0. The pad 25-5 of the one sub-chip SC0 is connected to the pad 25-12 of the other sub-chip SC1 through the micro-bump MB1-4. The pad 25-6 of the one sub-chip SC0 is connected to the pad 25-11 of the other sub-chip SC1 through the micro-bump MB1-5. In other words, in the two sub-chips, two pads directly connected to TSVs facing each other on the mutual upper surfaces are electrically connected to each other indirectly. The logic element layer 27 may be provided between the pad 25-7 and another pad 25-6 of the one sub-chip SC0. In other words, in the two sub-chips, a logic element layer may be electrically inserted between two pads directly connected to TSVs facing each other on the mutual upper surfaces.

As mentioned above, in the signal path 22-4 of the sub-chip SC0 and the signal path 22-7 of the sub-chip SC1, a signal path is bypassed such that pads directly connected to TSVs are not connected to each other by extending a pad, and thus a logic element layer can be inserted.

In the signal path SL3 that includes the signal path 22-4 of the sub-chip SC0 and the signal path 22-7 of the sub-chip SC1, the logic element layer is provided in the sub-chip SC0.

The signal path 22-5 of the sub-chip SC0 and the signal path 22-6 of the sub-chip SC1 are electrically connected to each other through a micro-bump MB1-6 provided between the pad 25-8 and the pad 25-10, and thus form the signal path SL3 for performing communication with each internal circuit.

Here, positions of the vias 23-5 and 23-6 in the xy plane match each other. However, an insulator is provided between the pad 25-8 directly connected to the via 23-5 and the pad 25-9 directly connected to the via 23-6, and thus the pads 25-8 and 25-9 are not directly connected to each other. As mentioned above, in the two sub-chips, there is a region in which pads directly connected to TSVs facing each other on the mutual upper surfaces are not directly connected to each other. The pad 25-9 of the one sub-chip SC1 is connected to another pad 25-10 provided on the upper surface of the sub-chip SC1 via the wiring layer 34 or 35 in the sub-chip SC1. The pad 25-10 of the one sub-chip SC1 is connected to the pad 25-8 of the other sub-chip SC0 through the microbump MB1-6. In other words, in the two sub-chips, two pads directly connected to TSVs facing each other on the mutual upper surfaces are electrically connected to each other indirectly. The logic element layer 32 may be provided between the pad 25-9 and another pad 25-10 of the one sub-chip SC1. In other words, in the two sub-chips, a logic element layer may be electrically inserted between two pads directly connected to TSVs facing each other on the mutual upper surfaces.

As mentioned above, in the signal path 22-5 of the sub-chip SC0 and the signal path 22-6 of the sub-chip SC1, a signal path is bypassed such that pads directly connected to TSVs are not connected to each other by extending a pad, and thus a logic element layer can be inserted.

In the signal path SL3 that includes the signal path 22-5 of the sub-chip SC0 and the signal path 22-6 of the sub-chip SC1, the logic element layer is provided in the sub-chip SC1.

As mentioned above, in the signal path SL3 including two sub-chips, a logic element layer may be provided in at least one sub-chip.

1-2. Effects

According to the embodiment, upper surfaces of two sub-chips in which one type of TSV is provided in the semiconductor substrate 20 and the element layer 21 are bonded to each other.

A bump provided on a lower surface of a sub-chip is connected to a pad which is provided on the sub-chip and is bonded to another sub-chip through a TSV without using a wiring layer under the pad.

In general, wiring layers of the lower surface and the upper surface of the sub-chip are connected to each other by using a TSV, and thus a bump provided on the lower surface of the sub-chip is not directly connected to a wiring layer under a pad provided on the upper surface of the sub-chip.

In the two sub-chips, there is a region in which pads directly connected to TSVs facing each other on the mutual upper surfaces are not directly connected to each other. A pad of one sub-chip is connected to another pad provided on an upper surface of the sub-chip via another wiring layer in the sub-chip. Another pad of the one sub-chip is connected to a pad of the other sub-chip. In other words, in the two sub-chips, two pads directly connected to TSVs facing each other on the mutual upper surfaces are electrically connected to each other indirectly.

A logic element layer may be provided between a pad and another pad of one sub-chip. In other words, in two sub-chips, a logic element layer may be electrically inserted between two pads directly connected to TSVs facing each other on the mutual upper surfaces.

As mentioned above, in the embodiment, a TSV can be connected in series between a chip bottom and the uppermost wiring layer, and a logic element group can be inserted between a rear surface and the uppermost wiring layer of a chip.

Figure 11:
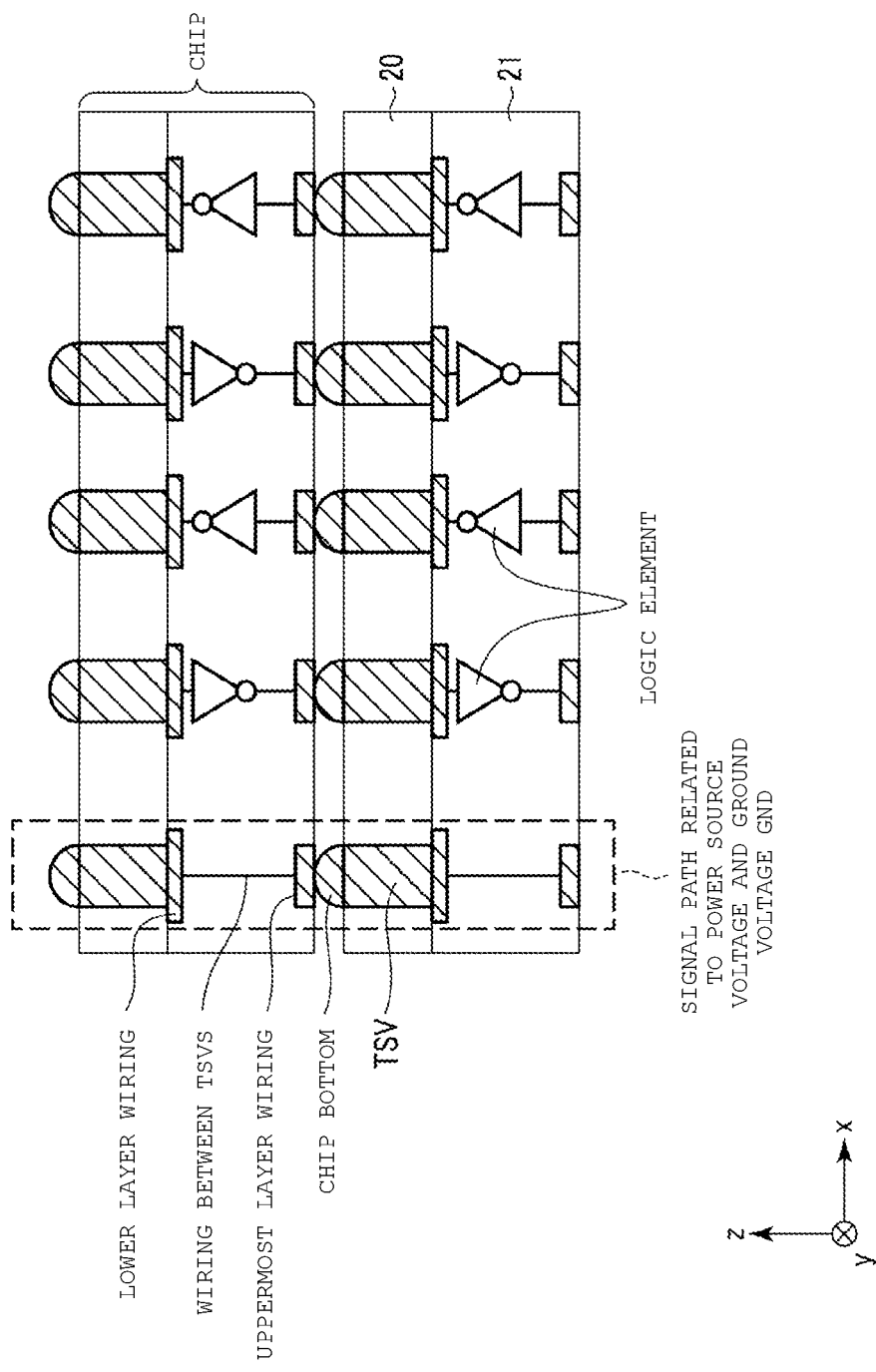
FIG. 11 is a sectional view illustrating a stacking structure of a core chip group of a semiconductor device according to a comparative example.
Figure 12:
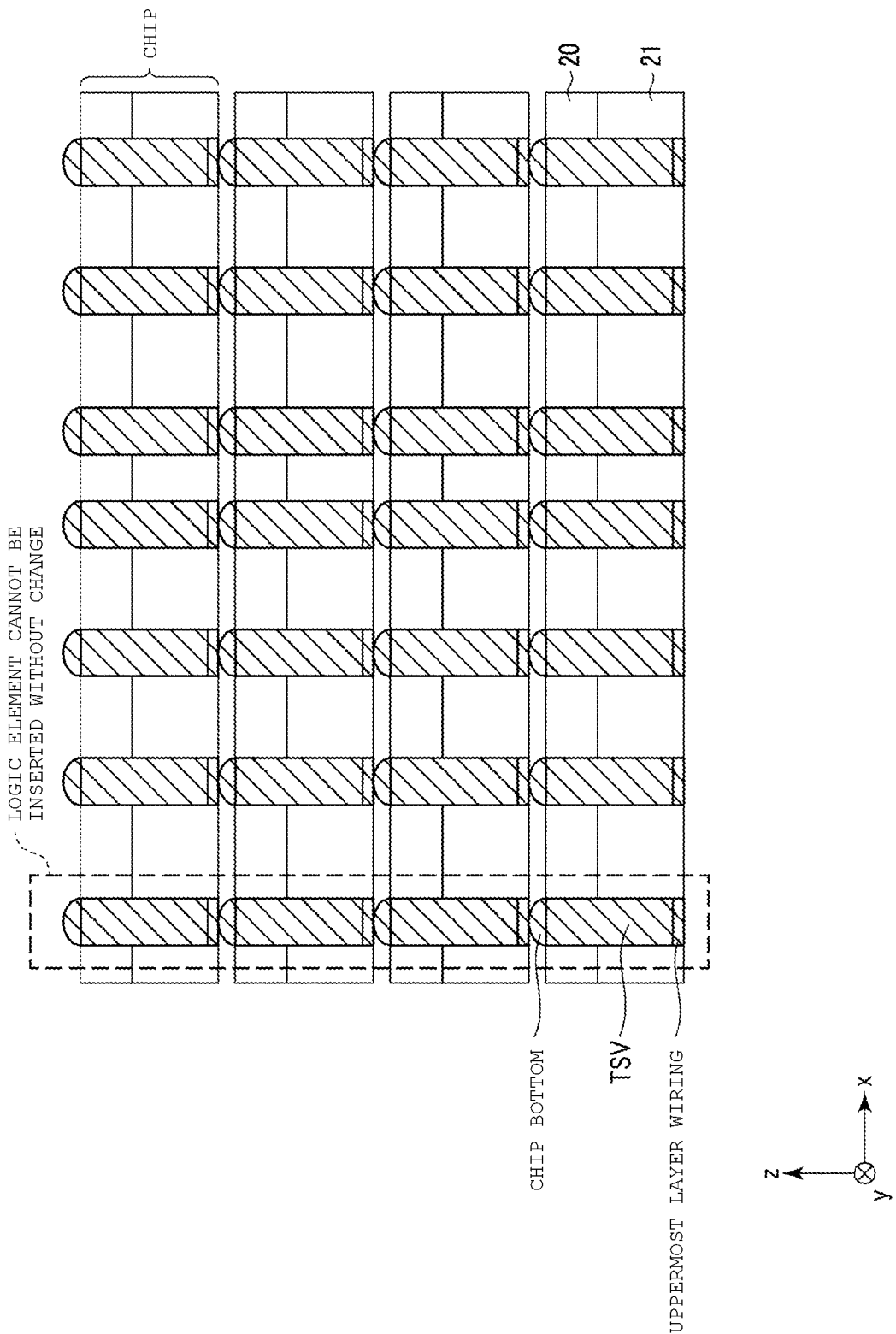
FIG. 12 is a sectional view illustrating a stacking structure of the core chip group of the semiconductor device according to the comparative example.
Figure 13:
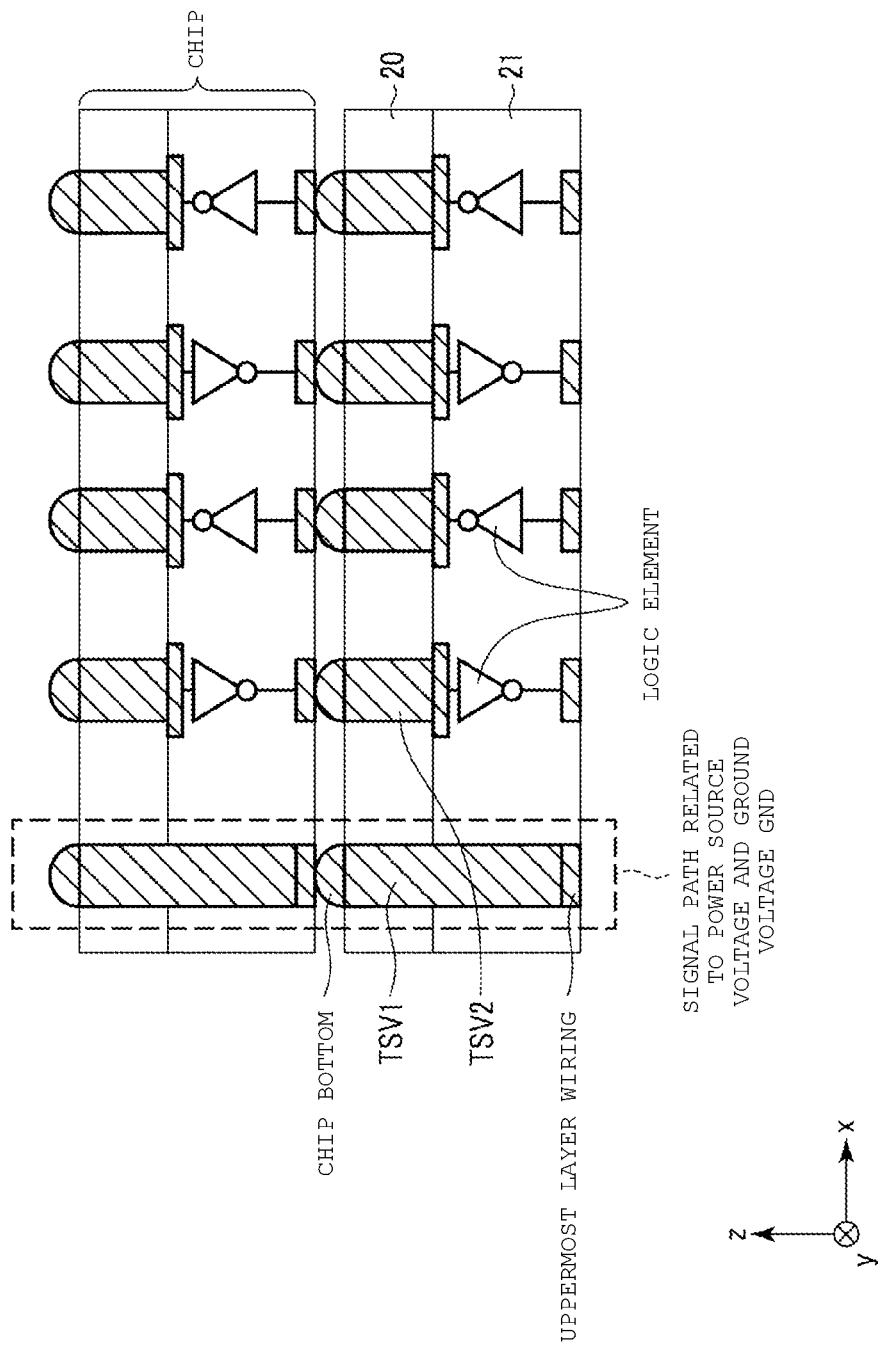
FIG. 13 is a sectional view illustrating a stacking structure of the core chip group of the semiconductor device according to the comparative example.

Hereinafter, in order to describe the effect of the present embodiment, a comparative example will be described with reference to FIGS. 11, 12, and 13. FIGS. 11 to 13 are sectional views illustrating a stacking structure of a core chip group of a semiconductor device according to a comparative example.

Meanwhile, it is possible to improve characteristics of a memory product by using a TSV. However, as illustrated in FIG. 11, when chips are stacked, resistance of a wiring layer between TSVs causes IR drops (due to wiring resistance) in the power source voltage and the ground voltage GND. Thus, it is desirable to reduce wiring resistance between TSVs.

Regarding a method of reducing wiring resistance between TSVs, a TSV is preferably connected in series between a chip bottom and the uppermost wiring layer. However, when a TSV is merely connected in series between a chip bottom and the uppermost wiring layer, as illustrated in FIG. 12, a logic element layer cannot be inserted between a lower surface and an upper surface of a chip.

As illustrated in FIG. 13, there may be a method in which two types of TSVs (for example, a TSV1 and a TSV2) having different depths are prepared in chips, and the TSV1 related to the power source voltage and the ground voltage GND is directly connected to the uppermost wiring layer, and the TSV2 is connected to a lower wiring layer in a signal path related to a logic element layer. However, in this case, the number of manufacturing processes is increased in order to form two types of TSVs having different depths, and thus the manufacturing difficulty is increased such that cost is increased.

However, according to the embodiment, a TSV related to the power source voltage and the ground voltage GND can be directly connected to the uppermost wiring layer, and a logic element layer can be inserted between upper and lower end terminals of the TSV in a chip.

As a result, it is possible to reduce manufacturing difficulty and manufacturing cost, and also to reduce resistance regarding the power source voltage and the ground voltage GND.

1-3. Modification Example 1

Next, a description will be made of Modification Example 1 of the first embodiment. Modification Example 1 of the first embodiment is different from the first embodiment in terms of a core chip stacking method.

1-3-1. Configuration

1-3-1-1. Configuration of Sub-Chip

Layouts of the sub-chips SC0 and SC1 are the same as those described in the first embodiment.

1-3-1-1-1. Section of Sub-Chip SC0

Figure 14:
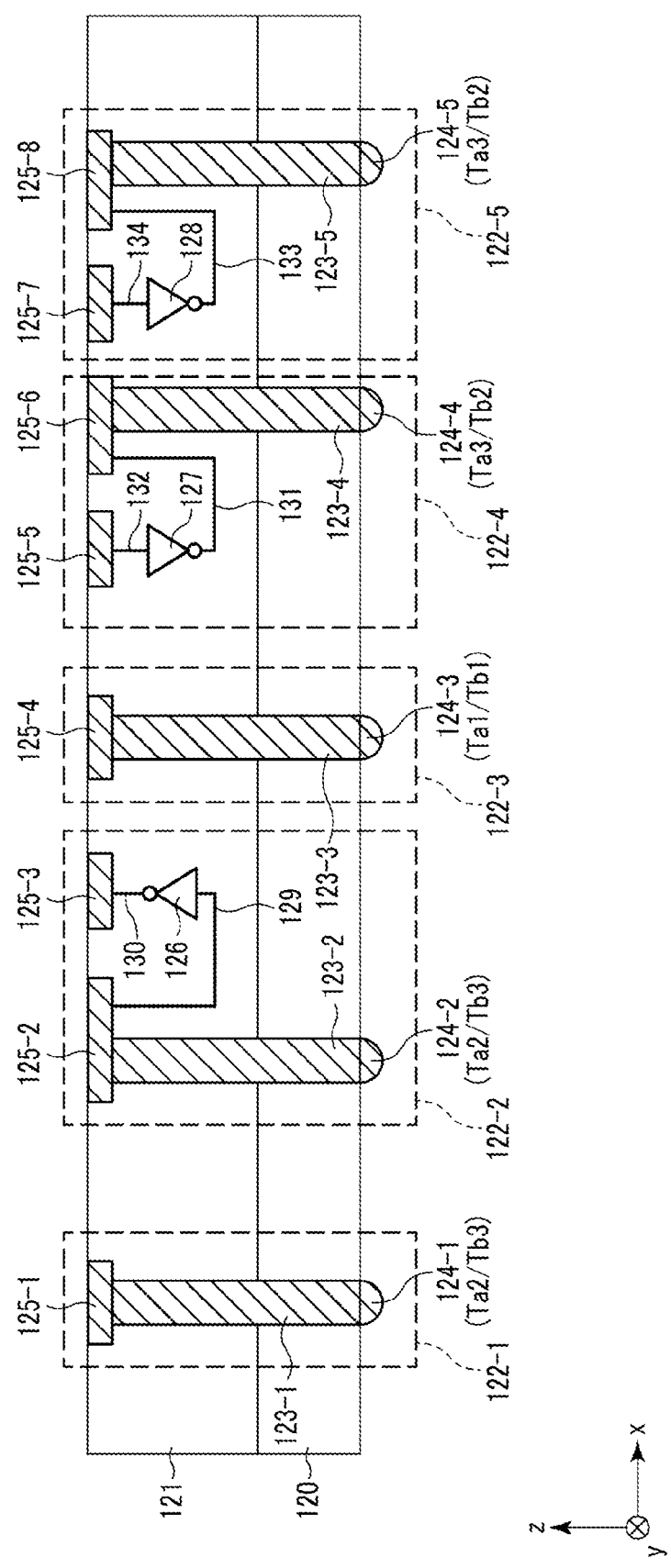
FIG. 14 is a sectional view illustrating an example of a wiring pattern of sub-chips of a semiconductor device according to Modification Example 1 of the first embodiment.

With reference to FIG. 14, a description will be made of an example of a wiring pattern of a sub-chip of a semiconductor device according to Modification Example 1 of the first embodiment. FIG. 14 is a sectional view illustrating an example of a wiring pattern of the sub-chip of the semiconductor device according to Modification Example 1 of the first embodiment. FIG. 14 illustrates a wiring pattern that makes up parts of the signal paths SL1 to SL3 as an example.

As illustrated in FIG. 14, an element layer 121 is provided on an upper surface of a semiconductor substrate 120. For simplification, FIG. 14 does not illustrate internal circuits other than the signal paths.

FIG. 14 illustrates a plurality of signal paths 122 (for example, 122-1, 122-2, 122-3, 122-4, and 122-5).

The semiconductor substrate 120 and the element layer 121 are provided with a plurality of vias 123 (for example, 123-1, 123-2, 123-3, 123-4, and 123-5) which are through silicon vias (TSVs). A plurality of bumps (also referred to as terminals or chip bottoms) 124 (for example, 124-1, 124-2,

124-3, 124-4, and 124-5) functioning as the terminals Ta1 to Ta3 are provided at portions to which the vias 123-1 to 123-5 are exposed on the lower surface of the semiconductor substrate 120. A plurality of pads 125 (for example, 125-1, 125-2, 125-3, 125-4, 125-5, 125-6, 125-7, and 125-8) are provided on an upper surface of the element layer 121. Upper surfaces of the pads 125 are exposed to the upper surface of the element layer 121. Logic element layers 126, 127, and 128 including logic elements functioning as the inverter INVA or the inverter INVB, and wiring layers 129 to 134 are provided in the element layer 121.

The signal path 122-1 includes the bump 124-1 (Ta2 or Tb3), the via 123-1 connected to the bump 124-1, and the pad 125-1 connected to the via 123-1. The pad 125-1 includes an another-chip connection region which is directly connected to another chip. Here, "another chip" indicates the sub-chip SC1.

The signal path 122-2 includes the bump 124-2 (Ta2 or Tb3), the via 123-2 connected to the bump 124-2, the pad 125-2 connected to the via 123-2, the logic element layer 126, the wiring layer 129 connecting the pad 125-2 to the input end of the logic element layer 126, the pad 125-3, and the wiring layer 130 connecting the pad 125-3 to the output end of the logic element layer 126. The pad 125-2 is not directly connected to another chip. In other words, the pad 125-2 does not have an another-chip connection region. The pad 125-3 has an another-chip connection region which is directly connected to another chip.

The signal path 122-3 includes the bump 124-3 (Ta1 or Tb1), the via 123-3 connected to the bump 124-3, and the pad 125-4 connected to the via 123-3. The pad 125-4 has an another-chip connection region which is directly connected to another chip.

The signal path 122-4 includes the bump 124-4 (Ta3 or Tb2), the via 123-4 connected to the bump 124-4, the pad 125-6 connected to the via 123-4, the pad 125-5, the logic element layer 127, the wiring layer 131 which connects the pad 125-6 to the output end of the logic element layer 127, and the wiring layer 132 which connects the pad 125-5 to the input end of the logic element layer 127. The pad 125-6 is not directly connected to another chip. In other words, the pad 125-6 does not have an another-chip connection region. The pad 125-5 has an another-chip connection region which is directly connected to another chip.

The signal path 122-5 includes the bump 124-5 (Ta3 or Tb2), the via 123-5 connected to the bump 124-5, the pad 125-8 connected to the via 123-5, the pad 125-7, the logic element layer 128, the wiring layer 133 which connects the pad 125-8 to the output end of the logic element layer 128, and the wiring layer 134 which connects the pad 125-7 to the input end of the logic element layer 128. The pad 125-8 is not directly connected to another chip. In other words, the pad 125-8 does not have an another-chip connection region. The pad 125-7 has an another-chip connection region which is directly connected to another chip.

Figure 16:
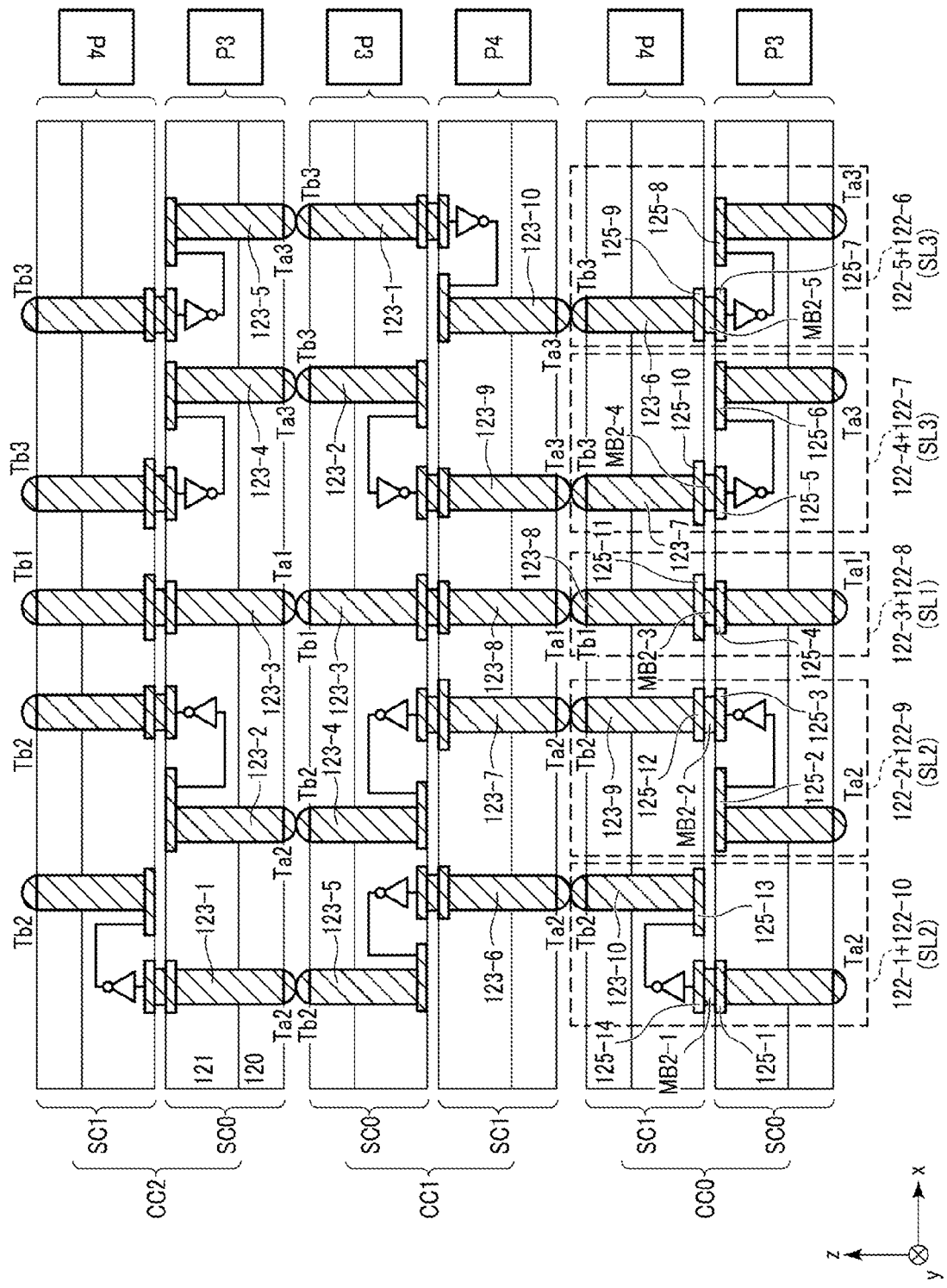
FIG. 16 is a sectional view illustrating a stacking structure of a core chip group of the semiconductor device according to Modification Example 1 of the first embodiment.

A lower surface of the sub-chip SC0 is to be stacked on a lower surface of another sub-chip SC0 (as shown in FIG. 16). Thus, vias of the sub-chip SC0 are designed in mirror-image symmetry with respect to the lower surface of another sub-chip SC0. In other words, in the sub-chip SC0, the vias are provided in mirror-image symmetry with respect to the center of the sub-chip SC0 in the x axis direction in the xz plane (i.e., with respect to the 123-3 in FIG. 14).

The wiring pattern of the sub-chip SC0 disposed as mentioned above is correlated with a symbol P3 illustrated in FIG. 14.

Although not illustrated here, each pad 125 or the wiring layers 129 to 134 may be connected to the internal circuits.

1-3-1-1-2. Section of Sub-Chip SC1

Figure 15:
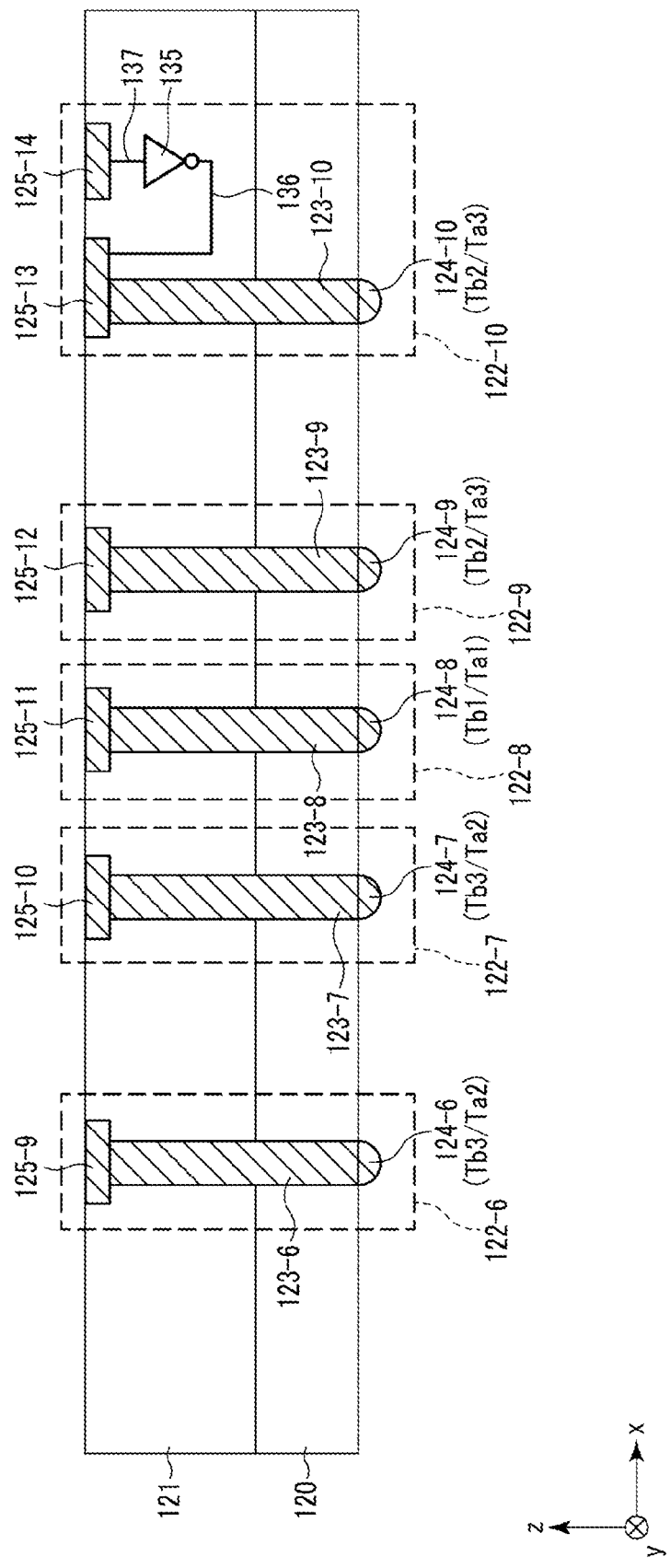
FIG. 15 is a sectional view illustrating an example of a wiring pattern of the sub-chips of the semiconductor device according to Modification Example 1 of the first embodiment.

With reference to FIG. 15, a description will be made of an example of a wiring pattern of the sub-chip of the semiconductor device according to Modification Example 1 of the first embodiment. FIG. 15 is a sectional view illustrating an example of a wiring pattern of the sub-chip of the semiconductor device according to Modification Example 1 of the first embodiment. FIG. 15 illustrates a wiring pattern that makes up parts of the signal paths SL1 to SL3 as an example.

As illustrated in FIG. 15, the element layer 121 is provided on the upper surface of a semiconductor substrate 120. For simplification, FIG. 15 does not illustrate internal circuits other than the signal paths.

FIG. 15 illustrates a plurality of signal paths 122 (for example, 122-6, 122-7, 122-8, 122-9, and 122-10).

The semiconductor substrate 120 and the element layer 121 are provided with a plurality of vias 123 (for example, 123-6, 123-7, 123-8, 123-9, and 123-10) which are through silicon vias (TSVs). A plurality of bumps 124 (for example, 124-6, 124-7, 124-8, 124-9, and 124-10) functioning as the terminals Tb1 to Tb3 are provided at portions to which the vias 123-6 to 123-10 are exposed on the lower surface of the semiconductor substrate 120. A plurality of pads 125 (for example, 125-9, 125-10, 125-11, 125-12, 125-13, and 125-14) are provided on an upper surface of the element layer 121. Upper surfaces of the pads 125 are exposed to the upper surface of the element layer 121. A logic element layer 135 including a logic element functioning as the inverter INVA or the inverter INVB, and wiring layers 136 and 137 are provided in the element layer 121.

The signal path 122-6 includes the bump 124-6 (Tb3 or Ta2), the via 123-6 connected to the bump 124-6, and the pad 125-9 connected to the via 123-6. The pad 125-9 has an another-chip connection region which is directly connected to another chip. Here, "another chip" indicates the sub-chip SC0.

The signal path 122-7 includes the bump 124-7 (Tb3 or Ta2), the via 123-7 connected to the bump 124-7, and the pad 125-10 connected to the via 123-7. The pad 125-10 has an another-chip connection region which is directly connected to another chip.

The signal path 122-8 includes the bump 124-8 (Tb1 or Ta1), the via 123-8 connected to the bump 124-8, and the pad 125-11 connected to the via 123-8. The pad 125-11 has an another-chip connection region which is directly connected to another chip.

The signal path 122-9 includes the bump 124-9 (Tb2 or Ta3), the via 123-9 connected to the bump 124-9, and the pad 125-12 connected to the via 123-9. The pad 125-12 has an another-chip connection region which is directly connected to another chip.

The signal path 122-10 includes the bump 124-10 (Tb2 or Ta3), the via 123-10 connected to the bump 124-10, the pad 125-13 connected to the via 123-10, the pad 125-14, the logic element layer 135, the wiring layer 136 connecting the pad 125-13 to the output end of the logic element layer 135, and the wiring layer 137 connecting the pad 125-14 to the input end of the logic element layer 135. The pad 125-13 is not directly connected to another chip. In other words, the pad 125-13 does not have an another-chip connection region. The pad 125-14 has an another-chip connection region which is directly connected to another chip.

A lower surface of the sub-chip SC1 is to be stacked on a lower surface of another sub-chip SC1 (as shown in FIG. 16). Thus, vias of the sub-chip SC1 are designed in mirror-image symmetry with respect to the lower surface of another sub-chip SC1. In other words, in the sub-chip SC1, the vias are provided in mirror-image symmetry with respect to the center of the sub-chip SC1 in the x axis direction in the xz plane (i.e., with respect to the via 123-8 in FIG. 15).

The wiring pattern of the sub-chip SC1 disposed as mentioned above is correlated with a symbol P4 illustrated in FIG. 15.

Although not illustrated here, each pad 125 or the wiring layers 136 and 137 may be connected to the internal circuits.

1-3-1-2. Stacking Structure

Next, with reference to FIG. 16, a description will be made of a stacking structure of a core chip group of the semiconductor device according to Modification Example 1 of the first embodiment. FIG. 16 is a sectional view illustrating a stacking structure of the core chip group of the semiconductor device according to Modification Example 1 of the first embodiment. FIG. 16 illustrates a structure in which three pairs of the sub-chips SC0 and SC1 illustrated in FIGS. 14 and 15 are stacked.

As illustrated in FIG. 16, the upper surface of the sub-chip SC0 is stacked on the upper surface of the sub-chip SC1. A position of each of the pads 125 having another-chip connection regions of the sub-chip SC0 matches a position of each of the pads 125 having another-chip connection regions of the sub-chip SC1. Specifically, positions of the pads 125-1, 125-3, 125-4, 125-5, and 125-7 of the sub-chip SC0 respectively match positions of the pads 125-14, 125-12, 125-11, 125-10, and 125-9 of the sub-chip SC1.

The lower surface of the sub-chip SC0 is stacked on the lower surface of another sub-chip SC0. Positions of the vias 123 of the sub-chip SC0 and positions of the vias 123 of another sub-chip SC0 are designed in mirror-image symmetry with respect to a plane where upper surfaces thereof face each other. Thus, positions of the vias 123-1 to 123-5 of the sub-chip SC0 respectively match positions of the vias 123-5 to 123-1 of another sub-chip SC0.

The lower surface of the sub-chip SC1 is stacked on the lower surface of another sub-chip SC1. Positions of the vias 123 of the sub-chip SC1 and positions of the vias 123 of another sub-chip SC1 are designed in mirror-image symmetry with respect to a plane where upper surfaces thereof face each other. Thus, positions of the vias 123-6 to 123-10 of the sub-chip SC1 respectively match positions of the vias 123-10 to 123-6 of another sub-chip SC1.

In the above-described configuration, the signal path 122-1 of the sub-chip SC0 and the signal path 122-10 of the sub-chip SC1 are electrically connected to each other through a micro-bump MB2-1 provided between the pad 125-1 and the pad 125-14, and thus form the signal path SL2 for performing communication with each internal circuit. Here, positions of the vias 123-1 and 123-10 in the xy plane do not match each other. Thus, the pad 125-1 directly connected to the via 123-1 and the pad 125-13 directly connected to the via 123-10 are not directly connected to each other.

As mentioned above, in the signal path 122-1 of the sub-chip SC0 and the signal path 122-10 of the sub-chip SC1, a signal path is bypassed such that pads directly connected to TSVs are not directly connected to each other by deviating positions of the TSVs between sub-chips, and thus a logic element layer can be inserted.

In the signal path SL2 that includes the signal path 122-1 of the sub-chip SC0 and the signal path 122-10 of the sub-chip SC1, the logic element layer is provided in the sub-chip SC1.

The signal path 122-2 of the sub-chip SC0 and the signal path 122-9 of the sub-chip SC1 are electrically connected to each other through a micro-bump MB2-2 provided between the pad 125-3 and the pad 125-12, and thus form the signal path SL2 for performing communication with each internal circuit. Here, positions of the vias 123-2 and 123-9 in the xy plane do not match each other. Thus, the pad 125-2 directly connected to the via 123-2 and the pad 125-12 directly connected to the via 123-9 are not directly connected to each other.

As mentioned above, in the signal path 122-2 of the sub-chip SC0 and the signal path 122-9 of the sub-chip SC1, a signal path is bypassed such that pads directly connected to TSVs are not directly connected to each other by deviating positions of the TSVs between sub-chips, and thus a logic element layer can be inserted.

In the signal path SL2 that includes the signal path 122-2 of the sub-chip SC0 and the signal path 122-9 of the sub-chip SC1, the logic element layer is provided in the sub-chip SC0.

As mentioned above, in the signal path SL2 including two sub-chips, a logic element layer may be provided in at least one sub-chip.

The signal path 122-3 of the sub-chip SC0 and the signal path 122-8 of the sub-chip SC1 are electrically connected to each other through a micro-bump MB2-3 provided between the pad 125-4 and the pad 125-11, and thus form the signal path SL1 for performing communication with each internal circuit. In the signal path SL1, a pad and a bump are directly connected to each other through a via without using a wiring layer under the pad. The signal path SL1 is, for example, a signal path related to the power source voltage and the ground voltage GND.

The signal path 122-4 of the sub-chip SC0 and the signal path 122-7 of the sub-chip SC1 are electrically connected to each other through a micro-bump MB2-4 provided between the pad 125-5 and the pad 125-10, and thus form the signal path SL3 for performing communication with each internal circuit. Here, positions of the vias 123-4 and 123-7 in the xy plane do not match each other. Thus, the pad 125-5 directly connected to the via 123-4 and the pad 125-10 directly connected to the via 123-7 are not directly connected to each other.

As mentioned above, in the signal path 122-4 of the sub-chip SC0 and the signal path 122-7 of the sub-chip SC1, a signal path is bypassed such that pads directly connected to TSVs are not directly connected to each other by deviating positions of the TSVs between sub-chips, and thus a logic element layer can be inserted.

In the signal path SL3 that includes the signal path 122-4 of the sub-chip SC0 and the signal path 122-7 of the sub-chip SC1, the logic element layer is provided in the sub-chip SC0.

The signal path 122-5 of the sub-chip SC0 and the signal path 122-6 of the sub-chip SC1 are electrically connected to each other through a micro-bump MB2-5 provided between the pad 125-7 and the pad 125-9, and thus form the signal path SL3 for performing communication with each internal circuit. Here, positions of the vias 123-5 and 123-6 in the xy plane do not match each other. Thus, the pad 125-8 directly connected to the via 123-5 and the pad 125-9 directly connected to the via 123-6 are not directly connected to each other.

As mentioned above, in the signal path 122-5 of the sub-chip SC0 and the signal path 122-6 of the sub-chip SC1, a signal path is bypassed such that pads directly connected to TSVs are not directly connected to each other by deviating positions of the TSVs between sub-chips, and thus a logic element layer can be inserted.

In the signal path SL3 that includes the signal path 122-5 of the sub-chip SC0 and the signal path 122-6 of the sub-chip SC1, the logic element layer is provided in the sub-chip SC0.

Although not illustrated here, in the signal path SL3 including two sub-chips, a logic element layer may be provided in at least one sub-chip.

1-3-2. Effects

According to the embodiment, upper surfaces of two sub-chips in which one type of TSV is provided in the semiconductor substrate 20 and the element layer 21 are bonded to each other.

In Modification Example 1 of the first embodiment, lower surfaces of sub-chips of the same type are bonded to each other.

In the first embodiment, lower surfaces of different sub-chips are bonded to each other. Thus, in the first embodiment, positions of vias of the different sub-chips are required to be mirror-image symmetric. As described above, when a logic element layer is provided, a via of one chip is not directly connected to a via of the other chip in a signal path including the logic element layer. Thus, in the signal path including the logic element layer, a lower wiring layer under a pad in a sub-chip is required to be routed so as not to be directly connected to other vias.

However, in Modification Example 1 of the first embodiment, the lower surfaces of the sub-chips of the same type are bonded to each other, and routing of a wiring layer under a pad in a sub-chip is reduced more than in the first embodiment. As a result, resistance in the wiring layer can be reduced, and, thus, in Modification Example 1 of the first embodiment, it is possible to provide a semiconductor device in which resistance is lower than in the first embodiment.

In the same manner as in the first embodiment, it is possible to reduce manufacturing difficulty and manufacturing cost, and also to reduce resistance regarding the power source voltage and the ground voltage GND.

1-4. Modification Example 2

Next, a description will be made of Modification Example 2 of the first embodiment. Modification Example 2 of the first embodiment is different from Modification Example 1 of the first embodiment in terms of a sub-chip wiring pattern. In the first embodiment, the pads 25-5 and 25-12 through which signals flow to internal circuits are provided in signal paths including the signal path 22-4 and the signal path 22-7. Therefore, in Modification Example 2 of the first embodiment, a description will be made of a case where a sub-chip includes a pad through which a signal flows to an internal circuit, and core chips are stacked in the same manner as in Modification Example 1 of the first embodiment.

1-4-1. Configuration

1-4-1-1. Configuration of Sub-Chip

Layouts of the sub-chips SC0 and SC1 are the same as those described in the first embodiment.

1-4-1-1. Section of Sub-Chip SC0

Figure 17:
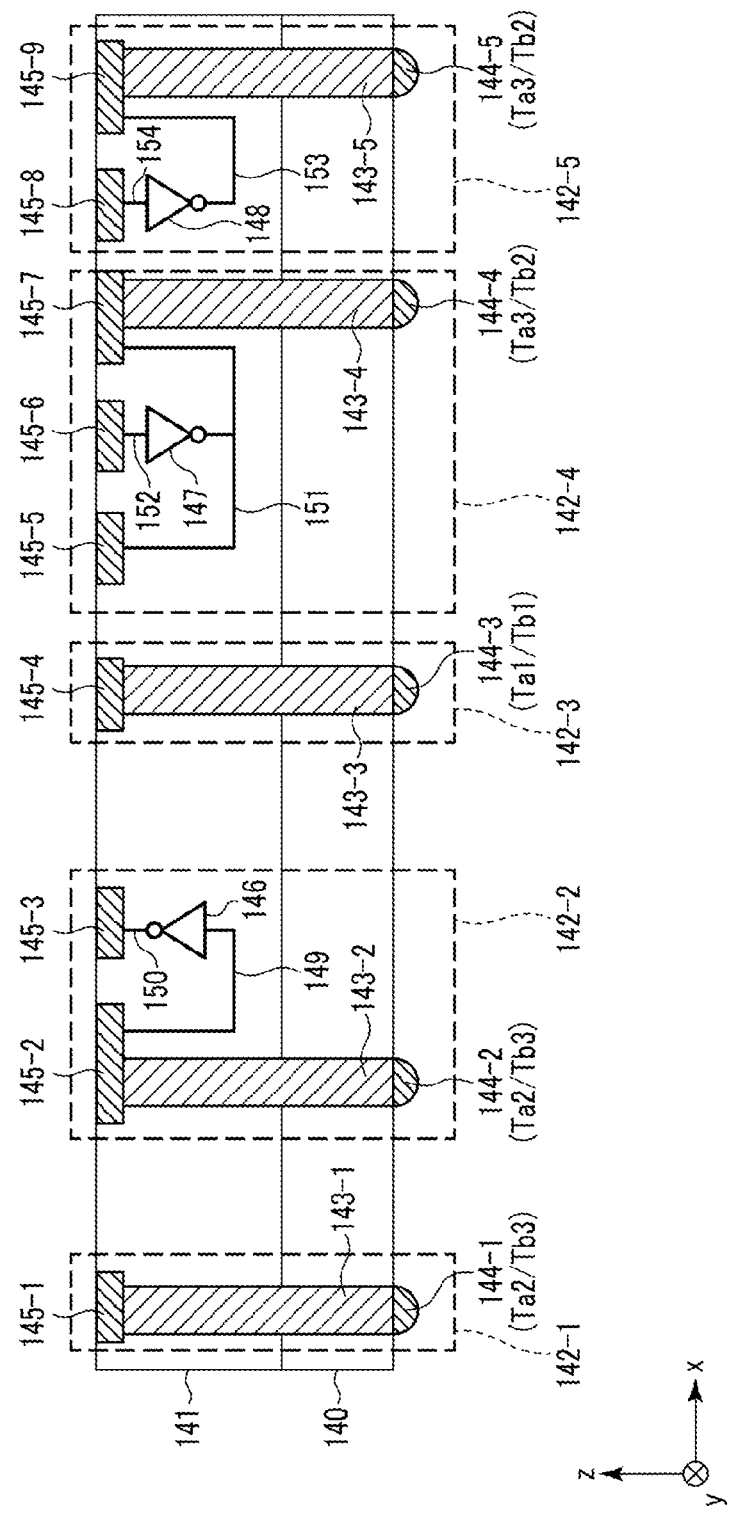
FIG. 17 is a sectional view illustrating an example of a wiring pattern of sub-chips of a semiconductor device according to Modification Example 2 of the first embodiment.

With reference to FIG. 17, a description will be made of an example of a wiring pattern of a sub-chip of a semiconductor device according to Modification Example 2 of the first embodiment. FIG. 17 is a sectional view illustrating an example of a wiring pattern of the sub-chip of the semiconductor device according to Modification Example 2 of the first embodiment. FIG. 17 illustrates a wiring pattern that makes up parts of the signal paths SL1 to SL3 as an example.

As illustrated in FIG. 17, an element layer 141 is provided on an upper surface of a semiconductor substrate 140. For simplification, FIG. 17 does not illustrate internal circuits other than the signal paths.

FIG. 17 illustrates a plurality of signal paths 142 (for example, 142-1, 142-2, 142-3, 142-4, and 142-5).

The semiconductor substrate 140 and the element layer 141 are provided with a plurality of vias 143 (for example, 143-1, 143-2, 143-3, 143-4, and 143-5) which are through silicon vias (TSVs). A plurality of bumps (also referred to as terminals or chip bottoms) 144 (for example, 144-1, 144-2, 144-3, 144-4, and 144-5) functioning as the terminals Ta1 to Ta3 are provided at portions to which the vias 143-1 to 143-5 are exposed on the lower surface of the semiconductor substrate 140. A plurality of pads 145 (for example, 145-1, 145-2, 145-3, 145-4, 145-5, 145-6, 145-7, 145-8, and 145-9) are provided on an upper surface of the element layer 141. Upper surfaces of the pads 145 are exposed to the upper surface of the element layer 141. Logic element layers 146, 147, and 148 including logic elements functioning as the inverter INVA or the inverter INVB, and wiring layers 149 to 154 are provided in the element layer 141.

The signal path 142-1 includes the bump 144-1 (Ta2 or Tb3), the via 143-1 connected to the bump 144-1, and the pad 145-1 connected to the via 143-1. The pad 145-1 includes an another-chip connection region which is directly connected to another chip. Here, "another chip" indicates the sub-chip SC1.

The signal path 142-2 includes the bump 144-2 (Ta2 or Tb3), the via 143-2 connected to the bump 144-2, the pad 145-2 connected to the via 143-2, the logic element layer 146, the wiring layer 149 connecting the pad 145-2 to the input end of the logic element layer 146, the pad 145-3, and the wiring layer 150 connecting the pad 145-3 to the output end of the logic element layer 146. The pad 145-2 is not directly connected to another chip. In other words, the pad 145-2 does not have an another-chip connection region. The pad 145-3 has an another-chip connection region which is directly connected to another chip.

The signal path 142-3 includes the bump 144-3 (Ta1 or Tb1), the via 143-3 connected to the bump 144-3, and the pad 145-4 connected to the via 143-3. The pad 145-4 has an another-chip connection region which is directly connected to another chip.

The signal path 142-4 includes the bump 144-4 (Ta3 or Tb2), the via 143-4 connected to the bump 144-4, the pad 145-7 connected to the via 143-4, the pad 145-5, the pad 145-6, the logic element layer 147, the wiring layer 151 which connects the pads 145-7 and 145-5 to the output end of the logic element layer 147, and the wiring layer 152 which connects the pad 145-6 to the input end of the logic element layer 147. The pad 145-7 is not directly connected to another chip. In other words, the pad 145-7 does not have an another-chip connection region. The pads 145-5 and 145-6 have another-chip connection regions which are directly connected to another chip. The pad 145-5 is a pad through which a signal flows to an internal circuit.

The signal path 142-5 includes the bump 144-5 (Ta3 or Tb2), the via 143-5 connected to the bump 144-5, the pad 145-9 connected to the via 143-5, the pad 145-8, the logic element layer 148, the wiring layer 153 which connects the pad 145-9 to the output end of the logic element layer 148, and the wiring layer 154 which connects the pad 145-8 to the input end of the logic element layer 148. The pad 145-9 is not directly connected to another chip. In other words, the pad 145-9 does not have an another-chip connection region. The pad 145-8 has an another-chip connection region which is directly connected to another chip.

A lower surface of the sub-chip SC0 is to be stacked on a lower surface of another sub-chip SC0. Thus, vias of the sub-chip SC0 are designed in mirror-image symmetry with respect to the lower surface of another sub-chip SC0. In other words, in the sub-chip SC0, the vias are provided in mirror-image symmetry with respect to the center of the sub-chip SC0 in the x axis direction in the xz plane (i.e., with respect to the via 143-3 in FIG. 17).

The wiring pattern of the sub-chip SC0 disposed as mentioned above is correlated with a symbol P5 illustrated in FIG. 17.

Although not illustrated here, each pad 145 or the wiring layers 149 to 154 may be connected to the internal circuits.

1-4-1-1-2. Section of Sub-Chip SC1

Figure 18:
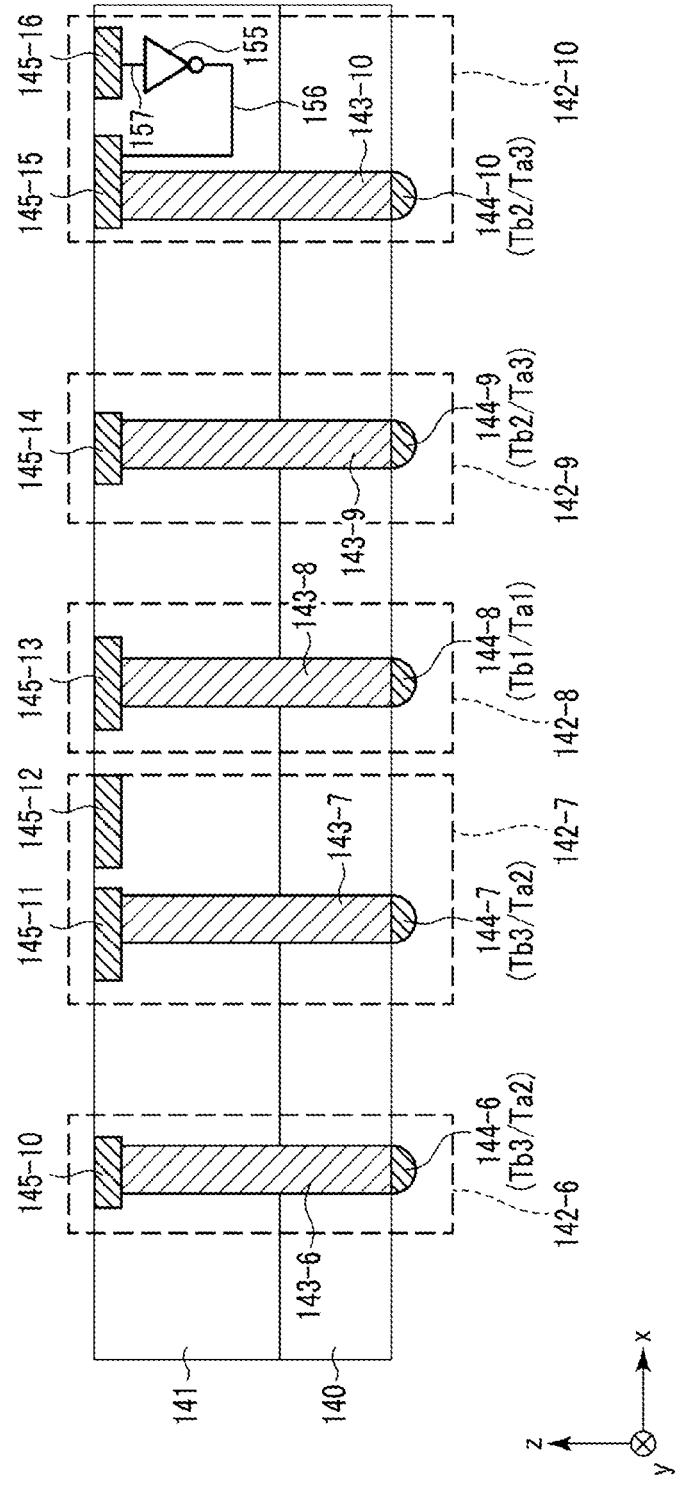
FIG. 18 is a sectional view illustrating an example of a wiring pattern of the sub-chips of the semiconductor device according to Modification Example 2 of the first embodiment.

With reference to FIG. 18, a description will be made of an example of a wiring pattern of the sub-chip of the semiconductor device according to Modification Example 2 of the first embodiment. FIG. 18 is a sectional view illustrating an example of a wiring pattern of the sub-chip of the semiconductor device according to Modification Example 2 of the first embodiment. FIG. 18 illustrates a wiring pattern that makes up parts of the signal paths SL1 to SL3 as an example.

As illustrated in FIG. 18, the element layer 141 is provided on the upper surface of a semiconductor substrate 140. For simplification, FIG. 18 does not illustrate internal circuits other than the signal paths.

FIG. 18 illustrates a plurality of signal paths 142 (for example, 142-6, 142-7, 142-8, 142-9, and 142-10).

The semiconductor substrate 140 and the element layer 141 are provided with a plurality of vias 143 (for example, 143-6, 143-7, 143-8, 143-9, and 143-10) which are through silicon vias (TSVs). A plurality of bumps 144 (for example, 144-6, 144-7, 144-8, 144-9, and 144-10) functioning as the terminals Tb1 to Tb3 are provided at portions to which the vias 143-6 to 143-10 are exposed on the lower surface of the semiconductor substrate 140. A plurality of pads 145 (for example, 145-10, 145-11, 145-12, 145-13, 145-14, 145-15, and 145-16) are provided on an upper surface of the element layer 141. Upper surfaces of the pads 145 are exposed to the upper surface of the element layer 141. A logic element layer 155 including a logic element functioning as the inverter INVA or the inverter INVB, and logic element layers 156 and 157 are provided in the element layer 141.

The signal path 142-6 includes the bump 144-6 (Tb3 or Ta2), the via 143-6 connected to the bump 144-6, and the pad 145-10 connected to the via 143-6. The pad 145-10 has an another-chip connection region which is directly connected to another chip. Here, "another chip" indicates the sub-chip SC0.

The signal path 142-7 includes the bump 144-7 (Tb3 or Ta2), the via 143-7 connected to the bump 144-7, the pad 145-11 connected to the via 143-7, and the pad 145-12. The pads 145-11 and 145-12 have another-chip connection regions which are directly connected to another chip. The pad 145-12 is a pad through which a signal flows to an internal circuit.

The signal path 142-8 includes the bump 144-8 (Tb1 or Ta1), the via 143-8 connected to the bump 144-8, and the pad 145-13 connected to the via 143-8. The pad 145-13 has an another-chip connection region which is directly connected to another chip.

The signal path 142-9 includes the bump 144-9 (Tb2 or Ta3), the via 143-9 connected to the bump 144-9, and the pad 145-14 connected to the via 143-9. The pad 145-14 has an another-chip connection region which is directly connected to another chip.

The signal path 142-10 includes the bump 144-10 (Tb2 or Ta3), the via 143-10 connected to the bump 144-10, the pad 145-15 connected to the via 143-10, the pad 145-16, the logic element layer 155, the wiring layer 156 connecting the pad 145-15 to the output end of the logic element layer 155, and the wiring layer 157 connecting the pad 145-16 to the input end of the logic element layer 155. The pad 145-15 is not directly connected to another chip. In other words, the pad 145-15 does not have an another-chip connection region. The pad 145-16 has an another-chip connection region which is directly connected to another chip.

A lower surface of the sub-chip SC1 is to be stacked on a lower surface of another sub-chip SC1. Thus, vias of the sub-chip SC1 are designed in mirror-image symmetry with respect to the lower surface of another sub-chip SC1. In other words, in the sub-chip SC1, the vias are provided in mirror-image symmetry with respect to the center of the sub-chip SC1 in the x axis direction in the xz plane (i.e., with respect to the via 143-13 in FIG. 18).

The wiring pattern of the sub-chip SC1 disposed as mentioned above is correlated with a symbol P6 illustrated in FIG. 18.

Although not illustrated here, each pad 145 or the wiring layers 156 and 157 may be connected to the internal circuits.

1-4-1-2. Stacking Structure

Figure 19:
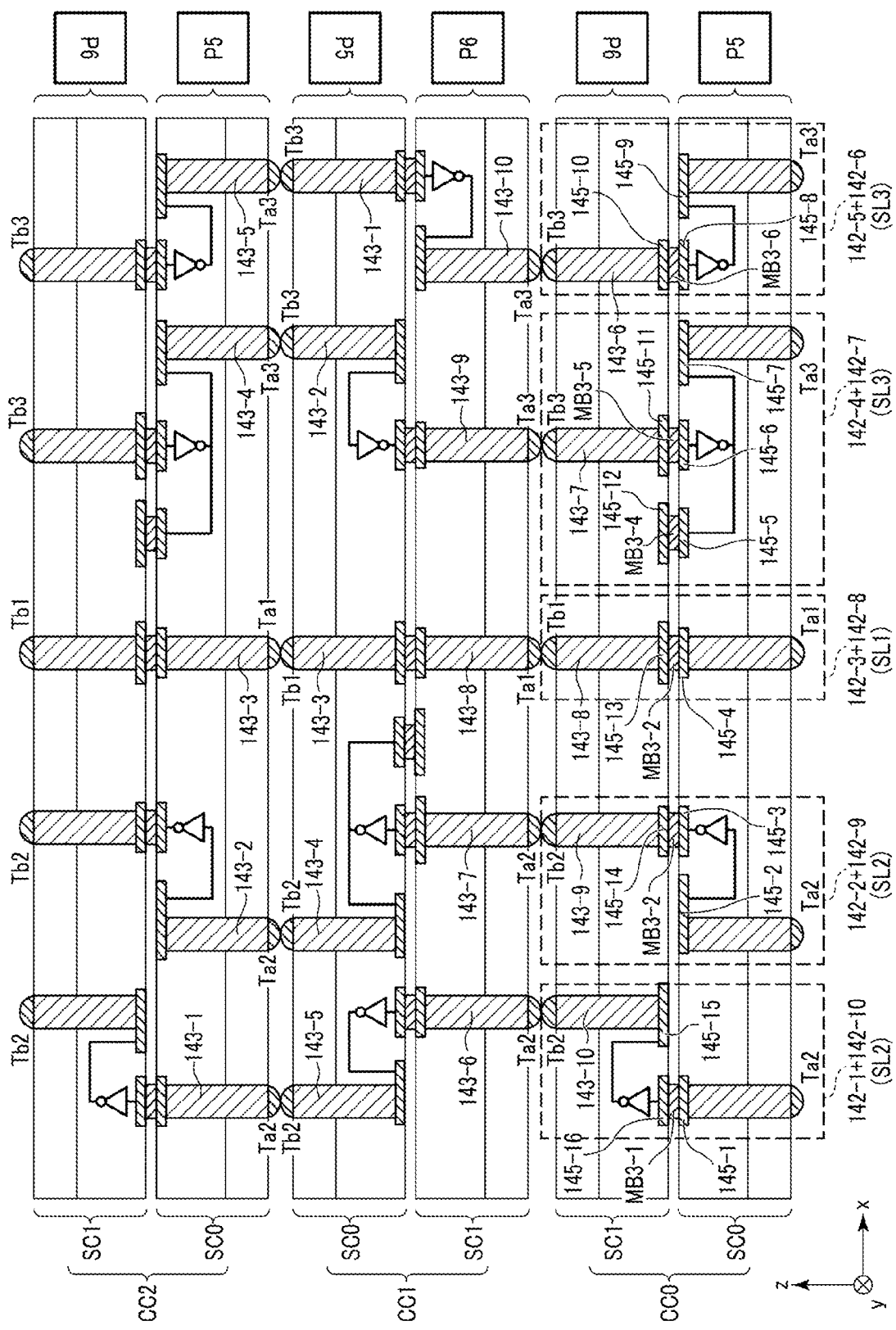
FIG. 19 is a sectional view illustrating a stacking structure of a core chip group of the semiconductor device according to Modification Example 2 of the first embodiment.

Next, with reference to FIG. 19, a description will be made of a stacking structure of a core chip group of the semiconductor device according to Modification Example 2 of the first embodiment. FIG. 19 is a sectional view illustrating a stacking structure of the core chip group of the semiconductor device according to Modification Example 2 of the first embodiment. FIG. 19 illustrates a structure in which three pairs of the sub-chips SC0 and SC1 illustrated in FIGS. 17 and 18 are stacked.

As illustrated in FIG. 19, the upper surface of the sub-chip SC0 is stacked on the upper surface of the sub-chip SC1. A position of each of the pads 145 having another-chip connection regions of the sub-chip SC0 matches a position of each of the pads 145 having another-chip connection regions of the sub-chip SC1. Specifically, positions of the pads 145-1, 145-3, 145-4 to 145-6, and 145-8 of the sub-chip SC0 respectively match positions of the pads 145-16, and 145-14 to 145-10 of the sub-chip SC1.

The lower surface of the sub-chip SC0 is stacked on the lower surface of another sub-chip SC0. Positions of the vias 143 of the sub-chip SC0 and positions of the vias 143 of another sub-chip SC0 are designed in mirror-image symmetry with respect to a plane where upper surfaces thereof face each other. Thus, positions of the vias 143-1 to 143-5 of the sub-chip SC0 respectively match positions of the vias 143-5 to 143-1 of another sub-chip SC0.

The lower surface of the sub-chip SC1 is stacked on the lower surface of another sub-chip SC1. Positions of the vias 143 of the sub-chip SC1 and positions of the vias 143 of another sub-chip SC1 are designed in mirror-image symmetry with respect to a plane where upper surfaces thereof face each other. Thus, positions of the vias 143-6 to 143-10 of the sub-chip SC1 respectively match positions of the vias 143-10 to 143-6 of another sub-chip SC1.

In the above-described configuration, the signal path 142-1 of the sub-chip SC0 and the signal path 142-10 of the sub-chip SC1 are electrically connected to each other through a micro-bump MB3-1 provided between the pad 145-1 and the pad 145-16, and thus form the signal path SL2 for performing communication with each internal circuit. Here, positions of the vias 143-1 and 143-10 in the xy plane do not match each other. Thus, the pad 145-1 directly connected to the via 143-1 and the pad 145-15 directly connected to the via 143-10 are not directly connected to each other.

As mentioned above, in the signal path 142-1 of the sub-chip SC0 and the signal path 142-10 of the sub-chip SC1, a signal path is bypassed such that pads directly connected to TSVs are not directly connected to each other by deviating positions of the TSVs between sub-chips, and thus a logic element layer can be inserted.

In the signal path SL2 that includes the signal path 142-1 of the sub-chip SC0 and the signal path 142-10 of the sub-chip SC1, the logic element layer is provided in the sub-chip SC1.

The signal path 142-2 of the sub-chip SC0 and the signal path 142-9 of the sub-chip SC1 are electrically connected to each other through a micro-bump MB3-2 provided between the pad 145-3 and the pad 145-14, and thus form the signal path SL2 for performing communication with each internal circuit. Here, positions of the vias 143-2 and 143-9 in the xy plane do not match each other. Thus, the pad 145-2 directly connected to the via 143-2 and the pad 145-14 directly connected to the via 143-9 are not directly connected to each other.

As mentioned above, in the signal path 142-2 of the sub-chip SC0 and the signal path 142-9 of the sub-chip SC1, a signal path is bypassed such that pads directly connected to TSVs are not directly connected to each other by deviating positions of the TSVs between sub-chips, and thus a logic element layer can be inserted.

In the signal path SL2 that includes the signal path 142-2 of the sub-chip SC0 and the signal path 142-9 of the sub-chip SC1, the logic element layer is provided in the sub-chip SC0.

As mentioned above, in the signal path SL2 including two sub-chips, a logic element layer may be provided in at least one sub-chip.

The signal path 142-3 of the sub-chip SC0 and the signal path 142-8 of the sub-chip SC1 are electrically connected to each other through a micro-bump MB3-3 provided between the pad 145-4 and the pad 145-13, and thus form the signal path SL1 for performing communication with each internal circuit. In the signal path SL1, a pad and a bump are directly connected to each other through a via without using a wiring layer under the pad. The signal path SL1 is, for example, a signal path related to the power source voltage and the ground voltage GND.

The signal path 142-4 of the sub-chip SC0 and the signal path 142-7 of the sub-chip SC1 are electrically connected to each other through a micro-bump MB3-4 provided between the pad 145-5 and the pad 145-12, and a micro-bump MB3-5 provided between the pad 145-6 and the pad 145-11, and thus form the signal path SL3 for performing communication with each internal circuit. Here, positions of the vias 143-4 and 143-7 in the xy plane do not match each other. Thus, the pad 145-7 directly connected to the via 143-4 and the pad 145-11 directly connected to the via 143-7 are not directly connected to each other.

As mentioned above, in the signal path 142-4 of the sub-chip SC0 and the signal path 142-7 of the sub-chip SC1, a signal path is bypassed such that pads directly connected to TSVs are not directly connected to each other by deviating positions of the TSVs between sub-chips, and thus a logic element layer can be inserted.

In the signal path SL3 that includes the signal path 142-4 of the sub-chip SC0 and the signal path 142-7 of the sub-chip SC1, the logic element layer is provided in the sub-chip SC0.

The signal path 142-5 of the sub-chip SC0 and the signal path 142-6 of the sub-chip SC1 are electrically connected to each other through a micro-bump MB3-6 provided between the pad 145-8 and the pad 145-10, and thus form the signal path SL3 for performing communication with each internal circuit. Here, positions of the vias 143-5 and 143-6 in the xy plane do not match each other. Thus, the pad 145-9 directly connected to the via 143-5 and the pad 145-10 directly connected to the via 143-6 are not directly connected to each other.

As mentioned above, in the signal path 142-5 of the sub-chip SC0 and the signal path 142-6 of the sub-chip SC1, a signal path is bypassed such that pads directly connected to TSVs are not directly connected to each other by deviating positions of the TSVs between sub-chips, and thus a logic element layer can be inserted.

In the signal path SL3 that includes the signal path 142-5 of the sub-chip SC0 and the signal path 142-6 of the sub-chip SC1, the logic element layer is provided in the sub-chip SC0.

Although not illustrated here, in the signal path SL3 including two sub-chips, a logic element layer may be provided in at least one sub-chip.

1-4-2. Effects

According to the embodiment, even when a sub-chip includes a pad through which a signal flows to an internal circuit, the same effect as that in Modification Example 1 of the first embodiment can be achieved.

2. Second Embodiment

Next, a description will be made of a semiconductor device according to a second embodiment. The semiconductor device according to the second embodiment includes a wiring pattern for changing assignment of a TSV between chips. Hereinafter, the same element as that in the first embodiment is given the same reference numeral, and a description thereof will be omitted, except that contents which are different from those in the first embodiment will be described.

2-1. Configuration

2-1-1. Signal Path in Core Chip

Core chips of a core chip group are electrically connected to each other through signal paths in each core chip.

Figure 20:
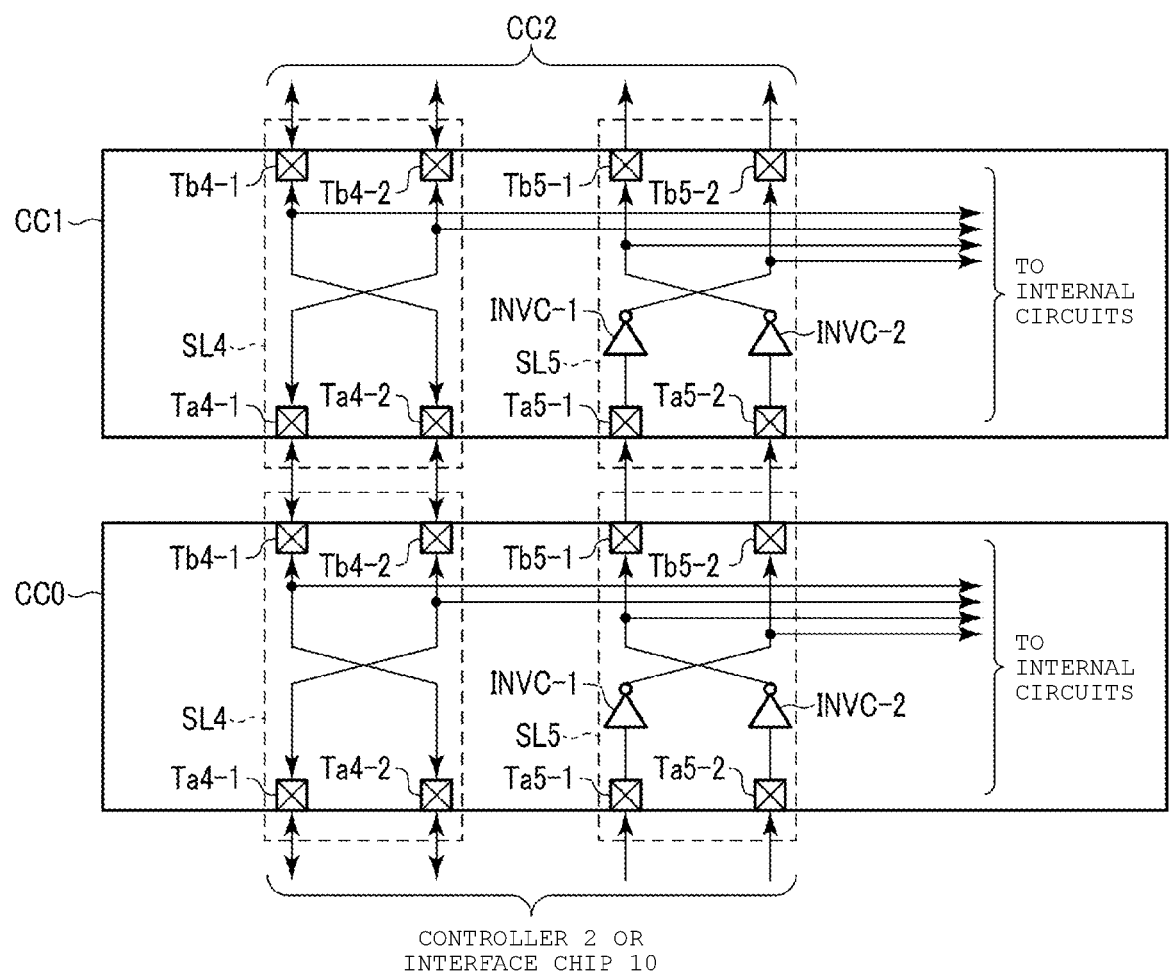
FIG. 20 is a circuit diagram illustrating signal paths of core chips of a semiconductor device according to a second embodiment.

Therefore, with reference to FIG. 20, a description will be made of signal paths of the core chips of the semiconductor device according to the second embodiment. FIG. 20 is a circuit diagram illustrating signal paths of the core chips of the semiconductor device according to the second embodiment.

As illustrated in FIG. 20, two types of signal paths SL4 and SL5 are provided in each of the core chips of the semiconductor device according to the second embodiment.

For example, the above-described signal paths SL1 to SL3 are signal paths in which, in the z axis direction, a set of a terminal Tax (where x is any number) and a terminal Tbx is provided in each core chip, and a signal or power which is input from the terminal Tax is not input to another terminal (for example, Tay (where y is a number other than x)).

The signal path SL4 includes terminals Ta4-1, Ta4-2, Tb4-1, and Tb4-2, a wiring layer which is provided in a core chip CC and connects the terminals Ta4-1 and Tb4-2 to each other, and a wiring layer which is provided in the core chip CC and connects the terminals Ta4-2 and Tb4-1 to each other. Assignment of a terminal to which a signal or power is input can be changed for each chip by using the signal path SL4.

For example, in a core chip CC0, a signal which is input from the terminal Ta4-1 is output from the terminal Tb4-2, and is input to the terminal Ta4-2 of a core chip CC1. In the core chip CC0, a signal which is input from the terminal Ta4-2 is output from the terminal Tb4-1, and is input to the terminal Ta4-1 of the core chip CC1. As mentioned above, in the signal path SL4, an input destination (terminal) of a signal is changed.

The signal path SL5 includes terminals Ta5-1, Ta5-2, Tb5-1, and Tb5-2, a wiring layer which is provided in the core chip CC and connects the terminals Ta5-1 and Tb5-2 to each other, a wiring layer which is provided in the core chip CC and connects the terminals Ta5-2 and Tb5-1 to each other, an inverter INVC-1 which is provided on the wiring layer between terminals Ta5-1 and Tb5-2 and has an input end connected to the terminal Ta5-1 and an output end connected to the terminal Tb5-2, and an inverter INVC-2 which is provided on the wiring layer between terminals Ta5-2 and Tb5-1 and has an input end connected to the terminal Ta5-2 and an output end connected to the terminal Tb5-1. Assignment of contact of a single signal or power source can be changed by using the signal path SL5.

2-1-2. Configuration of Sub-Chip

Layouts of the sub-chips SC0 and SC1 are the same as those described in the first embodiment.

2-1-2-1. Section of Sub-Chip SC0

Figure 21:
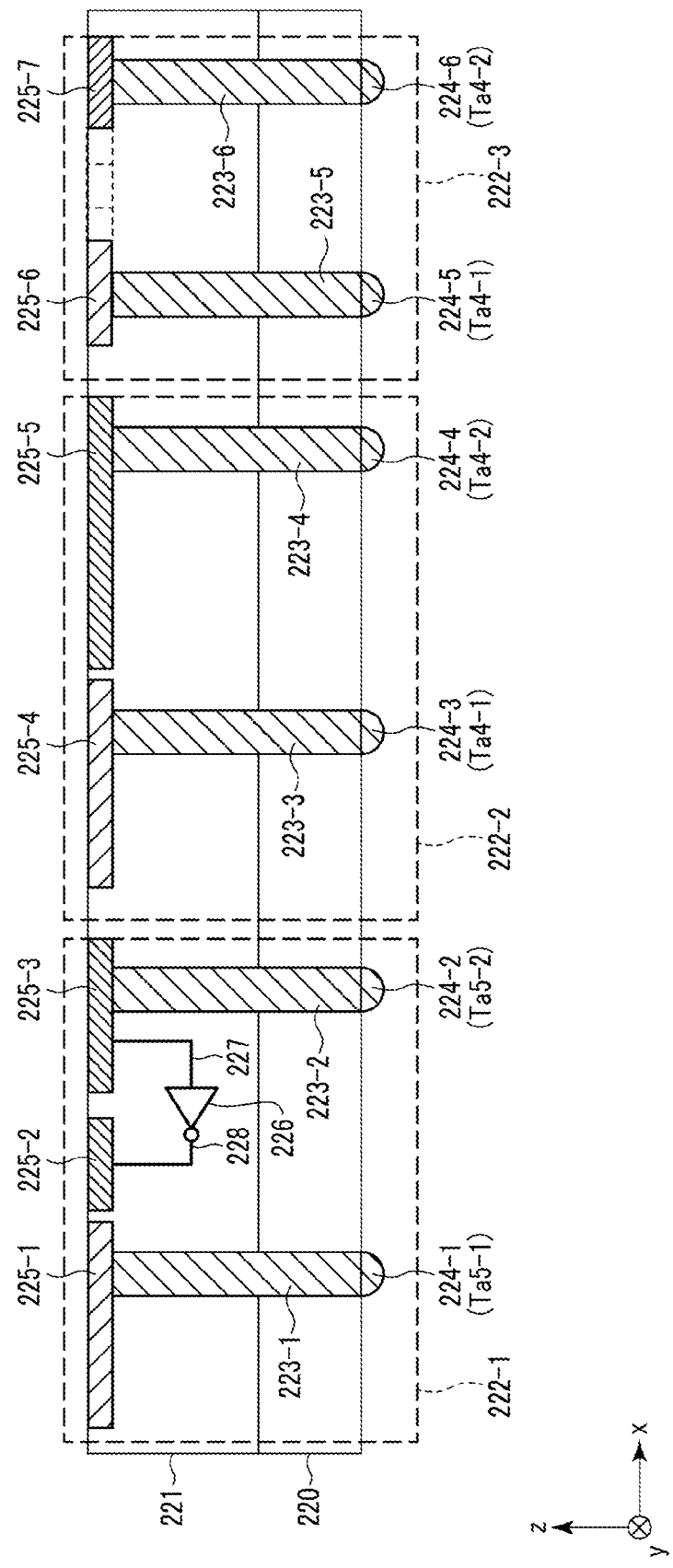
FIG. 21 is a sectional view illustrating an example of a wiring pattern of sub-chips of the semiconductor device according to the second embodiment.

With reference to FIG. 21, a description will be made of an example of a wiring pattern of the sub-chip of the semiconductor device according to the second embodiment. FIG. 21 is a sectional view illustrating an example of a wiring pattern of the sub-chip of the semiconductor device according to the second embodiment. FIG. 21 illustrates a wiring pattern that makes up parts of the signal paths SL4 and SL5 as an example.

As illustrated in FIG. 21, an element layer 221 is provided on an upper surface of a semiconductor substrate 220. For simplification, FIG. 21 does not illustrate internal circuits other than the signal paths.

FIG. 21 illustrates a plurality of signal paths 222 (for example, 222-1, 222-2, and 222-3).

The semiconductor substrate 220 and the element layer 221 are provided with a plurality of vias 223 (for example, 223-1, 223-2, 223-3, 223-4, 223-5, and 223-6) which are through silicon vias (TSVs). A plurality of bumps 224 (for example, 224-1, 224-2, 224-3, 224-4, 224-5, and 224-6) functioning as the terminals Ta4-1, Ta4-2, Ta5-1, and Ta5-2 are provided at portions to which the vias 223-1 to 223-6 are exposed on the lower surface of the semiconductor substrate 220. A plurality of pads 225 (for example, 225-1, 225-2, 225-3, 225-4, 225-5, 225-6, and 225-7) are provided on an upper surface of the element layer 221. Upper surfaces of the pads 225 are exposed to the upper surface of the element layer 221. A logic element layer 226 including a logic element functioning as the inverter INVC-2, and wiring layers 227 and 228 are provided in the element layer 221.

The signal path 222-1 includes the bump 224-1 (Ta5-1), the via 223-1 connected to the bump 224-1, and the pad 225-1 connected to the via 223-1. In the pad 225-1, a region which is directly opposite the region connected to the via 223-1 and is exposed to the upper surface of the element layer 221 is a first region which is not directly connected to another chip. In the pad 225-1, for example, a region which extends in the x axis direction from the first region which is not directly connected to another chip and is exposed to the upper surface of the element layer 221 is a second region (that is, an another-chip connection region) which is directly connected to another chip. Here, "another chip" indicates the sub-chip SC1.

The signal path 222-1 includes the bump 224-2 (Ta5-2), the via 223-2 connected to the bump 224-2, the pad 225-3 connected to the via 223-2, the pad 225-2, the logic element layer 226, the wiring layer 227 connecting the pad 225-3 to the input end of the logic element layer 226, and the wiring layer 228 connecting the pad 225-2 to the output end of the logic element layer 226. The pad 225-3 is not directly connected to another chip. In other words, the pad 225-3 does not have an another-chip connection region. The pad 225-2 has an another-chip connection region which is directly connected to another chip.

The signal path 222-2 includes the bump 224-3 (Ta4-1), the via 223-3 connected to the bump 224-3, and the pad 225-4 connected to the via 223-3. In the pad 225-4, a region which is directly opposite the region connected to the via 223-3 and is exposed to the upper surface of the element layer 221 is a first region which is not directly connected to another chip. In the pad 225-4, for example, a region which extends in the x axis direction from the first region which is not directly connected to another chip and is exposed to the upper surface of the element layer 221 is a second region (that is, an another-chip connection region) which is directly connected to another chip.

The signal path 222-2 includes the bump 224-4 (Ta4-2), the via 223-4 connected to the bump 224-4, and the pad 225-5 connected to the via 223-4. In the pad 225-5, a region which is directly opposite the region connected to the via 223-4 and is exposed to the upper surface of the element layer 221 is a first region which is not directly connected to another chip. In the pad 225-5, for example, a region which extends in the x axis direction from the first region which is not directly connected to another chip and is exposed to the upper surface of the element layer 221 is a second region (that is, an another-chip connection region) which is directly connected to another chip.

The signal path 222-3 includes the bump 224-5 (Ta4-1), the via 223-5 connected to the bump 224-5, and the pad 225-6 connected to the via 223-5. In the pad 225-6, a region which is directly opposite the region connected to the via 223-5 and is exposed to the upper surface of the element layer 221 is a first region which is not directly connected to another chip. In the pad 225-6, for example, a region which is different from the first region which is not directly connected to another chip and is exposed to the upper surface of the element layer 221 is a second region (that is, an another-chip connection region) which is directly connected to another chip.

The signal path 222-3 includes the bump 224-6 (Ta4-2), the via 223-6 connected to the bump 224-6, and the pad 225-7 connected to the via 223-6. In the pad 225-7, a region which is directly opposite the region connected to the via 223-6 and is exposed to the upper surface of the element layer 221 is a first region which is not directly connected to another chip. In the pad 225-7, for example, a region which is different from the first region which is not directly connected to another chip and is exposed to the upper surface of the element layer 221 is a second region (that is, an another-chip connection region) which is directly connected to another chip.

The wiring pattern of the sub-chip SC0 disposed as mentioned above is correlated with a symbol P7 illustrated in FIG. 21.

Although not illustrated here, each pad 225 or the wiring layers 227 and 228 may be connected to the internal circuits.

2-1-2-2. Upper Surface of Sub-Chip SC0

Figure 22:
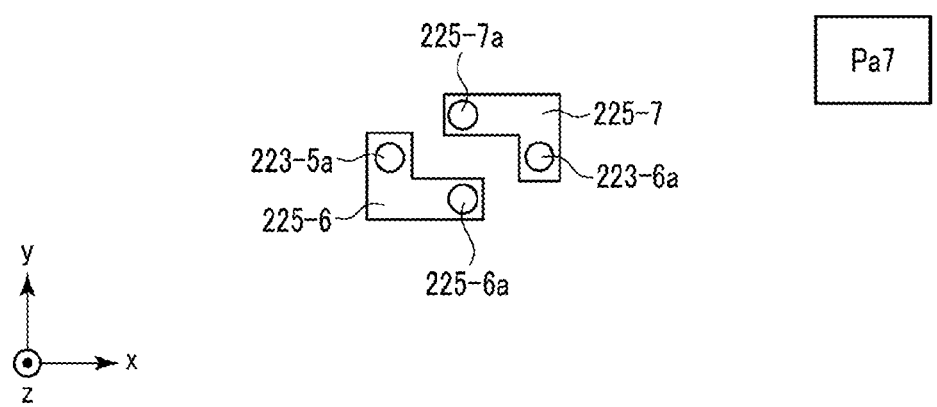
FIG. 22 is a top view illustrating an example of a wiring pattern of the sub-chips of the semiconductor device according to the second embodiment.

With reference to FIG. 22, a description will be made of an example of a wiring pattern of the sub-chip of the semiconductor device according to the second embodiment. FIG. 22 is a top view illustrating an example of a wiring pattern of the sub-chip of the semiconductor device according to the second embodiment.

FIG. 22 illustrates a relationship between the pad 225-6 and the pad 225-7 in the xy plane.

As illustrated in FIG. 22, in the xy plane, the pad 225-6 has a polygonal shape (an L shape in FIG. 22). In the xy plane, the pad 225-7 has a polygonal shape (an inverse L shape in FIG. 22).

The pad 225-6 is connected to the via 223-5 in a via connection region 223-5a. The pad 225-6 is connected to another chip through an another-chip connection region 225-6a.

The pad 225-7 is connected to the via 223-6 in a via connection region 223-6a. The pad 225-7 is connected to another chip through an another-chip connection region 225-7a.

In the example illustrated in FIG. 22, the via connection region 223-5a and via connection region 223-6a are located on the same line along the x axis direction. The another-chip connection region 225-6a and the another-chip connection region 225-7a are located on the same line along the y axis direction.

The pattern of the pads 225 of the sub-chip SC0 disposed as mentioned above is correlated with a symbol Pa1 illustrated in FIG. 22.

2-1-2-3. Section of Sub-Chip SC1

Figure 23:
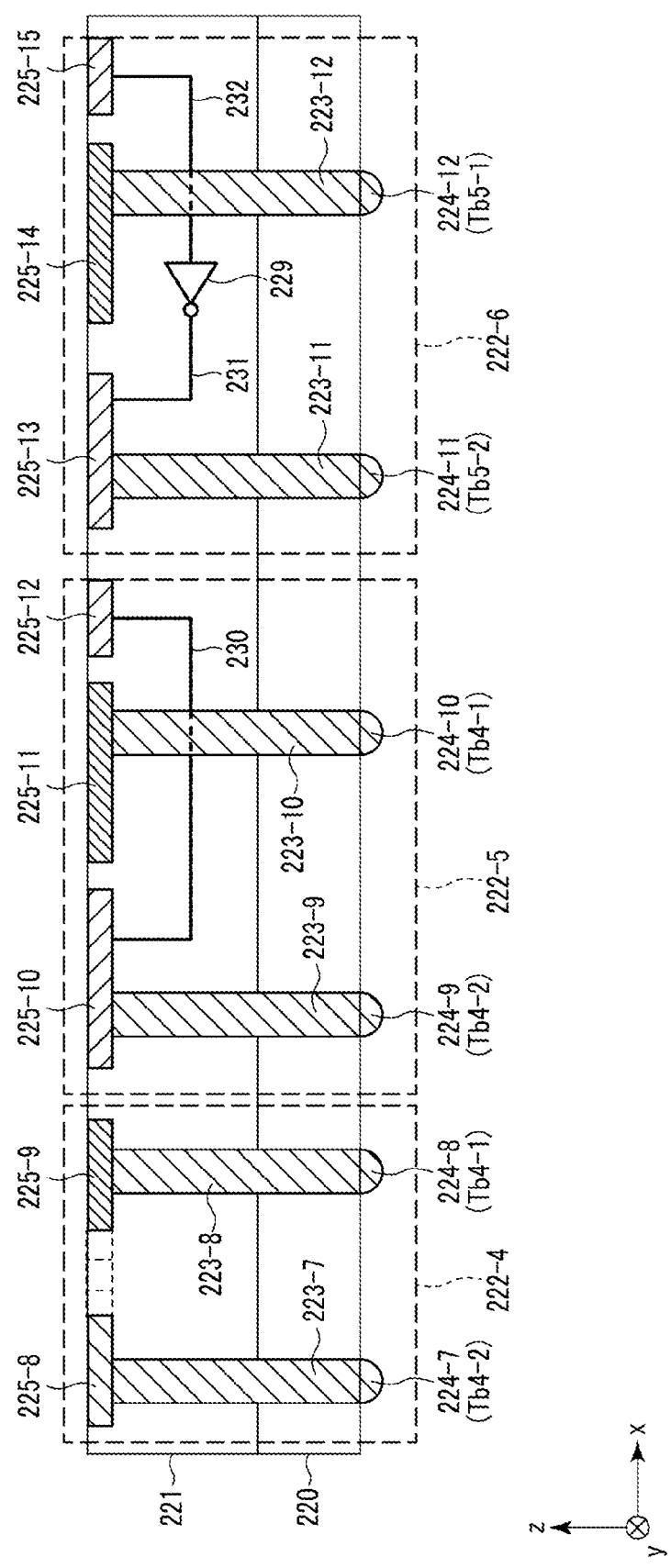
FIG. 23 is a sectional view illustrating an example of a wiring pattern of the sub-chips of the semiconductor device according to the second embodiment.

With reference to FIG. 23, a description will be made of an example of a wiring pattern of the sub-chip of the semiconductor device according to the second embodiment. FIG. 23 is a sectional view illustrating an example of a wiring pattern of the sub-chip of the semiconductor device according to the second embodiment. FIG. 23 illustrates a wiring pattern that makes up parts of the signal paths SL4 and SL5 as an example.

As illustrated in FIG. 23, an element layer 221 is provided on an upper surface of a semiconductor substrate 220. For simplification, FIG. 23 does not illustrate internal circuits other than the signal paths.

FIG. 23 illustrates a plurality of signal paths 222 (for example, 222-4, 222-5, and 222-6).

The semiconductor substrate 220 and the element layer 221 are provided with a plurality of vias 223 (for example, 223-7, 223-8, 223-9, 223-10, 223-11, and 223-12) which are through silicon vias (TSVs). A plurality of bumps 224 (for example, 224-7, 224-8, 224-9, 224-10, 224-11, and 224-12) functioning as the terminals Tb4-1, Tb4-2, Tb5-1, and Tb5-2 are provided at portions to which the vias 223-7 to 223-12 are exposed on the lower surface of the semiconductor substrate 220. A plurality of pads 225 (for example, 225-8, 225-9, 225-10, 225-11, 225-12, 225-13, 225-14, and 225-15) are provided on an upper surface of the element layer 221. Upper surfaces of the pads 225 are exposed to the upper surface of the element layer 221. A logic element layer 229 including a logic element functioning as the inverter INVC-1, and wiring layers 231 and 232 are provided in the element layer 221.

The signal path 222-4 includes the bump 224-7 (Tb4-2), the via 223-7 connected to the bump 224-7, and the pad 225-8 connected to the via 223-7. In the pad 225-8, a region which is directly opposite the region connected to the via 223-7 and is exposed to the upper surface of the element layer 221 is a first region which is not directly connected to another chip. In the pad 225-8, for example, a region which is different from the first region which is not directly connected to another chip and is exposed to the upper surface of the element layer 221 is a second region (that is, an another-chip connection region) which is directly connected to another chip. Here, "another chip" indicates the sub-chip SC0.

The signal path 222-4 includes the bump 224-8 (Tb4-1), the via 223-8 connected to the bump 224-8, and the pad 225-9 connected to the via 223-8. In the pad 225-9, a region which is directly opposite the region connected to the via 223-8 and is exposed to the upper surface of the element layer 221 is a first region which is not directly connected to another chip. In the pad 225-9, for example, a region which is different from the first region which is not directly connected to another chip and is exposed to the upper surface of the element layer 221 is a second region (that is, an another-chip connection region) which is directly connected to another chip.

The signal path 222-5 includes the bump 224-9 (Tb4-2), the via 223-9 connected to the bump 224-9, the pad 225- connected to the via 223-9, the pad 225-12, and the wiring layer 227 which connects the pad 225-10 to the pad 225-12. The pad 225-10 is not directly connected to another chip. In other words, the pad 225-10 does not have an another-chip connection region. The pad 225-12 has an another-chip connection region which is directly connected to another chip.

The signal path 222-5 includes the bump 224-10 (Tb4-1), the via 223-10 connected to the bump 224-10, and the pad 225-11 connected to the via 223-10. In the pad 225-11, a region which is directly opposite the region connected to the via 223-10 and is exposed to the upper surface of the element layer 221 is a first region which is not directly connected to another chip. In the pad 225-11, for example, a region which extends in the x axis direction from the first region which is not directly connected to another chip and is exposed to the upper surface of the element layer 221 is a second region (that is, an another-chip connection region) which is directly connected to another chip.

The pad 225-11 is located to be interposed between the pad 225-10 and the pad 225-12 in the x axis direction.

The wiring layer 230 is not electrically connected to the via 223-10.

The signal path 222-6 includes the bump 224-11 (Tb5-2), the via 223-11 connected to the bump 224-11, the pad 225-13 connected to the via 223-11, the pad 225-15, the logic element layer 229, the wiring layer 231 which connects the pad 225-13 to the output end of the logic element layer 229, and the wiring layer 232 which connects the pad 225-15 to the input end of the logic element layer 229. The pad 225-13 is not directly connected to another chip. In other words, the pad 225-13 does not have an another-chip connection region. The pad 225-15 has an another-chip connection region which is directly connected to another chip.

The signal path 222-6 includes the bump 224-12 (Tb5-1), the via 223-12 connected to the bump 224-12, and the pad 225-14 connected to the via 223-12. In the pad 225-14, a region which is directly opposite the region connected to the via 223-12 and is exposed to the upper surface of the element layer 221 is a first region which is not directly connected to another chip. In the pad 225-14, for example, a region which extends in the x axis direction from the first region which is not directly connected to another chip and is exposed to the upper surface of the element layer 221 is a second region (that is, an another-chip connection region) which is directly connected to another chip.

The pad 225-14 is located to be interposed between the pad 225-13 and the pad 225-15 in the x axis direction.

The wiring layer 232 is not electrically connected to the via 223-12.

The vias of the sub-chip SC0 and the vias of the sub-chip SC1 are designed in mirror-image symmetry with respect to a plane where lower surfaces thereof face each other.

The wiring pattern of the sub-chip SC1 disposed as mentioned above is correlated with a symbol P8 illustrated in FIG. 23.

Although not illustrated here, each pad 225 or the wiring layers 231 and 232 may be connected to the internal circuits.

2-1-2-4. Upper Surface of Sub-Chip SC1

Figure 24:
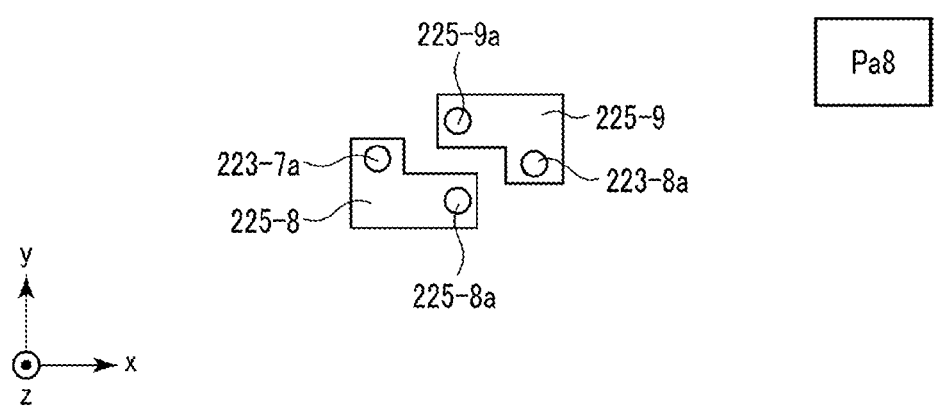
FIG. 24 is a top view illustrating an example of a wiring pattern of the sub-chips of the semiconductor device according to the second embodiment.

With reference to FIG. 24, a description will be made of an example of a wiring pattern of the sub-chip of the semiconductor device according to the second embodiment. FIG. 24 is a top view illustrating an example of a wiring pattern of the sub-chip of the semiconductor device according to the second embodiment.

FIG. 24 illustrates a relationship between the pad 225-8 and the pad 225-9 in the xy plane.

As illustrated in FIG. 24, in the xy plane, the pad 225-8 has a polygonal shape (an L shape in FIG. 24). In the xy plane, the pad 225-9 has a polygonal shape (an inverse L shape in FIG. 24).

The pad 225-8 is connected to the via 223-7 in a via connection region 223-7a. The pad 225-8 is connected to another chip through an another-chip connection region 225-8a.

The pad 225-9 is connected to the via 223-8 in a via connection region 223-8a. The pad 225-9 is connected to another chip through an another-chip connection region 225-9a.

In the example illustrated in FIG. 24, the via connection region 223-7a and via connection region 223-8a are located on the same line along the x axis direction. The another-chip connection region 225-8a and the another-chip connection region 225-9a are located on the same line along the y axis direction.

The pattern of the pads 225 of the sub-chip SC1 disposed as mentioned above is correlated with a symbol Pa8 illustrated in FIG. 24.

2-1-3. Stacking Structure

Figure 25:
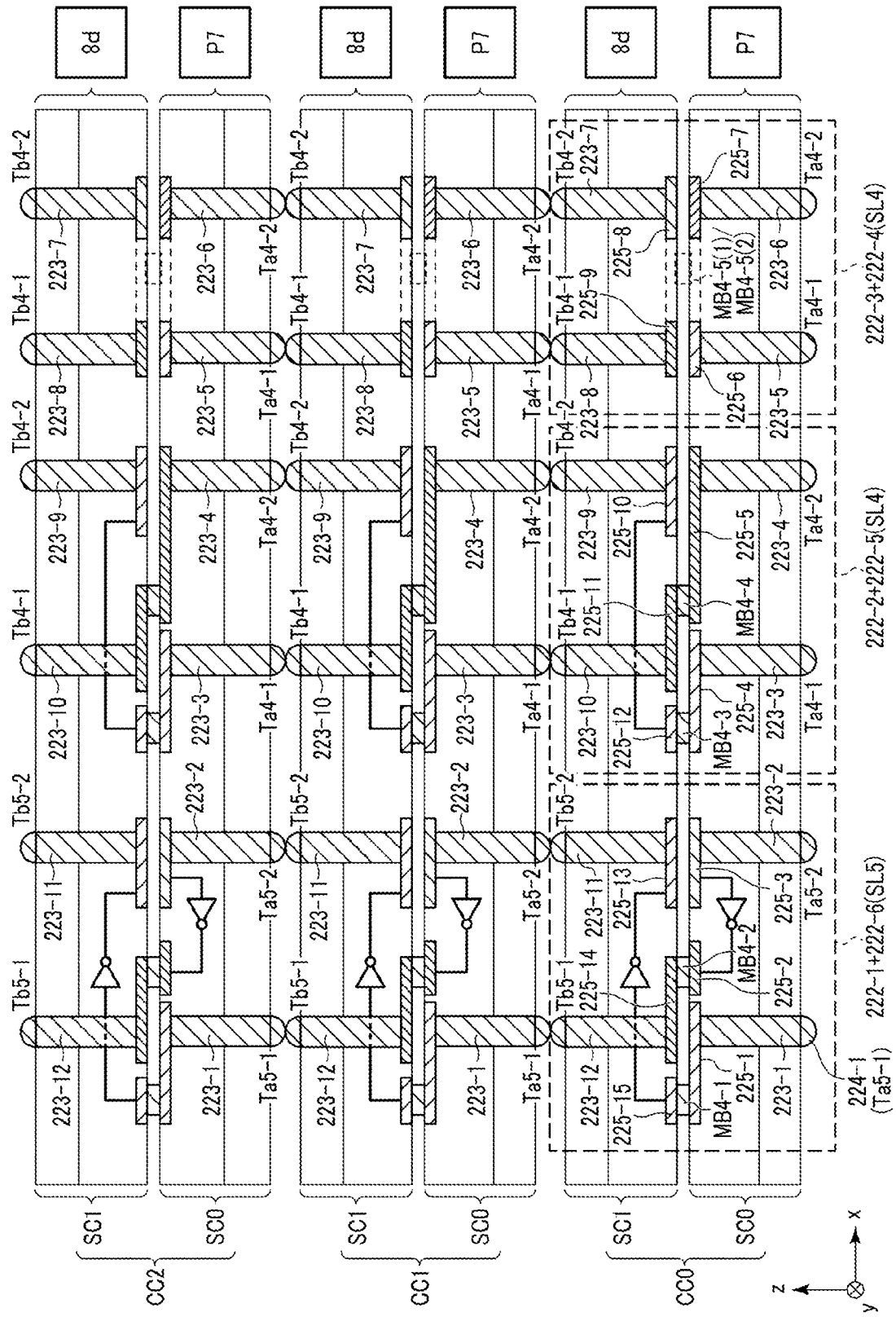
FIG. 25 is a sectional view illustrating a stacking structure of a core chip group of the semiconductor device according to the second embodiment.

Next, with reference to FIG. 25, a description will be made of a stacking structure of the core chip group of the semiconductor device according to the second embodiment. FIG. 25 is a sectional view illustrating a stacking structure of the core chip group of the semiconductor device according to the second embodiment. FIG. 25 illustrates a structure in which three pairs of the sub-chips SC0 and SC1 illustrated in FIGS. 21 to 24 are stacked in this order.

As illustrated in FIG. 25, the upper surface of the sub-chip SC0 is stacked on the upper surface of the sub-chip SC1. A position of each of the pads 225 having another-chip connection regions of the sub-chip SC0 matches a position of each of the pads 225 having another-chip connection regions of the sub-chip SC1. Specifically, positions of the pads 225-1, 225-2, and 225-4 to 225-7 of the sub-chip SC0 respectively match positions of the pads 225-8, 225-9, 225-11, 225-12, 225-14, and 225-15 of the sub-chip SC1.

The lower surface of the sub-chip SC0 is stacked on the lower surface of the sub-chip SC1. Positions of the vias 223 of the sub-chip SC0 and positions of the vias 223 of the sub-chip SC1 are designed in mirror-image symmetry with respect to a plane where upper surfaces thereof face each other. Thus, positions of the vias 223-1 to 223-6 of the sub-chip SC0 respectively match positions of the vias 223-12 to 223-7 of the sub-chip SC1.

In the above-described configuration, the signal path 222-1 of the sub-chip SC0 and the signal path 222-6 of the sub-chip SC1 are electrically connected to each other through a micro-bump MB4-1 provided between the pad 225-1 and the pad 225-15, and are electrically connected to each other through a micro-bump MB4-2 provided between the pad 225-2 and the pad 225-14, and thus form the signal path SL5 for performing communication with each internal circuit.

Here, positions of the vias 223-1 and 223-12 in the xy plane match each other. However, an insulator is provided between the pad 225-1 directly connected to the via 223-1 and the pad 225-14 directly connected to the via 223-12, and thus the pads 225-1 and 225-14 are not directly connected to each other. Here, positions of the vias 223-2 and 223-11 in the xy plane match each other. However, an insulator is provided between the pad 225-3 directly connected to the via 223-2 and the pad 225-13 directly connected to the via 223-11, and thus the pads 225-3 and 225-13 are not directly connected to each other. As mentioned above, in the two sub-chips, there is a region in which pads directly connected to TSVs facing each other on the mutual upper surfaces are not directly connected to each other. The pad 225-3 of the sub-chip SC0 is connected to another pad 225-2 provided on the upper surface of the sub-chip SC0 through the wiring layers and the logic element layer in the sub-chip SC0. The pad 225-2 of the sub-chip SC0 is connected to the pad 225-14 of the other sub-chip SC1 through the micro-bump MB4-2. The pad 225-13 of the sub-chip SC1 is connected to another pad 225-15 provided on the upper surface of the sub-chip SC1 through the wiring layers and the logic element layer in the sub-chip SC1. The pad 225-1 of the sub-chip SC0 is connected to the pad 225-15 of the other sub-chip SC1 through the micro-bump MB4-1. In other words, in the two sub-chips, two pads directly connected to TSVs not facing each other on the mutual upper surfaces are electrically connected to each other indirectly.

As mentioned above, in the signal path 222-1 of the sub-chip SC0 and the signal path 222-6 of the sub-chip SC1, a signal path is bypassed such that pads directly connected to TSVs are not connected to each other by extending a pad. Thus, it is possible to insert a logic element layer and also to change assignment of a terminal to which a signal or power is input for each chip.

The signal path 222-2 of the sub-chip SC0 and the signal path 222-5 of the sub-chip SC1 are electrically connected to each other through a micro-bump MB4-3 provided between the pad 225-4 and the pad 225-12, and are electrically connected to each other through a micro-bump MB4-4 provided between the pad 225-5 and the pad 225-11, and thus form the signal path SL4 for performing communication with each internal circuit.

Here, positions of the vias 223-3 and 223-10 in the xy plane match each other. However, an insulator is provided between the pad 225-4 directly connected to the via 223-3 and the pad 225-11 directly connected to the via 223-10, and thus the pads 225-4 and 225-11 are not directly connected to each other. Here, positions of the vias 223-4 and 223-9 in the xy plane match each other. However, an insulator is provided between the pad 225-5 directly connected to the via 223-4 and the pad 225-10 directly connected to the via 223-9, and thus the pads 225-5 and 225-10 are not directly connected to each other. As mentioned above, in the two sub-chips, there is a region in which pads directly connected to TSVs facing each other on the mutual upper surfaces are not directly connected to each other. The pad 225-10 of the sub-chip SC1 is connected to another pad 225-12 provided on the upper surface of the sub-chip SC1 through the wiring layer in the sub-chip SC1. The pad 225-12 of the sub-chip SC1 is connected to the pad 225-4 of the other sub-chip SC0 through the micro-bump MB4-3. The pad 225-5 of the sub-chip SC0 is connected to the pad 225-11 of the other sub-chip SC1 through the micro-bump MB4-4. In other words, in the two sub-chips, two pads directly connected to TSVs not facing each other on the mutual upper surfaces are electrically connected to each other indirectly.

As mentioned above, in the signal path 222-2 of the sub-chip SC0 and the signal path 222-5 of the sub-chip SC1, a signal path is bypassed such that pads directly connected to TSVs are not connected to each other by extending a pad, and thus it is possible to insert a logic element layer and also to change assignment of a terminal to which a signal or power is input for each chip.

The signal path 222-3 of the sub-chip SC0 and the signal path 222-4 of the sub-chip SC1 are electrically connected to each other through a micro-bump MB4-5(1) provided between the pad 225-6 and the pad 225-9, and are electrically connected to each other through a micro-bump MB4-5(2) provided between the pad 225-7 and the pad 225-8, and thus form the signal path SL4 for performing communication with each internal circuit.

Here, positions of the vias 223-5 and 223-8 in the xy plane match each other. However, an insulator is provided between the pad 225-6 directly connected to the via 223-5 and the pad 225-9 directly connected to the via 223-8, and thus the pads 225-6 and 225-9 are not directly connected to each other. Here, positions of the vias 223-6 and 223-7 in the xy plane match each other. However, an insulator is provided between the pad 225-7 directly connected to the via 223-6 and the pad 225-8 directly connected to the via 223-7, and thus the pads 225-7 and 225-8 are not directly connected to each other. As mentioned above, in the two sub-chips, there is a region in which pads directly connected to TSVs facing each other on the mutual upper surfaces are not directly connected to each other.

As mentioned above, in the signal path 222-3 of the sub-chip SC0 and the signal path 222-4 of the sub-chip SC1, a signal path is bypassed such that pads directly connected to TSVs are not connected to each other by extending a pad, and thus it is possible to insert a logic element layer and also to change assignment of a terminal to which a signal or power is input for each chip.

According to the signal path 222-1 and the signal path 222-6, or the signal path 222-2 and the signal path 222-5, the signal path SL5 or the signal path SL4 is provided by routing the wiring layers. However, according to the signal path 222-3 or the signal path 222-4, the signal path SL4 is provided by using shapes of the pads.

Figure 26:
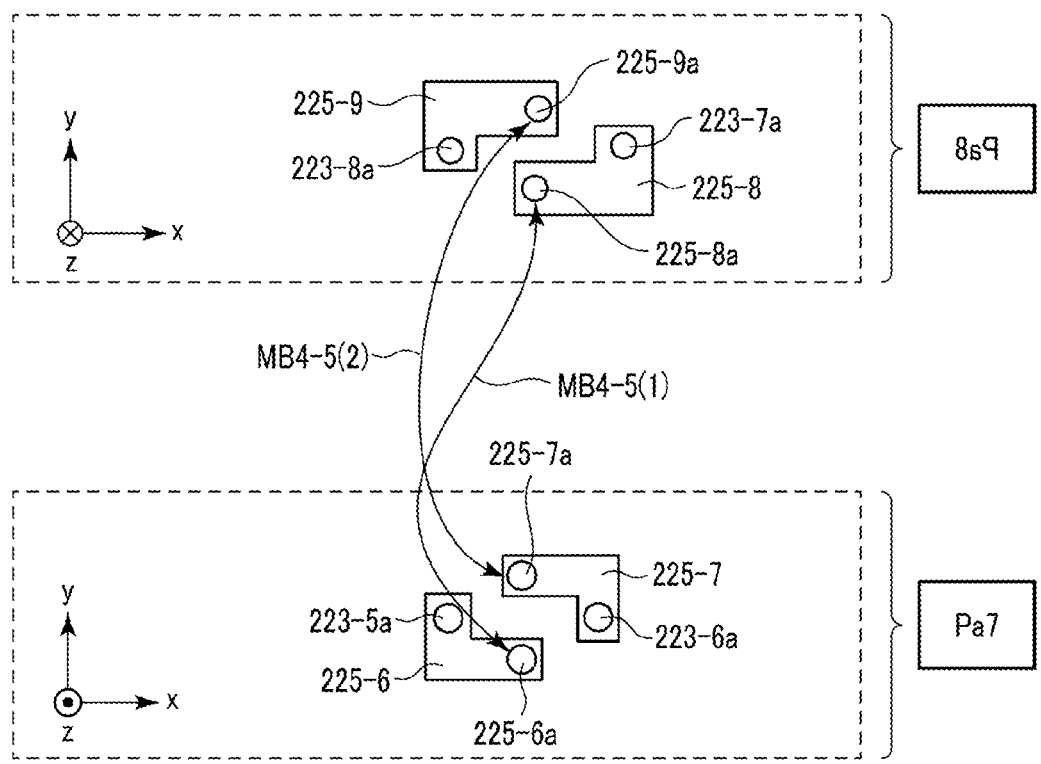
FIG. 26 is a diagram illustrating a relationship between pads of the two sub-chips of the semiconductor device according to the second embodiment before they are stacked.

Here, with reference to FIG. 26, a description will be made of a connection method for the pads 225-6 and 225-8 and a connection method for the pads 225-7 and 225-9. FIG. 26 is a diagram illustrating a relationship between pads of the two sub-chips of the semiconductor device according to the second embodiment before they are stacked. FIG. 26 is a diagram illustrating an xy plane of the pads 225-6 and 225-7 and an xy plane of the pads 225-8 and 225-9 before the sub-chips are stacked.

As illustrated in FIG. 26, the sub-chip SC0 and the sub-chip SC1 are stacked back to back. Thus, in FIG. 26, the pattern of the pads 225-8 and 225-9 of the sub-chip SC1 is illustrated in a state in which the pattern illustrated in FIG. 24 is horizontally rotated by 180 degrees.

The connection region 225-8a of the pad 225-8 is located over the connection region 225-6a of the pad 225-6 in the z axis direction. The connection region 225-6a of the pad 225-6 is connected to the connection region 225-8a of the pad 225-8 through the micro-bump MB4-5(1).

The connection region 225-9a of the pad 225-9 is located over the connection region 225-7a of the pad 225-7 in the z axis direction. The connection region 225-7a of the pad 225-7 is connected to the connection region 225-9a of the pad 225-9 through the micro-bump MB4-5(2).

In other words, in the two sub-chips, two pads directly connected to TSVs not facing each other on the mutual upper surfaces are electrically connected to each other indirectly.

2-1-4. Flow of Signal or Power

Figure 27:
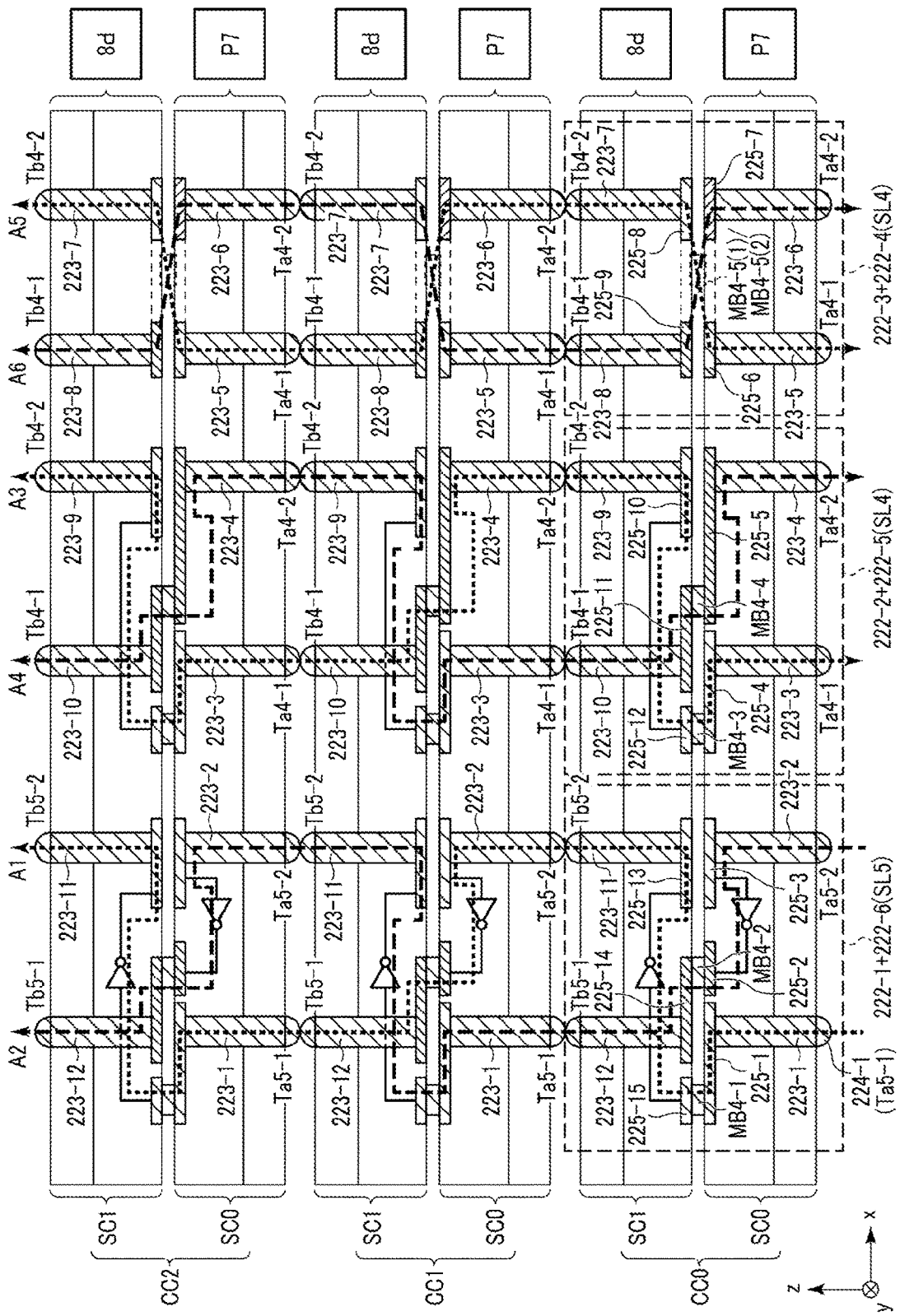
FIG. 27 is a sectional view illustrating a flow of a signal or power in the stacking structure of the core chip group of the semiconductor device according to the second embodiment.

Here, with reference to FIG. 27, a description will be made of a flow of a signal or power. FIG. 27 is a sectional view illustrating a flow of a signal or power in the stacking structure of the core chip group of the semiconductor device according to the second embodiment. Herein, for simplification, terminals (bumps) and vias through which a signal or power flows will be focused on.

First, a description will be made of a path including the signal paths 222-1 and 222-6 by referring to arrows A1 and A2. A signal or power which is input to the terminal Ta5-1 is output from the terminal Tb5-2 through the via 223-1 and the via 223-11. A signal or power which is input to the terminal Ta5-2 is output from the terminal Tb5-1 through the via 223-2 and the via 223-12. As mentioned above, in the present embodiment, it is possible to provide the signal path SL5 in which a terminal to which a signal or power is input is changed for each chip.

Next, a description will be made of a path including the signal paths 222-2 and 222-5 by referring to arrows A3 and A4. A signal or power which is input to the terminal Ta4-1 is output from the terminal Tb4-2 through the via 223-3 and the via 223-9. A signal or power which is input to the terminal Tb4-2 is output from the terminal Ta4-1 through the via 223-9 and the via 223-3. A signal or power which is input to the terminal Ta4-2 is output from the terminal Tb4-1 through the via 223-4 and the via 223-10. A signal or power which is input to the terminal Tb4-1 is output from the terminal Ta4-2 through the via 223-10 and the via 223-4. As mentioned above, in the present embodiment, it is possible to provide the signal path SL4 in which a TSV to which a signal or power is input is changed for each chip.

Next, a description will be made of a path including the signal paths 222-3 and 222-4 by referring to arrows A5 and A6. A signal or power which is input to the terminal Ta4-1 is output from the terminal Tb4-2 through the via 223-5 and the via 223-7. A signal or power which is input to the terminal Tb4-2 is output from the terminal Ta4-1 through the via 223-7 and the via 223-5. A signal or power which is input to the terminal Ta4-2 is output from the terminal Tb4-1 through the via 223-6 and the via 223-8. A signal or power which is input to the terminal Tb4-1 is output from the terminal Ta4-2 through the via 223-8 and the via 223-6. As mentioned above, in the present embodiment, it is possible to provide the signal path SL4 in which a TSV to which a signal or power is input is changed for each chip.

2-2. Effects

According to the embodiment, in two sub-chips, two pads directly connected to TSVs not facing each other on mutual upper surfaces are electrically connected to each other on chip surfaces. Consequently, it is possible to achieve the same effect as that in the first embodiment, and also to provide a structure in which assignment of a TSV to a signal or power is changed for each chip.

2-3. Modification Example of Second Embodiment

Next, a modification example of the second embodiment will be described. The modification example of the second embodiment is different from the second embodiment in terms of a core chip stacking method.

2-3-1. Configuration

2-3-1-1. Signal Path of Core Chip

Core chips of a core chip group are electrically connected to each other through signal paths in each core chip.

Figure 28:
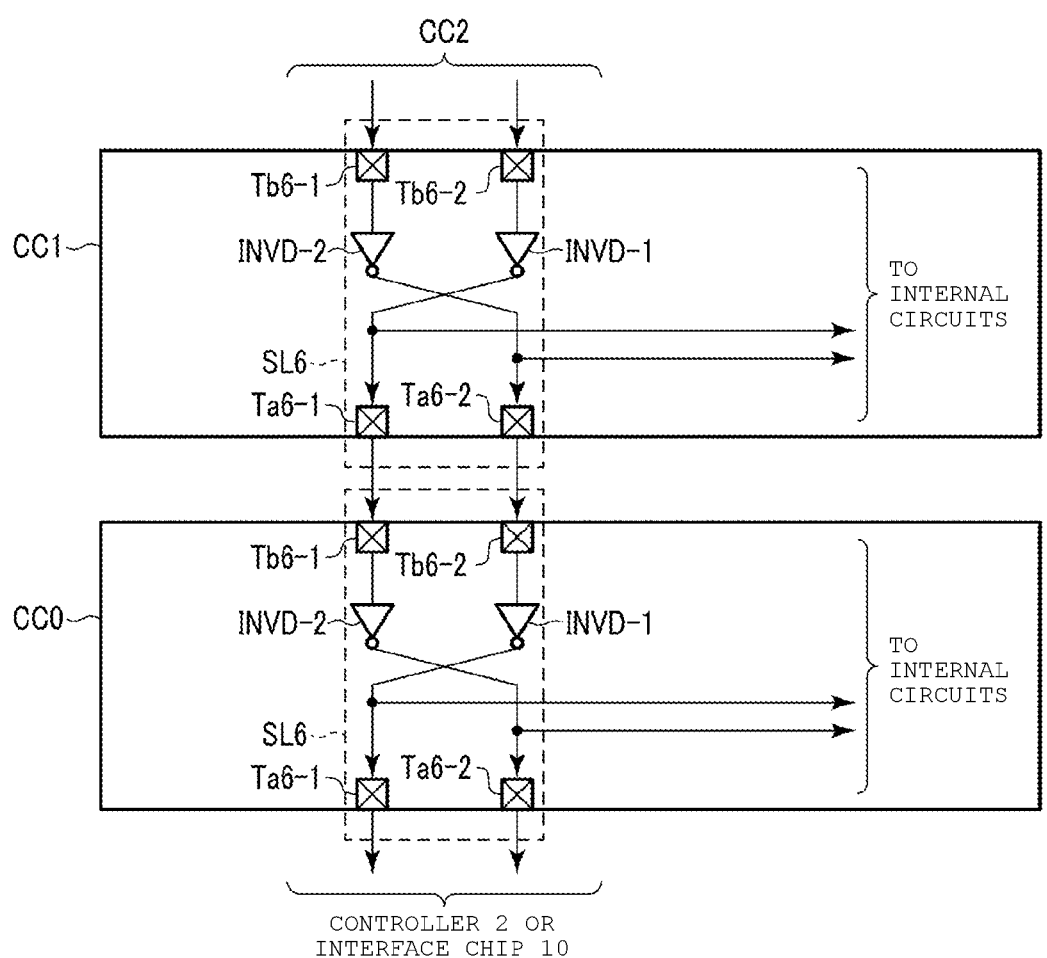
FIG. 28 is a circuit diagram illustrating signal paths of core chips of a semiconductor device according to a modification example of the second embodiment.

Therefore, with reference to FIG. 28, a description will be made of signal paths of core chips of a semiconductor device according to the modification example of the second embodiment. FIG. 28 is a circuit diagram illustrating signal paths of the core chips of the semiconductor device according to the modification example of the second embodiment.

As illustrated in FIG. 28, a signal path SL6 is provided in each of the core chips of the semiconductor device according to the modification example of the second embodiment.

The signal path SL6 includes terminals Ta6-1, Ta6-2, Tb6-1, and Tb6-2, a wiring layer which is provided in the core chip CC and connects the terminals Ta6-1 and Tb6-2 to each other, a wiring layer which is provided in the core chip CC and connects the terminals Ta6-2 and Tb6-1 to each other, an inverter INVD-1 which is provided on the wiring layer between terminals Ta6-1 and Tb6-2 and has an input end connected to the terminal Ta6-1 and an output end connected to the terminal Tb6-2, and an inverter INVD-2 which is provided on the wiring layer between terminals Ta6-2 and Tb6-1 and has an output end connected to the terminal Ta6-2 and an input end connected to the terminal Tb6-1. Assignment of contact of a single signal or power source can be changed by using the signal path SL6.

2-3-1-2. Configuration of Sub-Chip

Layouts of the sub-chips SC0 and SC1 are the same as those described in the first embodiment.

2-3-1-2-1. Section of Sub-Chip SC0

Figure 29:
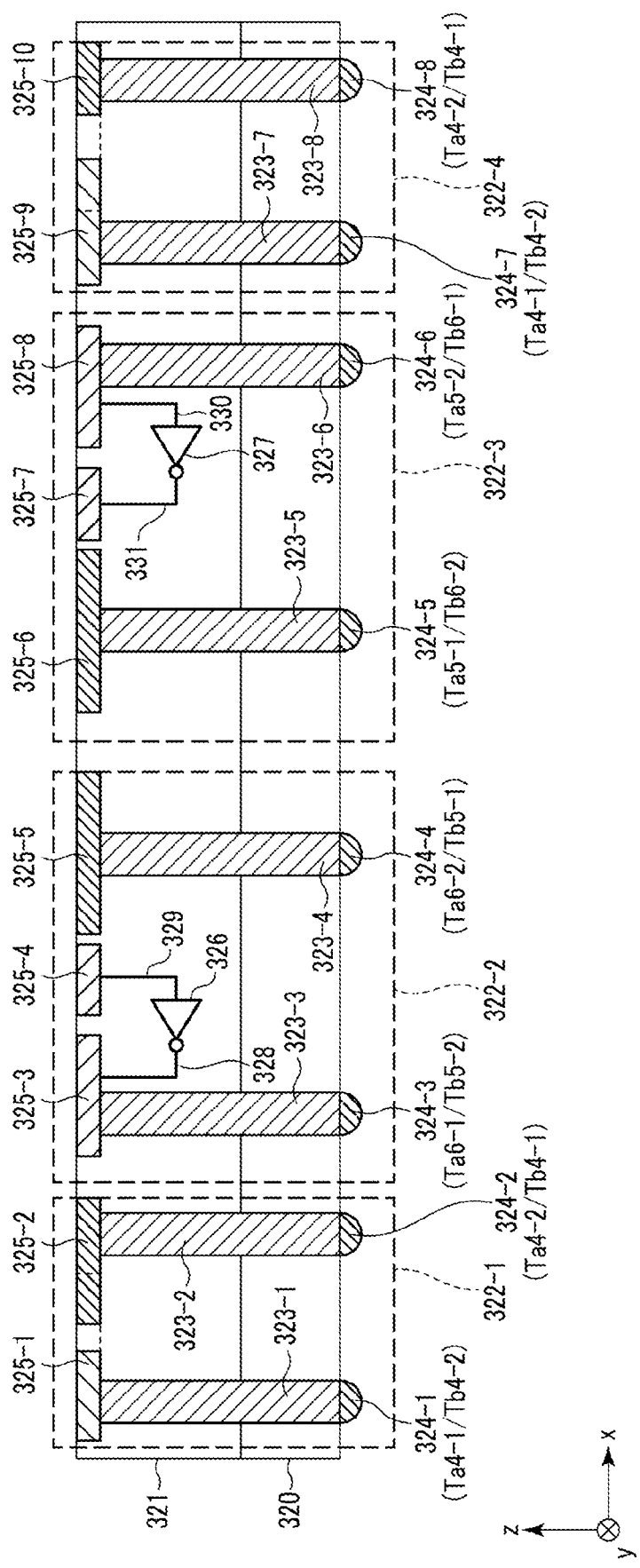
FIG. 29 is a sectional view illustrating an example of a wiring pattern of sub-chips of the semiconductor device according to the modification example of the second embodiment.

With reference to FIG. 29, a description will be made of an example of a wiring pattern of the sub-chip of the semiconductor device according to the modification example of the second embodiment. FIG. 29 is a sectional view illustrating an example of a wiring pattern of the sub-chip of the semiconductor device according to the modification example of the second embodiment. FIG. 29 illustrates a wiring pattern that makes up parts of the signal paths SL4 to SL6 as an example.

As illustrated in FIG. 29, an element layer 321 is provided on an upper surface of a semiconductor substrate 320. For simplification, FIG. 29 does not illustrate internal circuits other than the signal paths.

FIG. 29 illustrates a plurality of signal paths 322 (for example, 322-1, 322-2, 322-3, and 322-4).

The semiconductor substrate 320 and the element layer 321 are provided with a plurality of vias 323 (for example, 323-1, 323-2, 323-3, 323-4, 323-5, 323-6, 323-7, and 323-8) which are through silicon vias (TSVs). A plurality of bumps 324 (for example, 324-1, 324-2, 324-3, 324-4, 324-5, 324-6, 324-7, and 324-8) functioning as the terminals Ta4-1, Ta4-2, Ta5-1, Ta5-2, Ta6-1, and Ta6-2 are provided at portions to which the vias 323-1 to 323-8 are exposed on the lower surface of the semiconductor substrate 320. A plurality of pads 325 (for example, 325-1, 325-2, 325-3, 325-4, 325-5, 325-6, 325-7, 325-8, 325-9, and 325-10) are provided on an upper surface of the element layer 321. Upper surfaces of the pads 325 are exposed to the upper surface of the element layer 321. Logic element layers 326 and 327 including logic elements functioning as the inverter INVC or INVD, and wiring layers 328 to 331 are provided in the element layer 321.

The signal path 322-1 includes the bump 324-1 (Ta4-1 or Tb4-2), the via 323-1 connected to the bump 324-1, and the pad 325-1 connected to the via 323-1. In the pad 325-1, a region which is directly opposite the region connected to the via 323-1 and is exposed to the upper surface of the element layer 321 is a first region which is not directly connected to another chip. In the pad 325-1, for example, a region which extends from the first region which is not directly connected to another chip and is exposed to the upper surface of the element layer 321 is a second region (that is, an another-chip connection region) which is directly connected to another chip. Here, "another chip" indicates the sub-chip SC1.

The signal path 322-1 includes the bump 324-2 (Ta4-2 or Tb4-1), the via 323-2 connected to the bump 324-2, and the pad 325-2 connected to the via 323-2. In the pad 325-2, a region which is directly opposite the region connected to the via 323-2 and is exposed to the upper surface of the element layer 321 is a first region which is not directly connected to another chip. In the pad 325-2, for example, a region which extends from the first region which is not directly connected to another chip and is exposed to the upper surface of the element layer 321 is a second region (that is, an another-chip connection region) which is directly connected to another chip.

The signal path 322-2 includes the bump 324-3 (Ta6-1 or Tb5-2), the via 323-3 connected to the bump 324-3, the pad 325-3 connected to the via 323-3, the pad 325-4, the logic element layer 326, the wiring layer 328 connecting the pad 325-3 to the input end of the logic element layer 326, and the wiring layer 329 connecting the pad 325-4 to the output end of the logic element layer 326. The pad 325-3 is not directly connected to another chip. In other words, the pad 325-3 does not have an another-chip connection region. The pad 325-4 has an another-chip connection region which is directly connected to another chip.

The signal path 322-2 includes the bump 324-4 (Ta6-2 or Tb5-1), the via 323-4 connected to the bump 324-4, and the pad 325-5 connected to the via 323-4. In the pad 325-5, a region which is directly opposite the region connected to the via 323-4 and is exposed to the upper surface of the element layer 321 is a first region which is not directly connected to another chip. In the pad 325-5, for example, a region which extends in the x axis direction from the first region which is not directly connected to another chip and is exposed to the upper surface of the element layer 321 is a second region (that is, an another-chip connection region) which is directly connected to another chip.

The signal path 322-3 includes the bump 324-5 (Ta5-1 or Tb6-2), the via 323-5 connected to the bump 324-5, and the pad 325-6 connected to the via 323-5. In the pad 325-6, a region which is directly opposite the region connected to the via 323-5 and is exposed to the upper surface of the element layer 321 is a first region which is not directly connected to another chip. In the pad 325-6, for example, a region which extends in the x axis direction from the first region which is not directly connected to another chip and is exposed to the upper surface of the element layer 321 is a second region (that is, an another-chip connection region) which is directly connected to another chip.

The signal path 322-3 includes the bump 324-6 (Ta5-2 or Tb6-1), the via 323-6 connected to the bump 324-6, the pad 325-8 connected to the via 323-6, the pad 325-7, the logic element layer 327, the wiring layer 330 connecting the pad 325-8 to the input end of the logic element layer 327, and the wiring layer 331 connecting the pad 325-7 to the output end of the logic element layer 327. The pad 325-8 is not directly connected to another chip. In other words, the pad 325-8 does not have an another-chip connection region. The pad 325-7 has an another-chip connection region which is directly connected to another chip.

The signal path 322-4 includes the bump 324-7 (Ta4-1 or Tb4-2), the via 323-7 connected to the bump 324-7, and the pad 325-9 connected to the via 323-7. In the pad 325-9, a region which is directly opposite the region connected to the via 323-7 and is exposed to the upper surface of the element layer 321 is a first region which is not directly connected to another chip. In the pad 325-9, for example, a region which extends from the first region which is not directly connected to another chip and is exposed to the upper surface of the element layer 321 is a second region (that is, an another-chip connection region) which is directly connected to another chip.

The signal path 322-4 includes the bump 324-8 (Ta4-2 or Tb4-1), the via 323-8 connected to the bump 324-8, and the pad 325-10 connected to the via 323-8. In the pad 325-10, a region which is directly opposite the region connected to the via 323-8 and is exposed to the upper surface of the element layer 321 is a first region which is not directly connected to another chip. In the pad 325-10, for example, a region which extends from the first region which is not directly connected to another chip and is exposed to the upper surface of the element layer 321 is a second region (that is, an another-chip connection region) which is directly connected to another chip.

A lower surface of the sub-chip SC0 is to be stacked on a lower surface of another sub-chip SC0. Thus, vias of the sub-chip SC0 are designed in mirror-image symmetry with respect to the lower surface of another sub-chip SC0. In other words, in the sub-chip SC0, the vias are provided in mirror-image symmetry with respect to the center of the sub-chip SC0 in the x axis direction in the xz plane.

The wiring pattern of the sub-chip SC0 disposed as mentioned above is correlated with a symbol P9 illustrated in FIG. 29.

Although not illustrated here, each pad 325 or the wiring layers 328 to 331 may be connected to the internal circuits.

2-3-1-2-2. Upper Surface of Sub-Chip SC0

Figure 30:
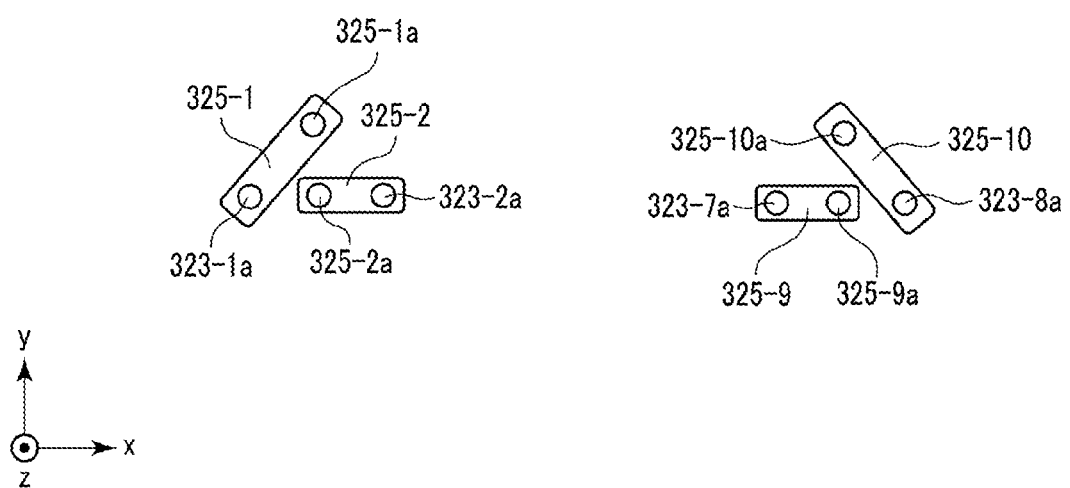
FIG. 30 is a top view illustrating an example of a wiring pattern of the sub-chips of the semiconductor device according to the modification example of the second embodiment.

With reference to FIG. 30, a description will be made of an example of a wiring pattern of the sub-chip of the semiconductor device according to the modification example of the second embodiment. FIG. 30 is a top view illustrating an example of a wiring pattern of the sub-chip of the semiconductor device according to the modification example of the second embodiment.

FIG. 30 illustrates a relationship between the pad 325-1 and the pad 325-2 in the xy plane, and a relationship between the pad 325-9 and the pad 325-10 in the xy plane.

As illustrated in FIG. 30, in the xy plane, the pad 325-1 has a rectangular shape. In the xy plane, the pad 325-2 has a rectangular shape. The pad 325-1 and the pad 325-2 are electrically isolated from each other.

The pad 325-1 is connected to the via 323-1 in a via connection region 323-1a. The pad 325-1 is connected to another chip through an another-chip connection region 325-1a.

The pad 325-2 is connected to the via 323-2 in a via connection region 323-2a. The pad 325-2 is connected to another chip through an another-chip connection region 325-2a.

The via connection region 323-1a, the via connection region 323-2a, and the another-chip connection region 325-2a are located on the same line along the x axis direction. The another-chip connection region 325-1a and the another-chip connection region 325-2a are located on the same line along the y axis direction.

As illustrated in FIG. 30, in the xy plane, the pad 325-9 has a rectangular shape. In the xy plane, the pad 325-10 has a rectangular shape. The pad 325-9 and the pad 325-10 are electrically isolated from each other.

The pad 325-9 is connected to the via 323-7 in a via connection region 323-7a. The pad 325-9 is connected to another chip through an another-chip connection region 325-9a.

The pad 325-10 is connected to the via 323-8 in a via connection region 323-8a. The pad 325-10 is connected to another chip through an another-chip connection region 325-10a.

The via connection region 323-7a, the via connection region 323-8a, and the another-chip connection region 325-9a are located on the same line along the x axis direction. The another-chip connection region 325-9a and the another-chip connection region 325-10a are located on the same line along the y axis direction.

The pattern of the pads 325 of the sub-chip SC0 disposed as mentioned above is correlated with a symbol Pa9 illustrated in FIG. 30.

2-3-1-2-3. Section of Sub-Chip SC1

Figure 31:
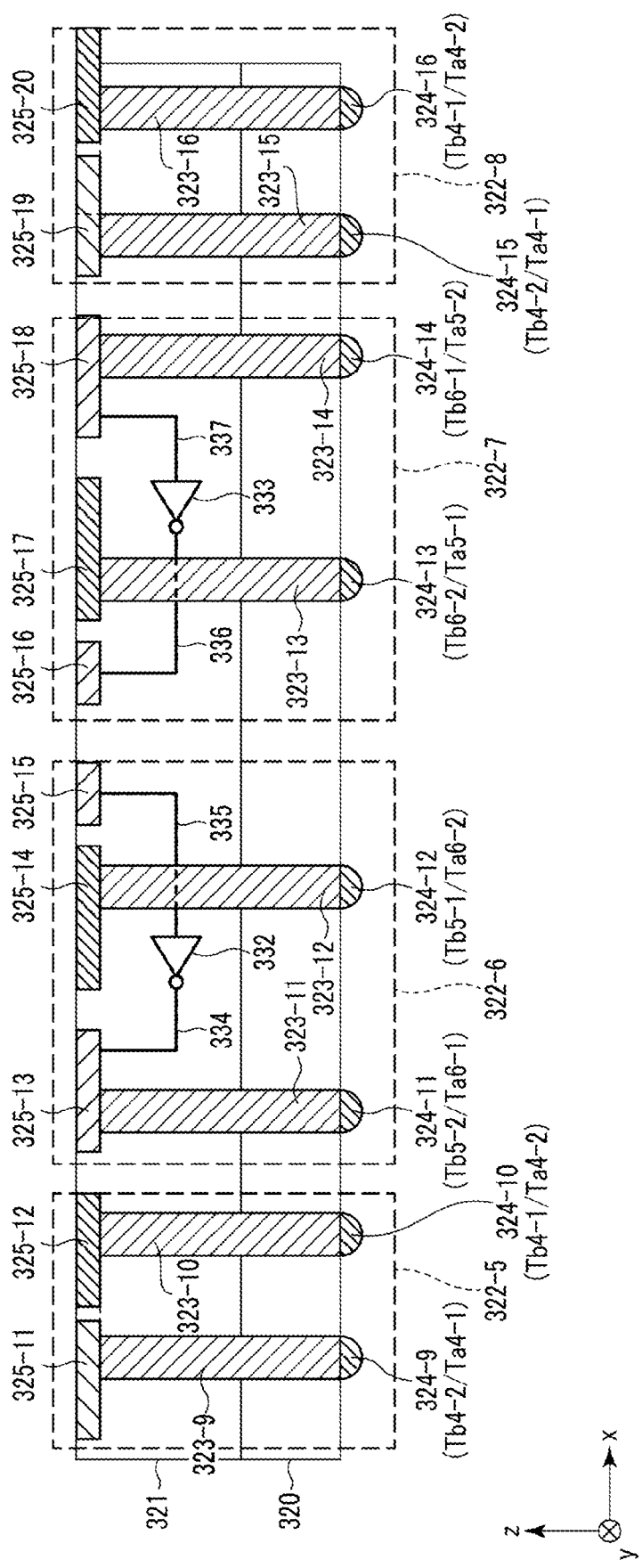
FIG. 31 is a sectional view illustrating an example of a wiring pattern of the sub-chips of the semiconductor device according to the modification example of the second embodiment.

With reference to FIG. 31, a description will be made of an example of a wiring pattern of the sub-chip of the semiconductor device according to the modification example of the second embodiment. FIG. 31 is a sectional view illustrating an example of a wiring pattern of the sub-chip of the semiconductor device according to the modification example of the second embodiment. FIG. 31 illustrates a wiring pattern that makes up parts of the signal paths SL4 to SL6 as an example.

As illustrated in FIG. 31, an element layer 321 is provided on an upper surface of a semiconductor substrate 320. For simplification, FIG. 31 does not illustrate internal circuits other than the signal paths.

FIG. 31 illustrates a plurality of signal paths 322 (for example, 322-5, 322-6, 322-7, and 322-8).

The semiconductor substrate 320 and the element layer 321 are provided with a plurality of vias 323 (for example, 323-9, 323-10, 323-11, 323-12, 323-13, 323-14, 323-15, and 323-16) which are through silicon vias (TSVs). A plurality of bumps 324 (for example, 324-9, 324-10, 324-11, 324-12, 324-13, 324-14, 324-15, and 324-16) functioning as the terminals Tb4-1, Tb4-2, Tb5-1, Tb5-2, Tb6-1, and Tb6-2 are provided at portions to which the vias 323-9 to 323-16 are exposed on the lower surface of the semiconductor substrate 320. A plurality of pads 325 (for example, 325-11, 325-12, 325-13, 325-14, 325-15, 325-16, 325-17, 325-18, 325-19, and 325-20) are provided on an upper surface of the element layer 321. Upper surfaces of the pads 325 are exposed to the upper surface of the element layer 321. Logic element layers 332 and 333 including logic elements functioning as the inverter INVC or INVD, and wiring layers 334 to 337 are provided in the element layer 321.

The signal path 322-5 includes the bump 324-9 (Tb4-2 or Ta4-1), the via 323-9 connected to the bump 324-9, and the pad 325-11 connected to the via 323-9. In the pad 325-11, a region which is directly opposite the region connected to the via 323-9 and is exposed to the upper surface of the element layer 321 is a first region which is not directly connected to another chip. In the pad 325-11, for example, a region which extends from the first region which is not directly connected to another chip and is exposed to the upper surface of the element layer 321 is a second region (that is, an another-chip connection region) which is directly connected to another chip. Here, "another chip" indicates the sub-chip SC0.

The signal path 322-5 includes the bump 324-10 (Tb4-1 or Ta4-2), the via 323-10 connected to the bump 324-10, and the pad 325-12 connected to the via 323-10. In the pad 325-12, a region which is directly opposite the region connected to the via 323-10 and is exposed to the upper surface of the element layer 321 is a first region which is not directly connected to another chip. In the pad 325-12, for example, a region which extends from the first region which is not directly connected to another chip and is exposed to the upper surface of the element layer 321 is a second region (that is, an another-chip connection region) which is directly connected to another chip.

The signal path 322-6 includes the bump 324-11 (Tb5-2 or Ta6-1), the via 323-11 connected to the bump 324-11, the pad 325-13 connected to the via 323-11, the pad 325-15, the logic element layer 332, the wiring layer 334 connecting the pad 325-13 to the output end of the logic element layer 332, and the wiring layer 335 connecting the pad 325-15 to the input end of the logic element layer 332. The pad 325-13 is not directly connected to another chip. In other words, the pad 325-13 does not have an another-chip connection region. The pad 325-15 has an another-chip connection region which is directly connected to another chip.

The signal path 322-6 includes the bump 324-12 (Tb5-1 or Ta6-2), the via 323-12 connected to the bump 324-12, and the pad 325-14 connected to the via 323-12. In the pad 325-14, a region which is directly opposite the region connected to the via 323-12 and is exposed to the upper surface of the element layer 321 is a first region which is not directly connected to another chip. In the pad 325-14, for example, a region which extends in the x axis direction from the first region which is not directly connected to another chip and is exposed to the upper surface of the element layer 321 is a second region (that is, an another-chip connection region) which is directly connected to another chip.

The pad 325-14 is located to be interposed between the pad 325-13 and the pad 325-15 in the x axis direction.

The wiring layer 335 is not electrically connected to the via 323-12.

The signal path 322-7 includes the bump 324-13 (Tb6-2 or Ta5-1), the via 323-13 connected to the bump 324-13, and the pad 325-17 connected to the via 323-13. In the pad 325-17, a region which is directly opposite the region connected to the via 323-13 and is exposed to the upper surface of the element layer 321 is a first region which is not directly connected to another chip. In the pad 325-17, for example, a region which extends in the x axis direction from the first region which is not directly connected to another chip and is exposed to the upper surface of the element layer 321 is a second region (that is, an another-chip connection region) which is directly connected to another chip.

The signal path 322-7 includes the bump 324-14 (Tb6-1 or Ta5-2), the via 323-14 connected to the bump 324-14, the pad 325-18 connected to the via 323-14, the pad 325-16, the logic element layer 333, the wiring layer 337 connecting the pad 325-18 to the input end of the logic element layer 333, and the wiring layer 336 connecting the pad 325-16 to the output end of the logic element layer 333. The pad 325-18 is not directly connected to another chip. In other words, the pad 325-18 does not have an another-chip connection region. The pad 325-16 has an another-chip connection region which is directly connected to another chip.

The pad 325-17 is located to be interposed between the pad 325-16 and the pad 325-18 in the x axis direction.

The wiring layer 336 is not electrically connected to the via 323-13.

The signal path 322-8 includes the bump 324-15 (Tb4-2 or Ta4-1), the via 323-15 connected to the bump 324-15, and the pad 325-19 connected to the via 323-15. In the pad 325-19, a region which is directly opposite the region connected to the via 323-15 and is exposed to the upper surface of the element layer 321 is a first region which is not directly connected to another chip. In the pad 325-19, for example, a region which extends from the first region which is not directly connected to another chip and is exposed to the upper surface of the element layer 321 is a second region (that is, an another-chip connection region) which is directly connected to another chip.

The signal path 322-8 includes the bump 324-16 (Tb4-1 or Ta4-2), the via 323-16 connected to the bump 324-16, and the pad 325-20 connected to the via 323-16. In the pad 325-20, a region which is directly opposite the region connected to the via 323-16 and is exposed to the upper surface of the element layer 321 is a first region which is not directly connected to another chip. In the pad 325-20, for example, a region which extends from the first region which is not directly connected to another chip and is exposed to the upper surface of the element layer 321 is a second region (that is, an another-chip connection region) which is directly connected to another chip.

A lower surface of the sub-chip SC1 is to be stacked on a lower surface of another sub-chip SC1. Thus, vias of the sub-chip SC1 are designed in mirror-image symmetry with respect to the lower surface of another sub-chip SC1. In other words, in the sub-chip SC1, the vias are provided in mirror-image symmetry with respect to the center of the sub-chip SC1 in the x axis direction in the xz plane.

The wiring pattern of the sub-chip SC1 disposed as mentioned above is correlated with a symbol P10 illustrated in FIG. 31.

Although not illustrated here, each pad 325 or the wiring layers 334 to 337 may be connected to the internal circuits.

2-3-1-2-4. Upper Surface of Sub-Chip SC1

With reference to FIG. 32, a description will be made of an example of a wiring pattern of the sub-chip of the semiconductor device according to the modification example of the second embodiment. FIG. 32 is a top view illustrating an example of a wiring pattern of the sub-chip of the semiconductor device according to the modification example of the second embodiment.

FIG. 32 illustrates a relationship between the pad 325-11 and the pad 325-12 in the xy plane, and a relationship between the pad 325-19 and the pad 325-20 in the xy plane.

As illustrated in FIG. 32, in the xy plane, the pad 325-11 has a rectangular shape. In the xy plane, the pad 325-12 has a rectangular shape. The pad 325-11 and the pad 325-12 are electrically isolated from each other.

The pad 325-11 is connected to the via 323-9 in a via connection region 323-9a. The pad 325-11 is connected to another chip through an another-chip connection region 325-11a.

The pad 325-12 is connected to the via 323-10 in a via connection region 323-10a. The pad 325-12 is connected to another chip through an another-chip connection region 325-12a.

The via connection region 323-10a and the another-chip connection region 325-12a are located on the same line along the x axis direction. The another-chip connection region 325-11a and the another-chip connection region 325-12a are at positions shifted in the y axis direction.

As illustrated in FIG. 32, in the xy plane, the pad 325-19 has a rectangular shape. In the xy plane, the pad 325-20 has a rectangular shape. The pad 325-19 and the pad 325-20 are electrically isolated from each other.

The pad 325-19 is connected to the via 323-15 in a via connection region 323-15a. The pad 325-19 is connected to another chip through an another-chip connection region 325-19a.

The pad 325-20 is connected to the via 323-16 in a via connection region 323-16a. The pad 325-20 is connected to another chip through an another-chip connection region 325-20a.

The via connection region 323-15a and the another-chip connection region 325-19a are located on the same line along the x axis direction. The another-chip connection region 325-19a and the another-chip connection region 325-20a are at positions shifted in the y axis direction.

The pattern of the pads 325 of the sub-chip SC1 disposed as mentioned above is correlated with a symbol Pa10 illustrated in FIG. 32.

2-3-1-3. Stacking Structure

Figure 33:
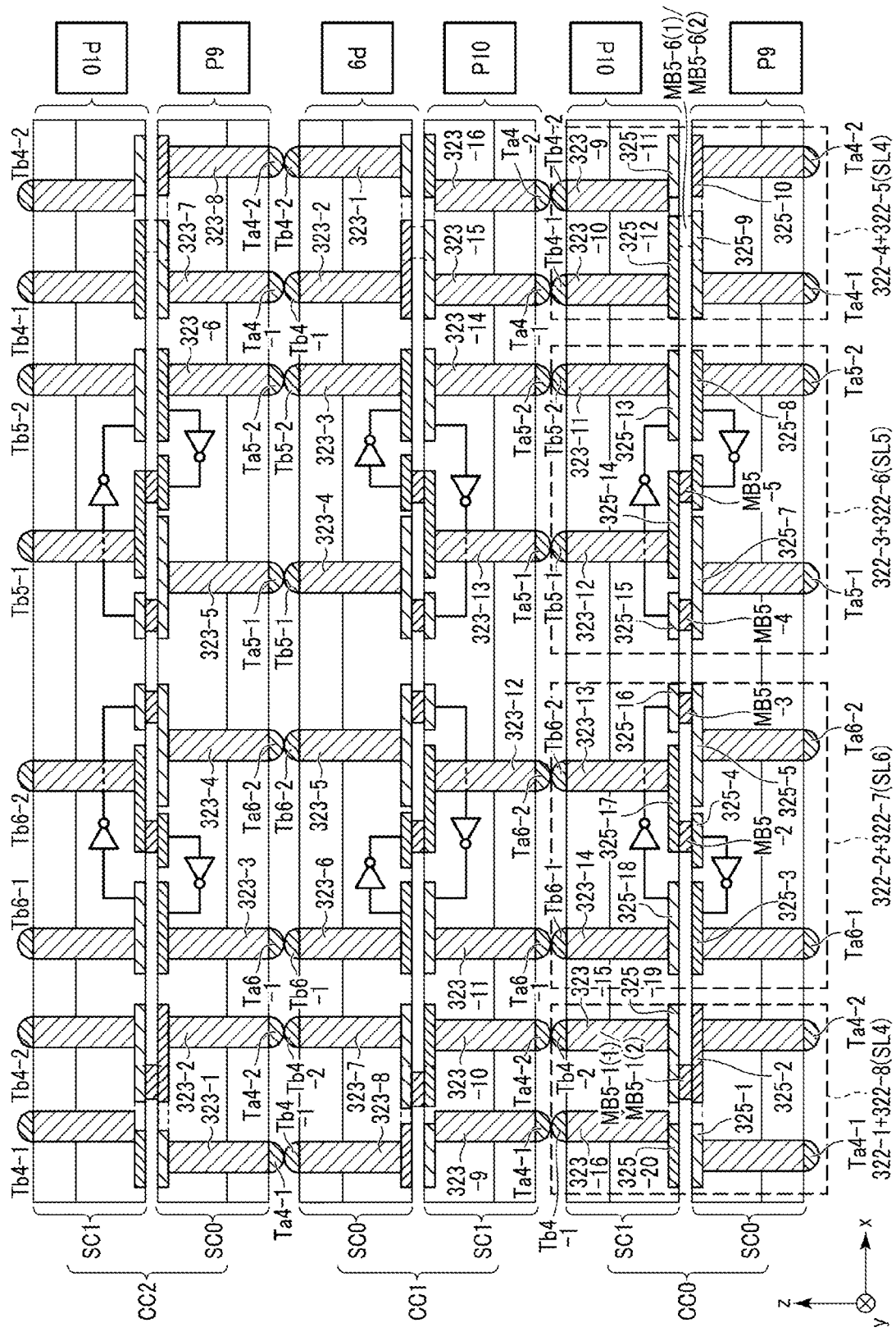
FIG. 33 is a sectional view illustrating a stacking structure of a core chip group of the semiconductor device according to the modification example of the second embodiment.

Next, with reference to FIG. 33, a description will be made of a stacking structure of the core chip group of the semiconductor device according to the modification example of the second embodiment. FIG. 33 is a sectional view illustrating a stacking structure of the core chip group of the semiconductor device according to the modification example of the second embodiment. FIG. 33 illustrates a structure in which three pairs of the sub-chips SC0 and SC1 illustrated in FIGS. 29 to 32 are stacked.

As illustrated in FIG. 33, the upper surface of the sub-chip SC0 is stacked on the upper surface of the sub-chip SC1. A position of each of the pads 225 having another-chip connection regions of the sub-chip SC0 matches a position of each of the pads 225 having another-chip connection regions of the sub-chip SC1. Specifically, positions of the pads 325-1, 325-2, and 325-4 to 325-7, 325-9, and 325-10 of the sub-chip SC0 respectively match positions of the pads 325-19, 325-20, 325-17, 325-16, 325-15, 325-14, 325-11, and 325-12 of the sub-chip SC1.

The lower surface of the sub-chip SC0 is stacked on the lower surface of another sub-chip SC0. Positions of the vias 323 of the sub-chip SC0 and positions of the vias 323 of another sub-chip SC0 are designed in mirror-image symmetry with respect to a plane where upper surfaces thereof face each other. Thus, positions of the vias 323-1 to 323-8 of the sub-chip SC0 respectively match positions of the vias 323-8 to 323-1 of another sub-chip SC0.

The lower surface of the sub-chip SC1 is stacked on the lower surface of another sub-chip SC1. Positions of the vias 323 of the sub-chip SC1 and positions of the vias 323 of another sub-chip SC1 are designed in mirror-image symmetry with respect to a plane where upper surfaces thereof face each other. Thus, positions of the vias 323-9 to 323-16 of the sub-chip SC1 respectively match positions of the vias 323-16 to 323-9 of another sub-chip SC1.

The signal path 322-1 of the sub-chip SC0 and the signal path 322-8 of the sub-chip SC1 are electrically connected to each other through a micro-bump MB5-1(1) provided between the pad 325-1 and the pad 325-19, and are electrically connected to each other through a micro-bump MB5-2(2) provided between the pad 325-2 and the pad 325-20, and thus form the signal path SL4 for performing communication with each internal circuit.

As mentioned above, in the signal path 322-1 of the sub-chip SC0 and the signal path 322-8 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 322-1 and the signal path 322-8, the signal path SL4 is provided by using shapes of the pads.

Figure 34:
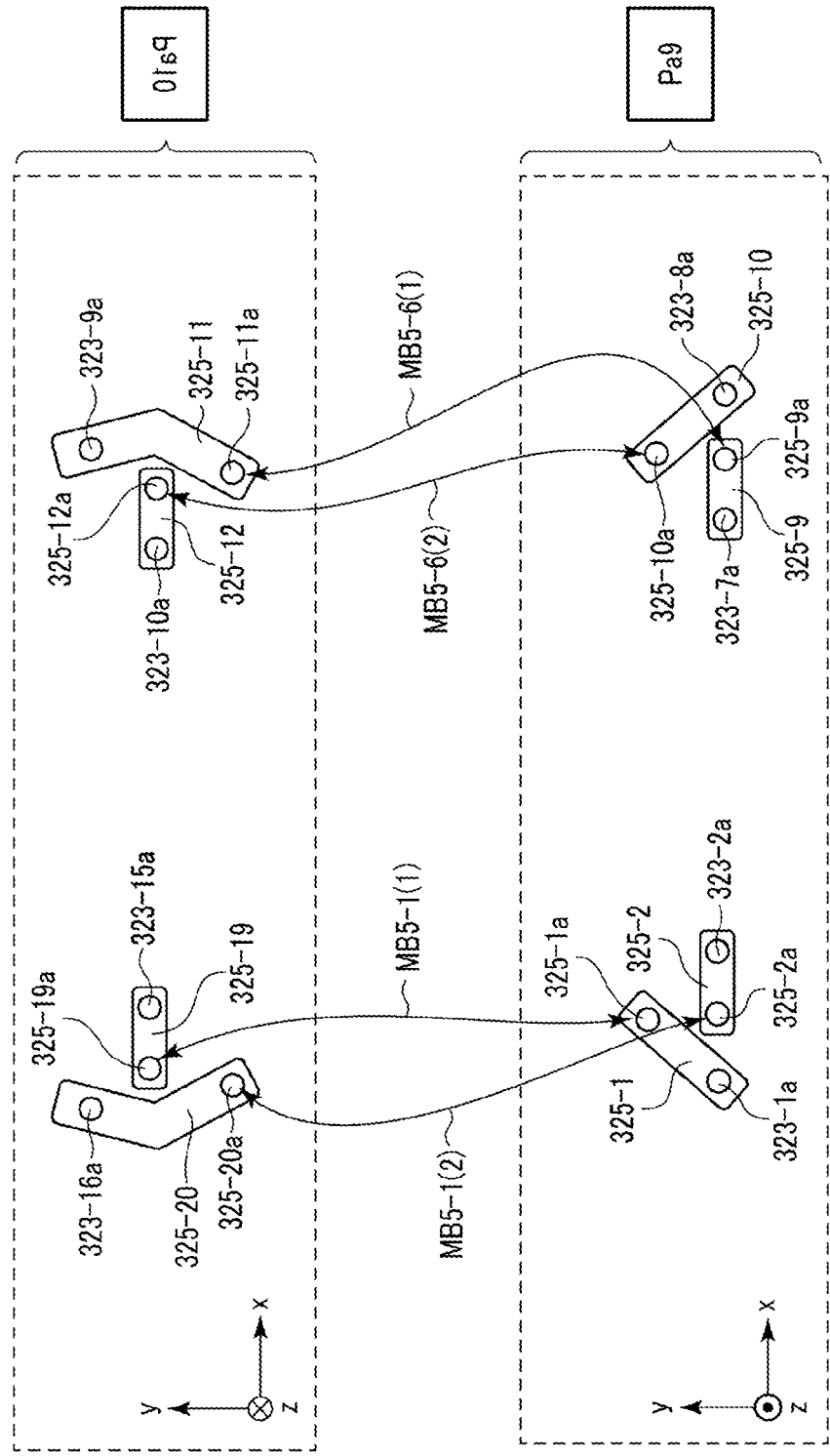
FIG. 34 is a diagram illustrating a relationship between pads of the two sub-chips of the semiconductor device according to the modification example of the second embodiment before they are stacked.

Here, with reference to FIG. 34, a description will be made of a connection method for the pads 325-1 and 325-19 and a connection method for the pads 325-2 and 325-20. FIG. 34 is a diagram illustrating a relationship between pads of the two sub-chips of the semiconductor device according to the modification example of the second embodiment before they are stacked. FIG. 34 is a diagram illustrating an xy plane of the pads 325-1 and 325-2 and an xy plane of the pads 325-19 and 325-20 before the sub-chips are stacked.

As illustrated in FIG. 34, the sub-chip SC0 and the sub-chip SC1 are stacked back to back. Thus, in FIG. 34, the pattern of the pads 325-19 and 325-20 of the sub-chip SC1 is illustrated in a state in which the pattern illustrated in FIG. 32 is horizontally rotated by 180 degrees.

The connection region 325-19a of the pad 325-19 is located over the connection region 325-1a of the pad 325-1 in the z axis direction. The connection region 325-1a of the pad 325-1 is connected to the connection region 325-19a of the pad 325-19 through the micro-bump MB5-1(1).

The connection region 325-20a of the pad 325-20 is located over the connection region 325-2a of the pad 325-2 in the z axis direction. The connection region 325-2a of the pad 325-2 is connected to the connection region 325-20a of the pad 325-20 through the micro-bump MB5-1(2).

In other words, in the two sub-chips, two pads directly connected to TSVs not facing each other on the mutual upper surfaces are electrically connected to each other indirectly.

Next, with reference to FIG. 33 again, a description will be made of another signal path. The signal path 322-2 of the sub-chip SC0 and the signal path 322-7 of the sub-chip SC1 are electrically connected to each other through a micro-bump MB5-2 provided between the pad 325-4 and the pad 325-17, and are electrically connected to each other through a micro-bump MB5-3 provided between the pad 325-5 and the pad 325-15, and thus form the signal path SL6 for performing communication with each internal circuit.

As mentioned above, in the signal path 322-2 of the sub-chip SC0 and the signal path 322-7 of the sub-chip SC1, a signal path is bypassed such that pads directly connected to TSVs are not connected to each other by deviating positions of the TSVs between sub-chips. Thus, it is possible to insert a logic element layer and also to change assignment of a terminal to which a signal or power is input for each chip.

The signal path 322-3 of the sub-chip SC0 and the signal path 322-6 of the sub-chip SC1 are electrically connected to each other through a micro-bump MB5-4 provided between the pad 325-6 and the pad 325-15, and are electrically connected to each other through a micro-bump MB5-5 provided between the pad 325-7 and the pad 325-14, and thus form the signal path SL5 for performing communication with each internal circuit.

As mentioned above, in the signal path 322-3 of the sub-chip SC0 and the signal path 322-6 of the sub-chip SC1, a signal path is bypassed such that pads directly connected to TSVs are not connected to each other by deviating positions of the TSVs between sub-chips. Thus, it is possible to insert a logic element layer and also to change assignment of a terminal to which a signal or power is input for each chip.

The signal path 322-4 of the sub-chip SC0 and the signal path 322-5 of the sub-chip SC1 are electrically connected to each other through a micro-bump MB5-6(1) provided between the pad 325-9 and the pad 325-11, and are electrically connected to each other through a micro-bump MB5-6(2) provided between the pad 325-10 and the pad 325-12, and thus form the signal path SL4 for performing communication with each internal circuit.

As mentioned above, in the signal path 322-4 of the sub-chip SC0 and the signal path 322-5 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 322-4 and the signal path 322-5, the signal path SL4 is provided by using shapes of the pads.

Here, with reference to FIG. 34, a description will be made of a connection method for the pads 325-9 and 325-11 and a connection method for the pads 325-10 and 325-12. FIG. 34 is a diagram illustrating an xy plane of the pads 325-9 and 325-10 and an xy plane of the pads 325-11 and 325-12 before the sub-chips are stacked.

As illustrated in FIG. 34, the sub-chip SC0 and the sub-chip SC1 are stacked back to back. Thus, in FIG. 34, the pattern of the pads 325-11 and 325-12 of the sub-chip SC1 is illustrated in a state in which the pattern illustrated in FIG. 32 is horizontally rotated by 180 degrees.

The connection region 325-11a of the pad 325-11 is located over the connection region 325-9a of the pad 325-9 in the z axis direction. The connection region 325-9a of the pad 325-9 is connected to the connection region 325-11a of the pad 325-11 through the micro-bump MB5-6(1).

The connection region 325-12a of the pad 325-12 is located over the connection region 325-10a of the pad 325-10 in the z axis direction. The connection region 325-10a of the pad 325-10 is connected to the connection region 325-12a of the pad 325-12 through the micro-bump MB5-6(2).

In other words, in the two sub-chips, two pads directly connected to TSVs not facing each other on the mutual upper surfaces are electrically connected to each other indirectly.

2-3-1-4. Flow of Signal or Power

Figure 35:
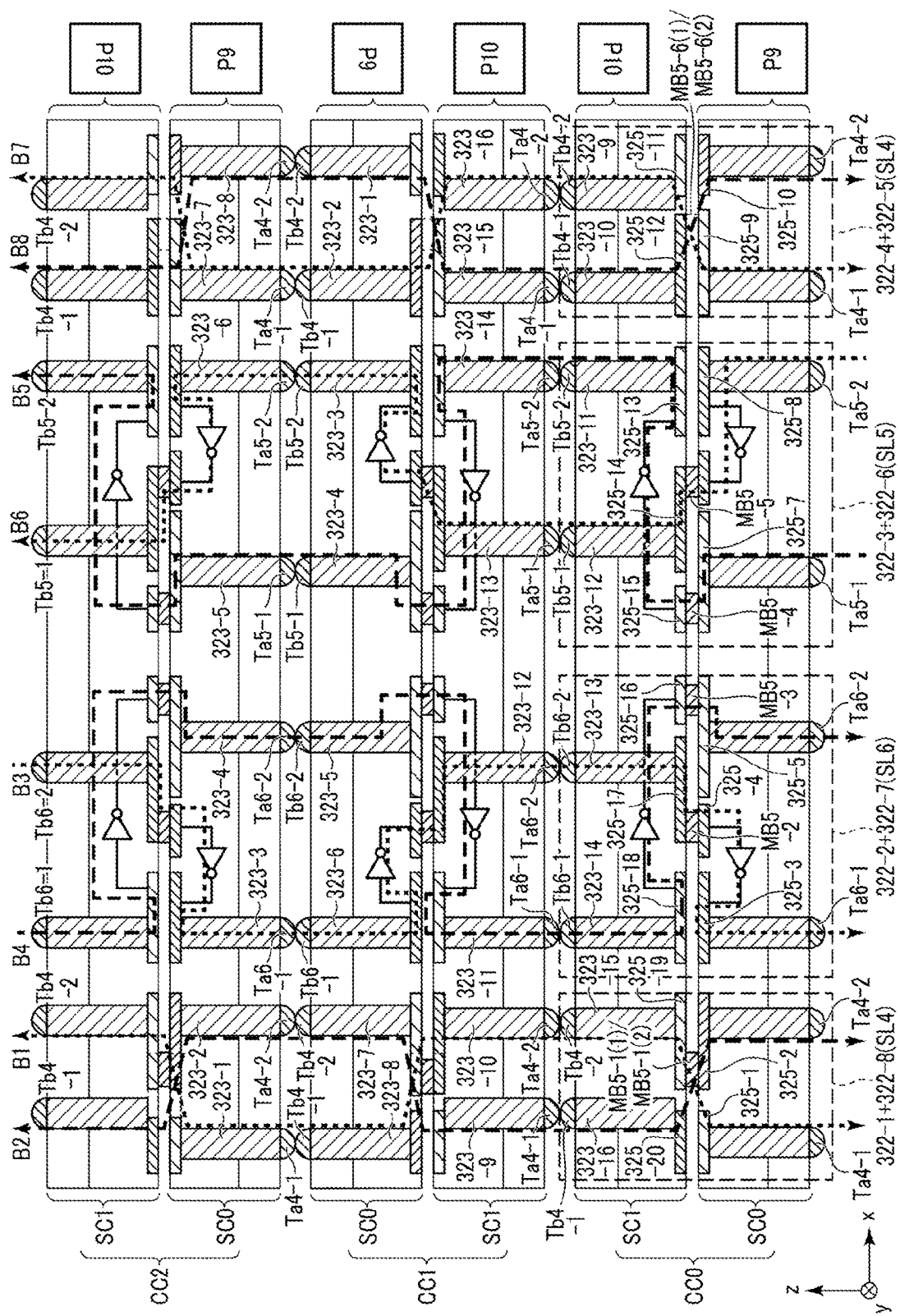
FIG. 35 is a sectional view illustrating a flow of a signal or power in the stacking structure of the core chip group of the semiconductor device according to the modification example of the second embodiment.

Here, with reference to FIG. 35, a description will be made of a flow of a signal or power. FIG. 35 is a sectional view illustrating a flow of a signal or power in the stacking structure of the core chip group of the semiconductor device according to the second embodiment. Herein, for simplification, terminals (bumps) and vias through which a signal or power flows will be focused on.

First, a description will be made of a path including the signal paths 322-1 and 322-8 by referring to arrows B1 and B2. A signal or power which is input to the terminal Ta4-1 of the core chip CC0 is output from the terminal Tb4-2 through the via 323-1 and the via 323-15. A signal or power which is input to the terminal Ta4-1 of the core chip CC1 is output from the terminal Tb4-2 through the via 323-9 and the via 323-7. A signal or power which is input to the terminal Tb4-2 of the core chip CC0 is output from the terminal Ta4-1 through the via 323-15 and the via 323-1. A signal or power which is input to the terminal Tb4-2 of the core chip CC1 is output from the terminal Ta4-1 through the via 323-7 and the via 323-9. A signal or power which is input to the terminal Ta4-2 of the core chip CC0 is output from the terminal Tb4-1 through the via 323-2 and the via 323-16. A signal or power which is input to the terminal Ta4-2 of the core chip CC1 is output from the terminal Tb4-1 through the via 323-10 and the via 323-8. A signal or power which is input to the terminal Tb4-1 of the core chip CC0 is output from the terminal Ta4-2 through the via 323-16 and the via 323-2. A signal or power which is input to the terminal Tb4-1 of the core chip CC1 is output from the terminal Ta4-2 through the via 323-8 and the via 323-10. As mentioned above, in the present embodiment, it is possible to provide the signal path SL4 in which a terminal to which a signal or power is input is changed for each chip.

Next, a description will be made of a path including the signal paths 322-2 and 322-7 by referring to arrows B3 and B4. A signal or power which is input to the terminal Tb6-1 of the core chip CC0 is output from the terminal Ta6-2 through the via 323-14 and the via 323-4. A signal or power which is input to the terminal Tb6-1 of the core chip CC1 is output from the terminal Ta6-2 through the via 323-6 and the via 323-12. A signal or power which is input to the terminal Tb6-2 of the core chip CC0 is output from the terminal Ta6-1 through the via 323-13 and the via 323-3. A signal or power which is input to the terminal Tb6-2 of the core chip CC1 is output from the terminal Ta6-1 through the via 323-5 and the via 323-11. As mentioned above, in the present embodiment, it is possible to provide the signal path SL6 in which a TSV to which a signal or power is input is changed for each chip.

A description will be made of a path including the signal paths 322-3 and 322-6 by referring to arrows B5 and B6. A signal or power which is input to the terminal Ta5-1 of the core chip CC0 is output from the terminal Tb5-2 through the via 323-5 and the via 323-11. A signal or power which is input to the terminal Ta5-1 of the core chip CC1 is output from the terminal Tb5-2 through the via 323-13 and the via 323-3. A signal or power which is input to the terminal Ta5-2 of the core chip CC0 is output from the terminal Tb5-1 through the via 323-6 and the via 323-12. A signal or power which is input to the terminal Ta5-2 of the core chip CC1 is output from the terminal Tb5-1 through the via 323-14 and the via 323-4. As mentioned above, in the present embodiment, it is possible to provide the signal path SL5 in which a terminal to which a signal or power is input is changed for each chip.

A description will be made of a path including the signal paths 322-4 and 322-5 by referring to arrows B7 and B8. A signal or power which is input to the terminal Ta4-1 of the core chip CC0 is output from the terminal Tb4-2 through the via 323-7 and the via 323-9. A signal or power which is input to the terminal Ta4-1 of the core chip CC1 is output from the terminal Tb4-2 through the via 323-15 and the via 323-1. A signal or power which is input to the terminal Tb4-2 of the core chip CC0 is output from the terminal Ta4-1 through the via 323-9 and the via 323-7. A signal or power which is input to the terminal Tb4-2 of the core chip CC1 is output from the terminal Ta4-1 through the via 323-1 and the via 323-15. A signal or power which is input to the terminal Ta4-2 of the core chip CC0 is output from the terminal Tb4-1 through the via 323-8 and the via 323-10. A signal or power which is input to the terminal Ta4-2 of the core chip CC1 is output from the terminal Tb4-1 through the via 323-16 and the via 323-2. A signal or power which is input to the terminal Tb4-1 of the core chip CC0 is output from the terminal Ta4-2 through the via 323-10 and the via 323-8. A signal or power which is input to the terminal Tb4-1 of the core chip CC1 is output from the terminal Ta4-2 through the via 323-1 and the via 323-16. As mentioned above, in the present embodiment, it is possible to provide the signal path SL4 in which a terminal to which a signal or power is input is changed for each chip.

2-3-2. Effects

According to the modification example, it is possible to achieve the same effects as those in the second embodiment, and Modification Example 1 and Modification Example 2 of the first embodiment.

3. Third Embodiment

Next, a description will be made of a semiconductor device according to a third embodiment. The semiconductor device according to the third embodiment includes a wiring pattern for changing assignment of a TSV between chips. Hereinafter, the same element as that in the first embodiment is given the same reference numeral, and a description thereof will be omitted, except that contents which are different from those in the first embodiment will be described.

3-1. Configuration 3-1-1. Signal Path in Core Chip

Core chips of a core chip group are electrically connected to each other through signal paths in each core chip.

Figure 36:
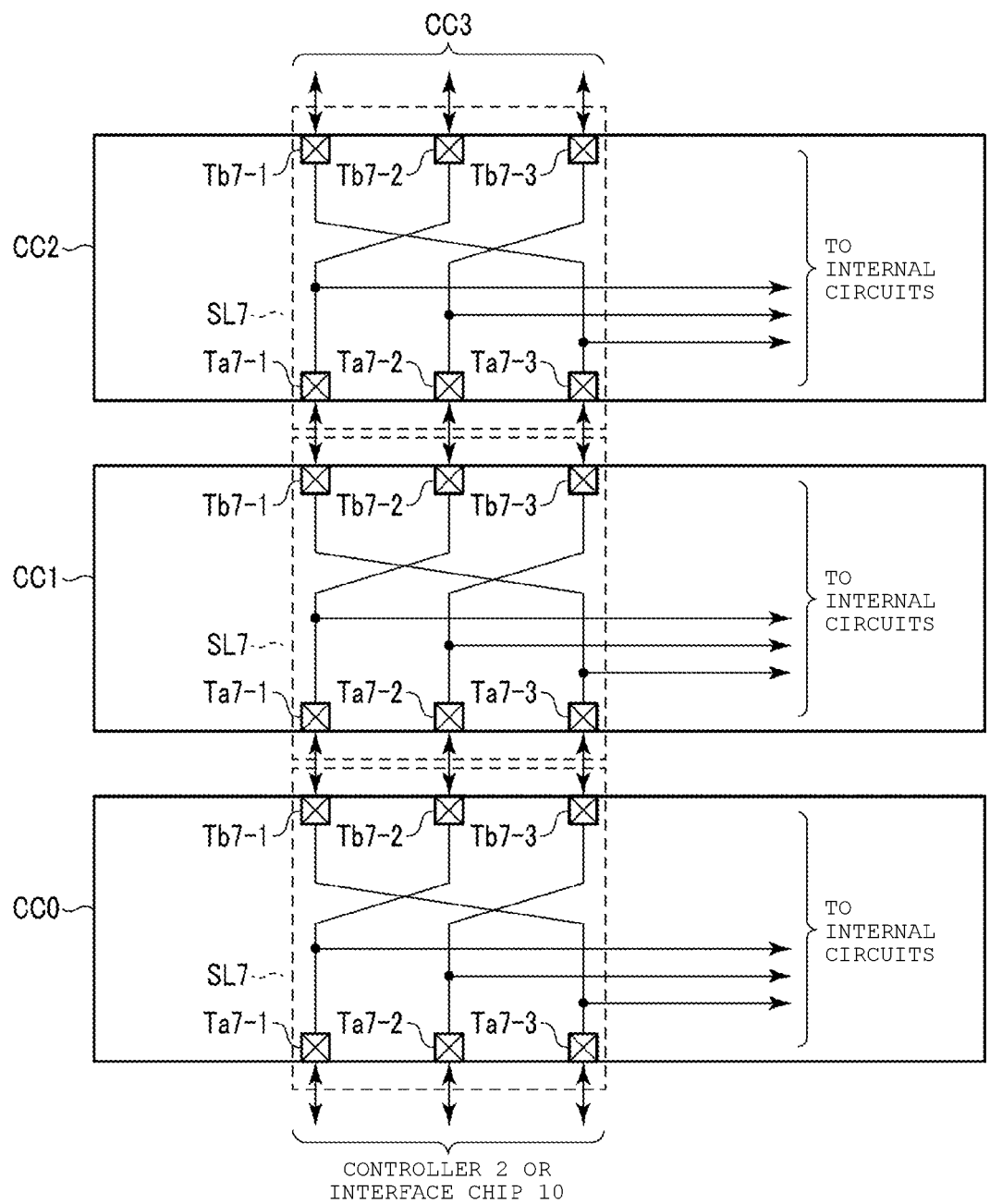
FIG. 36 is a circuit diagram illustrating signal paths of core chips of a semiconductor device according to a third embodiment.

Therefore, with reference to FIG. 36, a description will be made of signal paths of the core chips of the semiconductor device according to the third embodiment. FIG. 36 is a circuit diagram illustrating signal paths of the core chips of the semiconductor device according to the third embodiment.

As illustrated in FIG. 36, a signal path SL7 is provided in each of the core chips of the semiconductor device according to the third embodiment.

The signal path SL7 includes terminals Ta1-1, Ta1-2, Ta1-3, Tb7-1, Tb7-2, and Tb7-3, a wiring layer which is provided in a core chip CC and connects the terminals Ta7-1 and Tb7-2 to each other, a wiring layer which is provided in the core chip CC and connects the terminals Ta1-2 and Tb7-3 to each other, and a wiring layer which is provided in the core chip CC and connects the terminals Ta1-3 and Tb7-1 to each other. Assignment of a terminal to which a signal or power is input can be changed for each chip by using the signal path SL7.

For example, in a core chip CC0, a signal which is input from the terminal Ta1-1 is output from the terminal Tb7-2, and is input to the terminal Ta1-2 of the core chip CC1. In the core chip CC0, a signal which is input from the terminal Ta1-2 is output from the terminal Tb7-3, and is input to the terminal Ta1-3 of the core chip CC1. In the core chip CC0, a signal which is input from the terminal Ta1-3 is output from the terminal Tb7-1, and is input to the terminal Ta1-1 of the core chip CC1. As mentioned above, in the signal path SL7, an input destination (terminal) of a signal is changed.

3-1-2. Configuration of Sub-Chip

Layouts of the sub-chips SC0 and SC1 are the same as those described in the first embodiment.

3-1-2-1. Section of Sub-Chip SC0

Figure 37:
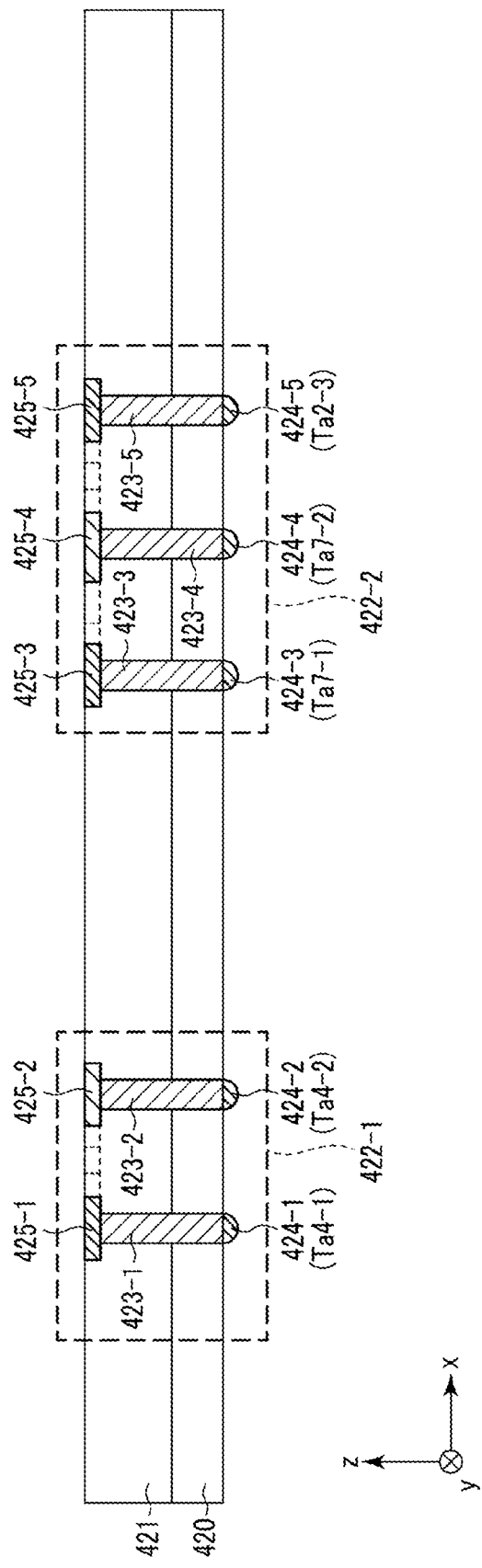
FIG. 37 is a sectional view illustrating an example of a wiring pattern of sub-chips of the semiconductor device according to the third embodiment.

With reference to FIG. 37, a description will be made of an example of a wiring pattern of the sub-chip of the semiconductor device according to the third embodiment. FIG. 37 is a sectional view illustrating an example of a wiring pattern of the sub-chip of the semiconductor device according to the third embodiment. FIG. 37 illustrates a wiring pattern that makes up parts of the signal paths SL4 and SL7 as an example.

As illustrated in FIG. 37, an element layer 421 is provided on an upper surface of a semiconductor substrate 420. For simplification, FIG. 37 does not illustrate internal circuits other than the signal paths.

FIG. 37 illustrates a plurality of signal paths 422 (for example, 422-1 and 422-2).

The semiconductor substrate 420 and the element layer 421 are provided with a plurality of vias 423 (for example, 423-1, 423-2, 423-3, 423-4, and 423-5) which are through silicon vias (TSVs). A plurality of bumps 424 (for example, 424-1, 424-2, 424-3, 424-4, and 424-5) functioning as the terminals Ta4-1, Ta4-2, Ta1-1, Ta1-2, and Ta1-3 are provided at portions to which the vias 423-1 to 423-5 are exposed on the lower surface of the semiconductor substrate 420. A plurality of pads 425 (for example, 425-1, 425-2, 425-3, 425-4, and 425-5) are provided on an upper surface of the element layer 421. Upper surfaces of the pads 425 are exposed to the upper surface of the element layer 421.

The signal path 422-1 includes the bump 424-1 (Ta4-1), the via 423-1 connected to the bump 424-1, and the pad 425-1 connected to the via 423-1. In the pad 425-1, a region which is directly opposite the region connected to the via 423-1 and is exposed to the upper surface of the element layer 421 is a first region which is not directly connected to another chip. In the pad 425-1, for example, a region which extends from the first region which is not directly connected to another chip and is exposed to the upper surface of the element layer 421 is a second region (also referred to as an another-chip connection region) which is directly connected to another chip.

Here, "another chip" indicates the sub-chip SC1.

The signal path 422-1 includes the bump 424-2 (Ta4-2), the via 423-2 connected to the bump 424-2, and the pad 425-2 connected to the via 423-2. In the pad 425-2, a region which is directly opposite the region connected to the via 423-2 and is exposed to the upper surface of the element layer 421 is a first region which is not directly connected to another chip. In the pad 425-2, for example, a region which extends from the first region which is not directly connected to another chip and is exposed to the upper surface of the element layer 421 is a second region (that is, an another-chip connection region) which is directly connected to another chip.

The signal path 422-2 includes the bump 424-3 (Ta7-1), the via 423-3 connected to the bump 424-3, and the pad 425-3 connected to the via 423-3. In the pad 425-3, a region which is directly opposite the region connected to the via 423-3 and is exposed to the upper surface of the element layer 421 is a first region which is not directly connected to another chip. In the pad 425-3, for example, a region which extends from the first region which is not directly connected to another chip and is exposed to the upper surface of the element layer 421 is a second region (that is, an another-chip connection region) which is directly connected to another chip.

The signal path 422-2 includes the bump 424-4 (Ta7-2), the via 423-4 connected to the bump 424-4, and the pad 425-4 connected to the via 423-4. In the pad 425-4, a region which is directly opposite the region connected to the via 423-4 and is exposed to the upper surface of the element layer 421 is a first region which is not directly connected to another chip. In the pad 425-4, for example, a region which extends from the first region which is not directly connected to another chip and is exposed to the upper surface of the element layer 421 is a second region (that is, an another-chip connection region) which is directly connected to another chip.

The signal path 422-2 includes the bump 424-5 (Ta7-3), the via 423-5 connected to the bump 424-5, and the pad 425-5 connected to the via 423-5. In the pad 425-5, a region which is directly opposite the region connected to the via 423-5 and is exposed to the upper surface of the element layer 421 is a first region which is not directly connected to another chip. In the pad 425-5, for example, a region which extends from the first region which is not directly connected to another chip and is exposed to the upper surface of the element layer 421 is a second region (that is, an another-chip connection region) which is directly connected to another chip.

The wiring pattern of the sub-chip SC0 disposed as mentioned above is correlated with a symbol P11 illustrated in FIG. 37.

Although not illustrated here, the respective pads 425 may be connected to the internal circuits.

3-1-2-2. Upper Surface of Sub-Chip SC0

Figure 38:
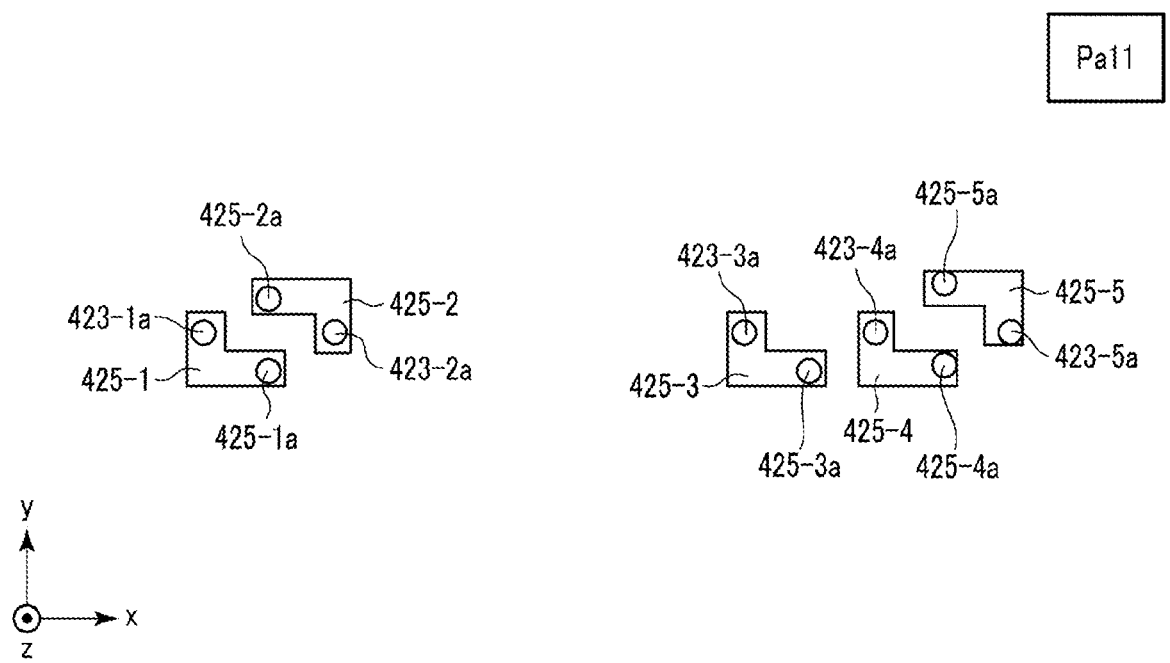
FIG. 38 is a top view illustrating an example of a wiring pattern of the sub-chips of the semiconductor device according to the third embodiment.

With reference to FIG. 38, a description will be made of an example of a wiring pattern of the sub-chip of the semiconductor device according to the third embodiment. FIG. 38 is a top view illustrating an example of a wiring pattern of the sub-chip of the semiconductor device according to the third embodiment.

FIG. 38 illustrates a relationship between the pad 425-1 and the pad 425-2 in the xy plane.

As illustrated in FIG. 38, in the xy plane, the pad 425-1 has a polygonal shape (an L shape in FIG. 38). In the xy plane, the pad 425-2 has a polygonal shape (an inverse L shape in FIG. 38).

The pad 425-1 is connected to the via 423-1 in a via connection region 423-1a. The pad 425-1 is connected to another chip through an another-chip connection region 425-1a.

The pad 425-2 is connected to the via 423-2 in a via connection region 423-2a. The pad 425-2 is connected to another chip through an another-chip connection region 425-2a.

In the example illustrated in FIG. 38, the via connection region 423-1a and via connection region 423-2a are located on the same line along the x axis direction. The another-chip connection region 425-1a and the another-chip connection region 425-2a are located on the same line along the y axis direction.

FIG. 38 illustrates a relationship among the pads 425-3, 425-4, and 425-5 in the xy plane.

As illustrated in FIG. 38, in the xy plane, the pad 425-3 has a polygonal shape (an L shape in FIG. 38). In the xy plane, the pad 425-4 has a polygonal shape (an L shape in FIG. 38). In the xy plane, the pad 425-5 has a polygonal shape (an inverse L shape in FIG. 38).

The pad 425-3 is connected to the via 423-3 in a via connection region 423-3a. The pad 425-3 is connected to another chip through an another-chip connection region 425-3a.

The pad 425-4 is connected to the via 423-4 in a via connection region 423-4a. The pad 425-4 is connected to another chip through an another-chip connection region 425-4a.

The pad 425-5 is connected to the via 423-5 in a via connection region 423-5a. The pad 425-5 is connected to another chip through an another-chip connection region 425-5a.

In the example illustrated in FIG. 38, the via connection region 423-3a, the via connection region 423-4a, and via connection region 423-5a are located on the same line along the x axis direction. The another-chip connection region 425-4a and the another-chip connection region 425-5a are located on the same line along the y axis direction.

The pattern of the pads 425 of the sub-chip SC0 disposed as mentioned above is correlated with a symbol Pa11 illustrated in FIG. 38.

3-1-2-3. Section of Sub-Chip SC1

Figure 39:
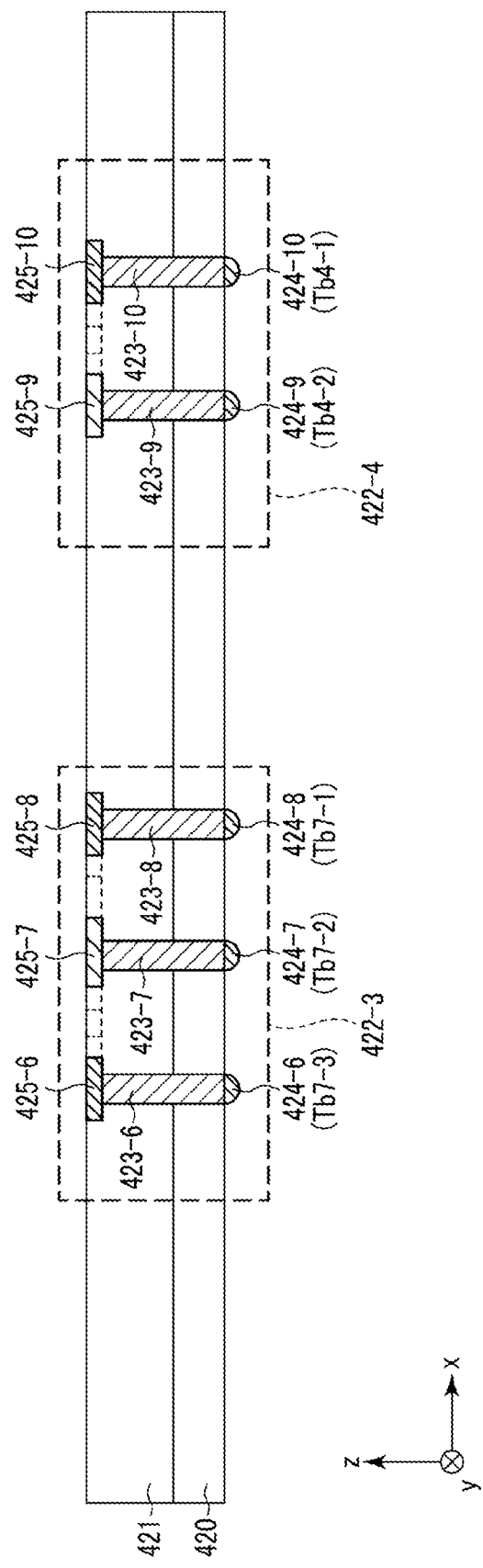
FIG. 39 is a sectional view illustrating an example of a wiring pattern of the sub-chips of the semiconductor device according to the third embodiment.

With reference to FIG. 39, a description will be made of an example of a wiring pattern of the sub-chip of the semiconductor device according to the third embodiment. FIG. 39 is a sectional view illustrating an example of a wiring pattern of the sub-chip of the semiconductor device according to the third embodiment. FIG. 39 illustrates a wiring pattern that makes up parts of the signal paths SL4 and SL7 as an example.

As illustrated in FIG. 39, an element layer 421 is provided on an upper surface of a semiconductor substrate 420. For simplification, FIG. 39 does not illustrate internal circuits other than the signal paths.

FIG. 39 illustrates a plurality of signal paths 422 (for example, 422-3 and 422-4).

The semiconductor substrate 420 and the element layer 421 are provided with a plurality of vias 423 (for example, 423-6, 423-7, 423-8, 423-9, and 423-10) which are through silicon vias (TSVs). A plurality of bumps 424 (for example, 424-6, 424-7, 424-8, 424-9, and 424-10) functioning as the terminals Tb4-1, Tb4-2, Tb7-1, Tb7-2, and Tb7-3 are provided at portions to which the vias 423-6 to 423-10 are exposed on the lower surface of the semiconductor substrate 420. A plurality of pads 425 (for example, 425-6, 425-7, 425-8, 425-9, and 425-10) are provided on an upper surface of the element layer 421. Upper surfaces of the pads 425 are exposed to the upper surface of the element layer 421.

The signal path 422-3 includes the bump 424-6 (Tb7-3), the via 423-6 connected to the bump 424-6, and the pad 425-6 connected to the via 423-6. In the pad 425-6, a region which is directly opposite the region connected to the via 423-6 and is exposed to the upper surface of the element layer 421 is a first region which is not directly connected to another chip. In the pad 425-6, for example, a region which extends in the x axis direction from the first region which is not directly connected to another chip and is exposed to the upper surface of the element layer 421 is a second region (also referred to as an another-chip connection region) which is directly connected to another chip.

Here, "another chip" indicates the sub-chip SC0. The signal path 422-3 includes the bump 424-7 (Tb7-2), the via 423-7 connected to the bump 424-7, and the pad 425-7 connected to the via 423-7. In the pad 425-7, a region which is directly opposite the region connected to the via 423-7 and is exposed to the upper surface of the element layer 421 is a first region which is not directly connected to another chip. In the pad 425-7, for example, a region which extends from the first region which is not directly connected to another chip and is exposed to the upper surface of the element layer 421 is a second region (that is, an another-chip connection region) which is directly connected to another chip.

The signal path 422-3 includes the bump 424-8 (Tb7-1), the via 423-8 connected to the bump 424-8, and the pad 425-8 connected to the via 423-8. In the pad 425-8, a region which is directly opposite the region connected to the via 423-8 and is exposed to the upper surface of the element layer 421 is a first region which is not directly connected to another chip. In the pad 425-8, for example, a region which extends from the first region which is not directly connected to another chip and is exposed to the upper surface of the element layer 421 is a second region (that is, an another-chip connection region) which is directly connected to another chip.

The signal path 422-4 includes the bump 424-9 (Tb4-2), the via 423-9 connected to the bump 424-9, and the pad 425-9 connected to the via 423-9. In the pad 425-9, a region which is directly opposite the region connected to the via 423-9 and is exposed to the upper surface of the element layer 421 is a first region which is not directly connected to another chip. In the pad 425-9, for example, a region which extends from the first region which is not directly connected to another chip and is exposed to the upper surface of the element layer 421 is a second region (that is, an another-chip connection region) which is directly connected to another chip.

The signal path 422-4 includes the bump 424-10 (Tb4-1), the via 423-10 connected to the bump 424-10, and the pad 425-10 connected to the via 423-10. In the pad 425-10, a region which is directly opposite the region connected to the via 423-10 and is exposed to the upper surface of the element layer 421 is a first region which is not directly connected to another chip. In the pad 425-10, for example, a region which extends from the first region which is not directly connected to another chip and is exposed to the upper surface of the element layer 421 is a second region (that is, an another-chip connection region) which is directly connected to another chip.

The vias of the sub-chip SC0 and the vias of the sub-chip SC1 are designed in mirror-image symmetry with respect to a plane where lower surfaces thereof face each other.

The wiring pattern of the sub-chip SC1 disposed as mentioned above is correlated with a symbol P12 illustrated in FIG. 39.

Although not illustrated here, the respective pads 425 may be connected to the internal circuits.

3-1-2-4. Upper Surface of Sub-Chip SC1

Figure 40:
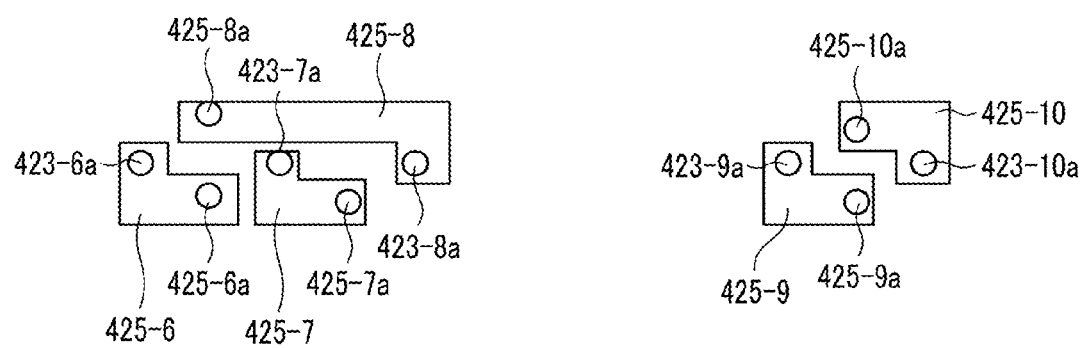
FIG. 40 is a top view illustrating an example of a wiring pattern of the sub-chips of the semiconductor device according to the third embodiment.

With reference to FIG. 40, a description will be made of an example of a wiring pattern of the sub-chip of the semiconductor device according to the third embodiment. FIG. 40 is a top view illustrating an example of a wiring pattern of the sub-chip of the semiconductor device according to the third embodiment.

FIG. 40 illustrates a relationship among the pad 425-6, the pad 425-7, and the pad 425-8 in the xy plane.

As illustrated in FIG. 40, in the xy plane, the pad 425-6 has a polygonal shape (an L shape in FIG. 40). In the xy plane, the pad 425-7 has a polygonal shape (an L shape in FIG. 40). In the xy plane, the pad 425-8 has a polygonal shape (an inverse L shape in FIG. 40).

The pad 425-6 is connected to the via 423-6 in a via connection region 423-6a. The pad 425-6 is connected to another chip through an another-chip connection region 425-6a.

The pad 425-7 is connected to the via 423-7 in a via connection region 423-7a. The pad 425-7 is connected to another chip through an another-chip connection region 425-7a.

The pad 425-8 is connected to the via 423-8 in a via connection region 423-8a. The pad 425-8 is connected to another chip through an another-chip connection region 425-8a.

In the example illustrated in FIG. 40, the via connection region 423-6a, the via connection region 423-7a, and via connection region 423-8a are located on the same line along the x axis direction. The another-chip connection region 425-6a and the another-chip connection region 425-7a are located on the same line along the x axis direction. The another-chip connection region 425-6a and the another-chip connection region 425-8a are located on the same line along the y axis direction.

As illustrated in FIG. 40, in the xy plane, the pad 425-9 has a polygonal shape (an L shape in FIG. 40). In the xy plane, the pad 425-10 has a polygonal shape (an inverse L shape in FIG. 40).

The pad 425-9 is connected to the via 423-9 in a via connection region 423-9a. The pad 425-9 is connected to another chip through an another-chip connection region 425-9a.

The pad 425-10 is connected to the via 423-10 in a via connection region 423-10a. The pad 425-10 is connected to another chip through an another-chip connection region 425-10a.

In the example illustrated in FIG. 40, the via connection region 423-9a and via connection region 423-10a are located on the same line along the x axis direction. The another-chip connection region 425-9a and the another-chip connection region 425-10a are located on the same line along the y axis direction.

The pattern of the pads 425 of the sub-chip SC1 disposed as mentioned above is correlated with a symbol Pa12 illustrated in FIG. 40.

3-1-3. Stacking Structure of Core Chip Group

Figure 41:
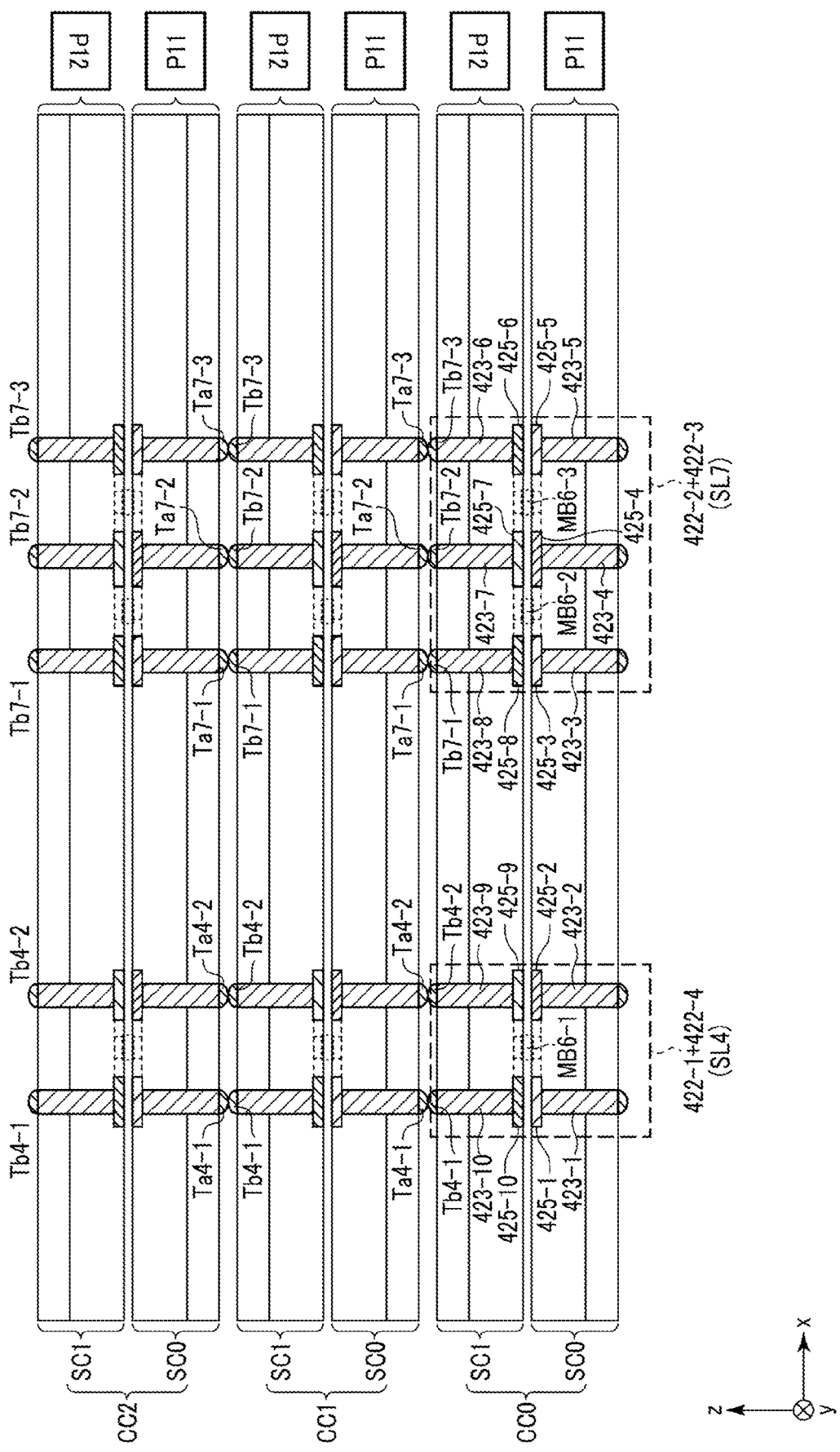
FIG. 41 is a sectional view illustrating a stacking structure of a core chip group of the semiconductor device according to the third embodiment.

Next, with reference to FIG. 41, a description will be made of a stacking structure of the core chip group of the semiconductor device according to the third embodiment. FIG. 41 is a sectional view illustrating a stacking structure of the core chip group of the semiconductor device according to the third embodiment. FIG. 41 illustrates a structure in which three pairs of the sub-chips SC0 and SC1 illustrated in FIGS. 37 to 40 are stacked in this order.

As illustrated in FIG. 41, the upper surface of the sub-chip SC0 is stacked on the upper surface of the sub-chip SC1. A position of each of the pads 425 having another-chip connection regions of the sub-chip SC0 matches a position of each of the pads 425 having another-chip connection regions of the sub-chip SC1. Specifically, positions of the pads 425-1 to 425-5 of the sub-chip SC0 respectively match positions of the pads 425-10 to 425-6 of the sub-chip SC1.

The lower surface of the sub-chip SC0 is stacked on the lower surface of the sub-chip SC1. Positions of the bumps 424 of the sub-chip SC0 and positions of the bumps 424 of the sub-chip SC1 are designed in mirror-image symmetry with respect to a plane where upper surfaces thereof face each other. Thus, positions of the bumps 424-1 to 424-5 of the sub-chip SC0 respectively match positions of the bumps 424-10 to 424-6 of the sub-chip SC1.

The signal path 422-1 of the sub-chip SC0 and the signal path 422-4 of the sub-chip SC1 are electrically connected to each other through a micro-bump MB6-1(1) provided between the pad 425-1 and the pad 425-9, and are electrically connected to each other through a micro-bump MB6-1(2) provided between the pad 425-2 and the pad 425-10, and thus form the signal path SL4 for performing communication with each internal circuit.

As mentioned above, in the signal path 422-1 of the sub-chip SC0 and the signal path 422-4 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 422-1 and the signal path 422-4, the signal path SL4 is realized by using shapes of the pads.

Figure 42:
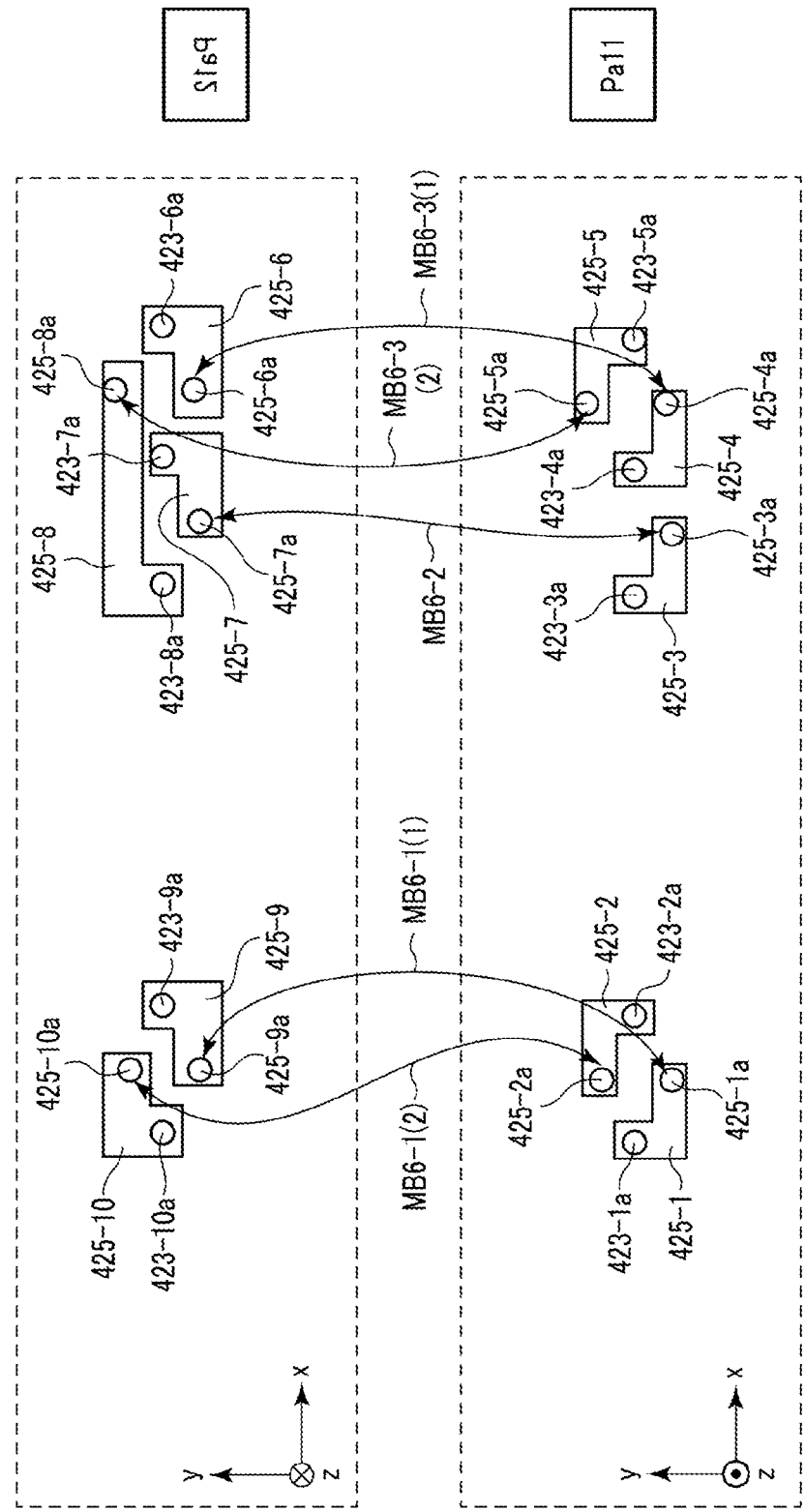
FIG. 42 is a diagram illustrating a relationship between pads of the two sub-chips of the semiconductor device according to the third embodiment before they are stacked.

Here, with reference to FIG. 42, a description will be made of a connection method for the pads 425-1 and 425-9 and a connection method for the pads 425-2 and 425-10. FIG. 42 is a diagram illustrating a relationship between pads of the two sub-chips of the semiconductor device according to the third embodiment before they are stacked. FIG. 42 is a diagram illustrating an xy plane of the pads 425-1 and 425-2 and an xy plane of the pads 425-9 and 425-10 before the sub-chips are stacked.

As illustrated in FIG. 42, the sub-chip SC0 and the sub-chip SC1 are stacked back to back. Thus, in FIG. 42, the pattern of the pads 425-9 and 425-10 of the sub-chip SC1 is illustrated in a state in which the pattern illustrated in FIG. 40 is horizontally rotated by 180 degrees.

The connection region 425-9a of the pad 425-9 is located over the connection region 425-1a of the pad 425-1 in the z axis direction. The connection region 425-1a of the pad 425-1 is connected to the connection region 425-19a of the pad 425-19 through the micro-bump MB6-1(1).

The connection region 425-10a of the pad 425-10 is located over the connection region 425-2a of the pad 425-2 in the z axis direction. The connection region 425-2a of the pad 425-2 is connected to the connection region 425-10a of the pad 425-10 through the micro-bump MB6-1(2).

In other words, in the two sub-chips, two pads directly connected to TSVs not facing each other on the mutual upper surfaces are electrically connected to each other indirectly.

Next, with reference to FIG. 41 again, a description will be made of another signal path. The signal path 422-2 of the sub-chip SC0 and the signal path 422-3 of the sub-chip SC1 are electrically connected to each other through a micro-bump MB6-2 provided between the pad 425-3 and the pad 425-7, are electrically connected to each other through a micro-bump MB6-3(1) provided between the pad 425-4 and the pad 425-6, and are electrically connected to each other through a micro-bump MB6-3(2) provided between the pad 425-5 and the pad 425-8, and thus form the signal path SL7 for performing communication with each internal circuit.

As mentioned above, in the signal path 422-2 of the sub-chip SC0 and the signal path 422-3 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 422-2 and the signal path 422-3, the signal path SL7 is provided by using shapes of the pads.

Here, with reference to FIG. 42, a description will be made of a connection method for the pads 425-3 and 425-7, a connection method for the pads 425-4 and 425-6, and a connection method for the pads 425-5 and 425-8. FIG. 42 is a diagram illustrating an xy plane of the pads 425-3, 425-4, and 425-5, and an xy plane of the pads 425-6, 425-7, and 425-8 before the sub-chips are stacked.

As illustrated in FIG. 42, the sub-chip SC0 and the sub-chip SC1 are stacked back to back. Thus, in FIG. 42, the pattern of the pads 425-6, 425-7, and 425-8 of the sub-chip SC1 is illustrated in a state in which the pattern illustrated in FIG. 40 is horizontally rotated by 180 degrees.

The connection region 425-7*a* of the pad 425-7 is located over the connection region 425-3*a* of the pad 425-3 in the z axis direction. The connection region 425-3*a* of the pad 425-3 is connected to the connection region 425-7*a* of the pad 425-7 through the micro-bump MB6-2.

The connection region 425-6*a* of the pad 425-6 is located over the connection region 425-4*a* of the pad 425-4 in the z axis direction. The connection region 425-4*a* of the pad 425-4 is connected to the connection region 425-6*a* of the pad 425-6 through the micro-bump MB6-3(1).

The connection region 425-8*a* of the pad 425-8 is located over the connection region 425-5*a* of the pad 425-5 in the z axis direction. The connection region 425-5*a* of the pad 425-5 is connected to the connection region 425-8*a* of the pad 425-8 through the micro-bump MB6-3(2).

In other words, in the two sub-chips, two pads directly connected to TSVs not facing each other on the mutual upper surfaces are electrically connected to each other indirectly.

3-1-4. Flow of Signal or Power

Figure 43:
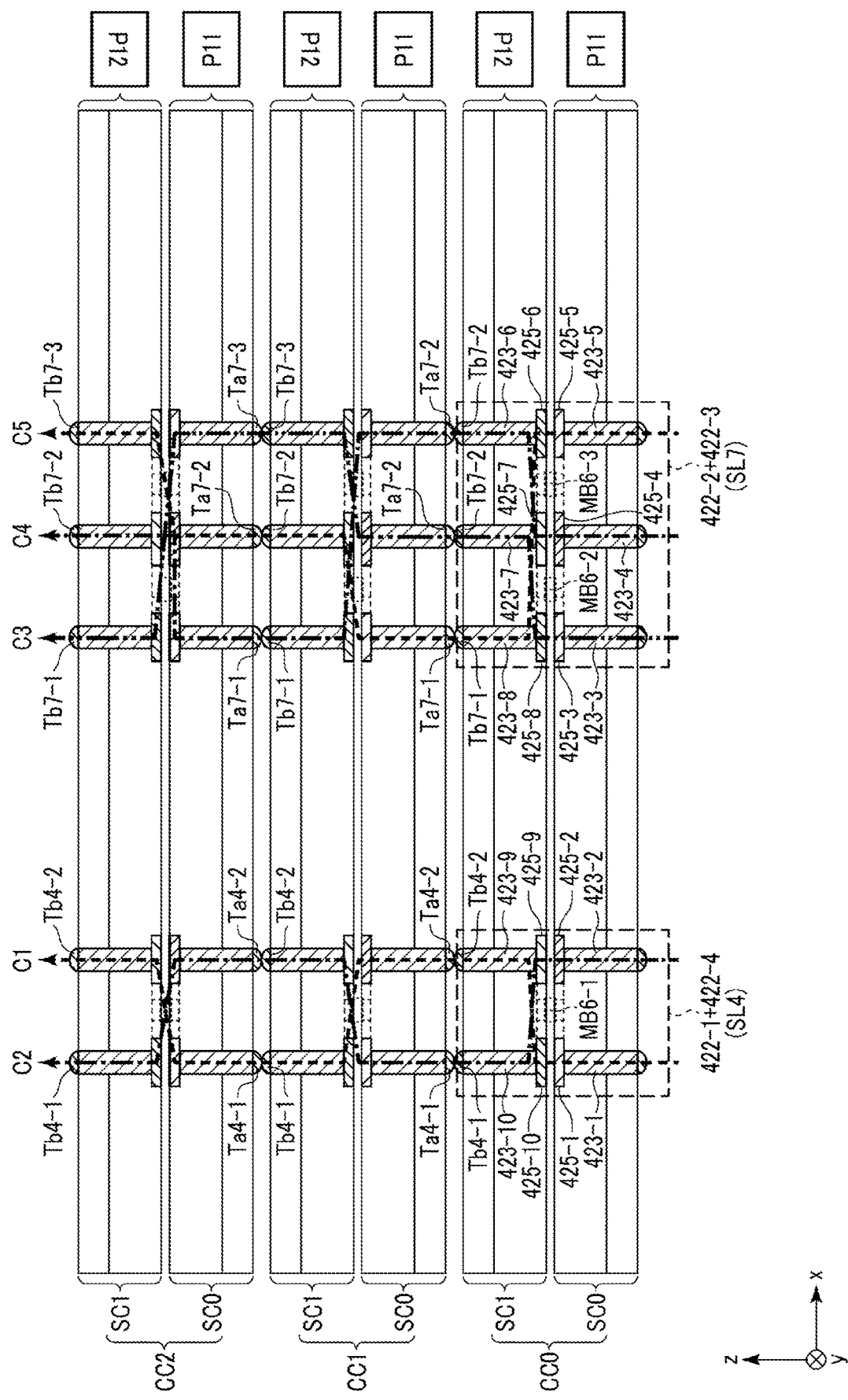
FIG. 43 is a sectional view illustrating a flow of a signal or power in the stacking structure of the core chip group of the semiconductor device according to the third embodiment.

Here, with reference to FIG. 43, a description will be made of a flow of a signal or power. FIG. 43 is a sectional view illustrating a flow of a signal or power in the stacking structure of the core chip group of the semiconductor device according to the third embodiment. Herein, for simplification, terminals (bumps) and vias through which a signal or power flows will be focused on.

First, a description will be made of a path including the signal paths 422-1 and 422-4 by referring to arrows C1 and C2. A signal or power which is input to the terminal Ta4-1 is output from the terminal Tb4-2 through the via 423-1 and the via 423-9. A signal or power which is input to the terminal Tb4-2 is output from the terminal Ta4-1 through the via 423-9 and the via 423-1. A signal or power which is input to the terminal Ta4-2 is output from the terminal Tb4-1 through the via 423-2 and the via 423-10. A signal or power which is input to the terminal Tb4-1 is output from the terminal Ta4-2 through the via 423-10 and the via 423-2. As mentioned above, in the present embodiment, it is possible to provide the signal path SL4 in which a TSV to which a signal or power is input is changed for each chip.

Next, a description will be made of a path including the signal paths 422-2 and 422-3 by referring to arrows C3 to C5. A signal or power which is input to the terminal Ta1-1 is output from the terminal Tb7-2 through the via 423-3 and the via 423-7. A signal or power which is input to the terminal Tb7-2 is output from the terminal Ta1-1 through the via 423-7 and the via 423-3. A signal or power which is input to the terminal Ta1-2 is output from the terminal Tb7-3 through the via 423-4 and the via 423-6. A signal or power which is input to the terminal Tb7-3 is output from the terminal Ta1-2 through the via 423-6 and the via 423-4. A signal or power which is input to the terminal Ta1-3 is output from the terminal Tb7-1 through the via 423-5 and the via 423-8. A signal or power which is input to the terminal Tb7-1 is output from the terminal Ta1-3 through the via 423-8 and the via 423-5. As mentioned above, in the present embodiment, it is possible to provide the signal path SL7 in which a TSV to which a signal or power is input is changed for each chip.

3-2. Effects

According to the embodiment, it is possible to achieve the same effects as those in the first embodiment.

3-3. Modification Example of Third Embodiment

3-3-1. Configuration

3-3-1-1. Configuration of Sub-Chip

Layouts of the sub-chips SC0 and SC1 are the same as those described in the first embodiment.

3-3-1-1-1. Section of Sub-Chip SC0

Figure 44:
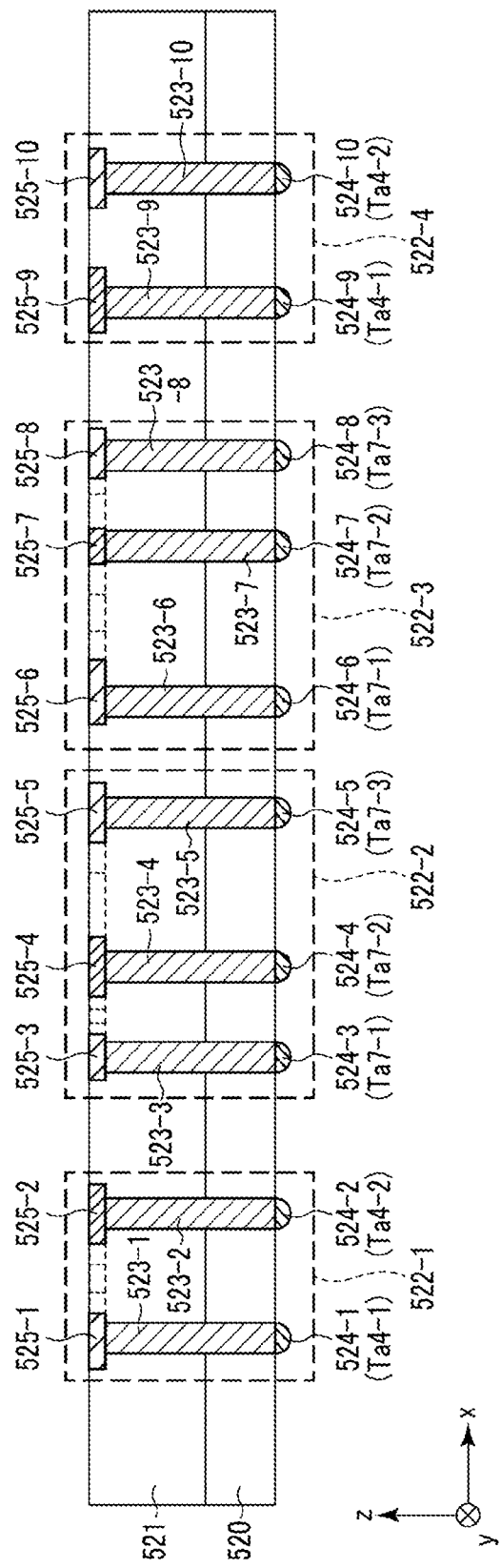
FIG. 44 is a sectional view illustrating an example of a wiring pattern of sub-chips of a semiconductor device according to a modification example of the third embodiment.

With reference to FIG. 44, a description will be made of an example of a wiring pattern of the sub-chip of the semiconductor device according to the modification example of the third embodiment. FIG. 44 is a sectional view illustrating an example of a wiring pattern of the sub-chip of the semiconductor device according to the modification example of the third embodiment. FIG. 44 illustrates a wiring pattern that makes up parts of the signal paths SL4 and SL7 as an example.

As illustrated in FIG. 44, an element layer 521 is provided on an upper surface of a semiconductor substrate 520. For simplification, FIG. 44 does not illustrate internal circuits other than the signal paths.

FIG. 44 illustrates a plurality of signal paths 522 (for example, 522-1, 522-2, 522-3, and 522-4).

The semiconductor substrate 520 and the element layer 521 are provided with a plurality of vias 523 (for example, 523-1, 523-2, 523-3, 523-4, 523-5, 523-6, 523-7, 523-8, 523-9, and 523-10) which are through silicon vias (TSVs). A plurality of bumps 524 (for example, 524-1, 524-2, 524-3, 524-4, 524-5, 524-6, 524-7, 524-8, 524-9, and 524-10) functioning as the terminals Ta4-1, Ta4-2, Ta1-1, Ta1-2, and Ta1-3 are provided at portions to which the vias 523-1 to 523-10 are exposed on the lower surface of the semiconductor substrate 520. A plurality of pads 525 (for example, 525-1, 525-2, 525-3, 525-4, 525-5, 525-6, 525-7, 525-8, 525-9, and 525-10) are provided on an upper surface of the element layer 521. Upper surfaces of the pads 525 are exposed to the upper surface of the element layer 521.

The signal path 522-1 includes the bump 524-1 (Ta4-1 or Tb4-2), the via 523-1 connected to the bump 524-1, and the pad 525-1 connected to the via 523-1. In the pad 525-1, a region which is directly opposite the region connected to the via 523-1 and is exposed to the upper surface of the element layer 521 is a first region which is not directly connected to another chip. In the pad 525-1, for example, a region which extends from the first region which is not directly connected to another chip and is exposed to the upper surface of the element layer 521 is a second region (that is, an another-chip connection region) which is directly connected to another chip.

Here, "another chip" indicates the sub-chip SC1.

The signal path 522-1 includes the bump 524-2 (Ta4-2 or Tb4-1), the via 523-2 connected to the bump 524-2, and the pad 525-2 connected to the via 523-2. In the pad 525-2, a region which is directly opposite the region connected to the via 523-2 and is exposed to the upper surface of the element layer 521 is a first region which is not directly connected to another chip. In the pad 525-2, for example, a region which extends from the first region which is not directly connected to another chip and is exposed to the upper surface of the element layer 521 is a second region (that is, an another-chip connection region) which is directly connected to another chip.

The signal path 522-2 includes the bump 524-3 (Ta7-1 or Tb7-3), the via 523-3 connected to the bump 524-3, and the pad 525-3 connected to the via 523-3. In the pad 525-3, a region which is directly opposite the region connected to the via 523-3 and is exposed to the upper surface of the element layer 521 is a first region which is not directly connected to another chip. In the pad 525-3, for example, a region which extends from the first region which is not directly connected to another chip and is exposed to the upper surface of the element layer 521 is a second region (that is, an another-chip connection region) which is directly connected to another chip.

The signal path 522-2 includes the bump 524-4 (Ta7-2 or Tb7-2), the via 523-4 connected to the bump 524-4, and the pad 525-4 connected to the via 523-4. In the pad 525-4, a region which is directly opposite the region connected to the via 523-4 and is exposed to the upper surface of the element layer 521 is a first region which is not directly connected to another chip. In the pad 525-4, for example, a region which extends from the first region which is not directly connected to another chip and is exposed to the upper surface of the element layer 521 is a second region (that is, an another-chip connection region) which is directly connected to another chip.

The signal path 522-2 includes the bump 524-5 (Ta7-3 or Tb7-1), the via 523-5 connected to the bump 524-5, and the pad 525-5 connected to the via 523-5. In the pad 525-5, a region which is directly opposite the region connected to the via 523-5 and is exposed to the upper surface of the element layer 521 is a first region which is not directly connected to another chip. In the pad 525-5, for example, a region which extends from the first region which is not directly connected to another chip and is exposed to the upper surface of the element layer 521 is a second region (that is, an another-chip connection region) which is directly connected to another chip.

The signal path 522-3 includes the bump 524-6 (Ta7-1 or Tb7-3), the via 523-6 connected to the bump 524-6, and the pad 525-6 connected to the via 523-6. In the pad 525-6, a region which is directly opposite the region connected to the via 523-6 and is exposed to the upper surface of the element layer 521 is a first region which is not directly connected to another chip. In the pad 525-6, for example, a region which extends from the first region which is not directly connected to another chip and is exposed to the upper surface of the element layer 521 is a second region (that is, an another-chip connection region) which is directly connected to another chip.

The signal path 522-3 includes the bump 524-7 (Ta7-2 or Tb7-2), the via 523-7 connected to the bump 524-7, and the pad 525-7 connected to the via 523-7. In the pad 525-7, a region which is directly opposite the region connected to the via 523-7 and is exposed to the upper surface of the element layer 521 is a first region which is not directly connected to another chip. In the pad 525-7, for example, a region which extends from the first region which is not directly connected to another chip and is exposed to the upper surface of the element layer 521 is a second region (that is, an another-chip connection region) which is directly connected to another chip.

The signal path 522-3 includes the bump 524-8 (Ta7-3 or Tb7-1), the via 523-8 connected to the bump 524-8, and the pad 525-8 connected to the via 523-8. In the pad 525-8, a region which is directly opposite the region connected to the via 523-8 and is exposed to the upper surface of the element layer 521 is a first region which is not directly connected to another chip. In the pad 525-8, for example, a region which extends from the first region which is not directly connected to another chip and is exposed to the upper surface of the element layer 521 is a second region (that is, an another-chip connection region) which is directly connected to another chip.

The signal path 522-4 includes the bump 524-9 (Ta4-1 or Tb4-2), the via 523-9 connected to the bump 524-9, and the pad 525-9 connected to the via 523-9. In the pad 525-9, a region which is directly opposite the region connected to the via 523-9 and is exposed to the upper surface of the element layer 521 is a first region which is not directly connected to another chip. In the pad 525-9, for example, a region which extends from the first region which is not directly connected to another chip and is exposed to the upper surface of the element layer 521 is a second region (that is, an another-chip connection region) which is directly connected to another chip.

The signal path 522-4 includes the bump 524-10 (Ta4-2 or Tb4-1), the via 523-10 connected to the bump 524-10, and the pad 525-10 connected to the via 523-10. In the pad 525-10, a region which is directly opposite the region connected to the via 523-10 and is exposed to the upper surface of the element layer 521 is a first region which is not directly connected to another chip. In the pad 525-10, for example, a region which extends from the first region which is not directly connected to another chip and is exposed to the upper surface of the element layer 521 is a second region (that is, an another-chip connection region) which is directly connected to another chip.

A lower surface of the sub-chip SC0 is to be stacked on a lower surface of another sub-chip SC0. Thus, vias of the sub-chip SC0 are designed in mirror-image symmetry with respect to the lower surface of another sub-chip SC0. In other words, in the sub-chip SC0, the vias are provided in mirror-image symmetry with respect to the center of the sub-chip SC0 in the x axis direction in the xz plane.

The wiring pattern of the sub-chip SC0 disposed as mentioned above is correlated with a symbol P13 illustrated in FIG. 44.

Although not illustrated here, the respective pads 525 may be connected to the internal circuits.

3-3-1-1-2. Upper Surface of Sub-Chip SC0

Figure 45:
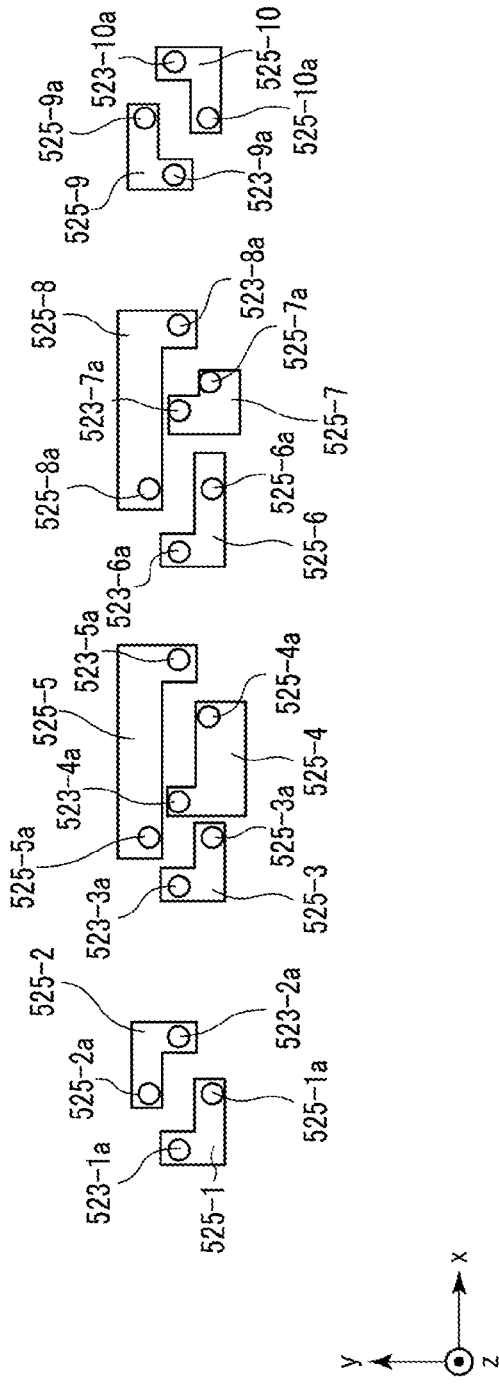
FIG. 45 is a top view illustrating an example of a wiring pattern of the sub-chips of the semiconductor device according to the modification example of the third embodiment.

With reference to FIG. 45, a description will be made of an example of a wiring pattern of the sub-chip of the semiconductor device according to the modification example of the third embodiment. FIG. 45 is a top view illustrating an example of a wiring pattern of the sub-chip of the semiconductor device according to the modification example of the third embodiment.

FIG. 45 illustrates a relationship between the pad 525-1 and the pad 525-2 in the xy plane.

As illustrated in FIG. 45, in the xy plane, the pad 525-1 has a polygonal shape (an L shape in FIG. 45). In the xy plane, the pad 525-2 has a polygonal shape (an inverse L shape in FIG. 45).

The pad 525-1 is connected to the via 523-1 in a via connection region 523-1a. The pad 525-1 is connected to another chip through an another-chip connection region 525-1a.

The pad 525-2 is connected to the via 523-2 in a via connection region 523-2a. The pad 525-2 is connected to another chip through an another-chip connection region 525-2a.

In the example illustrated in FIG. 45, the via connection region 523-1a and via connection region 523-2a are located on the same line along the x axis direction. The another-chip connection region 525-1a and the another-chip connection region 525-2a are located on the same line along the y axis direction.

FIG. 45 illustrates a relationship among the pads 525-3, 525-4, and 525-5 in the xy plane.

As illustrated in FIG. 45, in the xy plane, the pad 525-3 has a polygonal shape (an L shape in FIG. 45). In the xy plane, the pad 525-4 has a polygonal shape (an L shape in FIG. 45). In the xy plane, the pad 525-5 has a polygonal shape (an inverse L shape in FIG. 45).

The pad 525-3 is connected to the via 523-3 in a via connection region 523-3a. The pad 525-3 is connected to another chip through an another-chip connection region 525-3a.

The pad 525-4 is connected to the via 523-4 in a via connection region 523-4a. The pad 525-4 is connected to another chip through an another-chip connection region 525-4a.

The pad 525-5 is connected to the via 523-5 in a via connection region 523-5a. The pad 525-5 is connected to another chip through an another-chip connection region 525-5a.

In the example illustrated in FIG. 45, the via connection region 523-3a, the via connection region 523-4a, and via connection region 523-5a are located on the same line along the x axis direction. The another-chip connection region 525-3a and the another-chip connection region 525-4a are located on the same line along the x axis direction. The another-chip connection region 525-4a and the another-chip connection region 525-5a are located on the same line along the y axis direction.

FIG. 45 illustrates a relationship among the pad 525-6, the pad 525-7, and the pad 525-8 in the xy plane.

As illustrated in FIG. 45, in the xy plane, the pad 525-6 has a polygonal shape (an L shape in FIG. 45). In the xy plane, the pad 525-7 has a polygonal shape (an L shape in FIG. 45). In the xy plane, the pad 525-8 has a polygonal shape (an inverse L shape in FIG. 45).

The pad 525-6 is connected to the via 523-6 in a via connection region 523-6a. The pad 525-6 is connected to another chip through an another-chip connection region 525-6a.

The pad 525-7 is connected to the via 523-7 in a via connection region 523-7a. The pad 525-7 is connected to another chip through an another-chip connection region 525-7a.

The pad 525-8 is connected to the via 523-8 in a via connection region 523-8a. The pad 525-8 is connected to another chip through an another-chip connection region 525-8a.

In the example illustrated in FIG. 45, the via connection region 523-6a, the via connection region 523-7a, and via connection region 523-8a are located on the same line along the x axis direction. The another-chip connection region 525-6a and the another-chip connection region 525-7a are located on the same line along the x axis direction. The another-chip connection region 525-7a and the another-chip connection region 525-8a are located on the same line along the y axis direction.

FIG. 45 illustrates a relationship between the pad 525-9 and the pad 525-10 in the xy plane.

As illustrated in FIG. 45, in the xy plane, the pad 525-9 has a polygonal shape (an L shape in FIG. 45). In the xy plane, the pad 525-10 has a polygonal shape (an inverse L shape in FIG. 45).

The pad 525-9 is connected to the via 523-9 in a via connection region 523-9a. The pad 525-9 is connected to another chip through an another-chip connection region 525-9a.

The pad 525-10 is connected to the via 523-10 in a via connection region 523-10a. The pad 525-10 is connected to another chip through an another-chip connection region 525-10a.

In the example illustrated in FIG. 45, the via connection region 523-9a and via connection region 523-10a are located on the same line along the x axis direction. The another-chip connection region 525-9a and the another-chip connection region 525-10a are located on the same line along the y axis direction.

The pattern of the pads 525 of the sub-chip SC0 disposed as mentioned above is correlated with a symbol Pa13 illustrated in FIG. 45.

3-3-1-1-3. Section of Sub-Chip SC1

Figure 46:
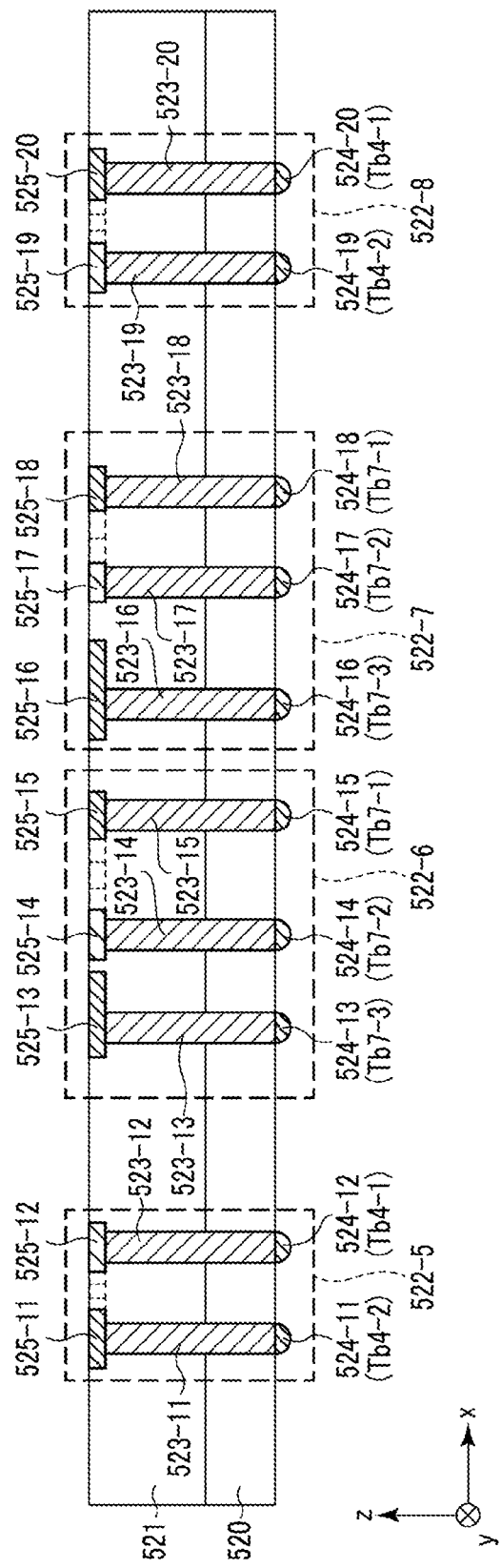
FIG. 46 is a sectional view illustrating an example of a wiring pattern of the sub-chips of the semiconductor device according to the modification example of the third embodiment.

With reference to FIG. 46, a description will be made of an example of a wiring pattern of the sub-chip of the semiconductor device according to the modification example of the third embodiment. FIG. 46 is a sectional view illustrating an example of a wiring pattern of the sub-chip of the semiconductor device according to the modification example of the third embodiment. FIG. 46 illustrates a wiring pattern that makes up parts of the signal paths SL4 and SL7 as an example.

As illustrated in FIG. 46, an element layer 521 is provided on an upper surface of a semiconductor substrate 520. For simplification, FIG. 46 does not illustrate internal circuits other than the signal paths.

FIG. 46 illustrates a plurality of signal paths 522 (for example, 522-5, 522-6, 522-7, and 522-8).

The semiconductor substrate 520 and the element layer 521 are provided with a plurality of vias 523 (for example, 523-11, 523-12, 523-13, 523-14, 523-15, 523-16, 523-17, 523-18, 523-19, and 523-20) which are through silicon vias (TSVs). A plurality of bumps 524 (for example, 524-11, 524-12, 524-13, 524-14, 524-15, 524-16, 524-17, 524-18, 524-19, and 524-20) functioning as the terminals Tb4-1, Tb4-2, Tb7-1, Tb7-2, and Tb7-3 are provided at portions to which the vias 523-11 to 523-20 are exposed on the lower surface of the semiconductor substrate 520. A plurality of pads 525 (for example, 525-11, 525-12, 525-13, 525-14, 525-15, 525-16, 525-17, 525-18, 525-19, and 525-20) are provided on an upper surface of the element layer 521. Upper surfaces of the pads 525 are exposed to the upper surface of the element layer 521.

The signal path 522-5 includes the bump 524-11 (Tb4-2 or Ta4-1), the via 523-11 connected to the bump 524-11, and the pad 525-11 connected to the via 523-11. In the pad 525-11, a region which is directly opposite the region connected to the via 523-11 and is exposed to the upper surface of the element layer 521 is a first region which is not directly connected to another chip. In the pad 525-11, for example, a region which extends from the first region which is not directly connected to another chip and is exposed to the upper surface of the element layer 521 is a second region (that is, an another-chip connection region) which is directly connected to another chip.

Here, "another chip" indicates the sub-chip SC0.

The signal path 522-5 includes the bump 524-12 (Tb4-1 or Ta4-2), the via 523-12 connected to the bump 524-12, and the pad 525-12 connected to the via 523-12. In the pad 525-12, a region which is directly opposite the region connected to the via 523-12 and is exposed to the upper surface of the element layer 521 is a first region which is not directly connected to another chip. In the pad 525-12, for example, a region which extends from the first region which is not directly connected to another chip and is exposed to the upper surface of the element layer 521 is a second region (that is, an another-chip connection region) which is directly connected to another chip.

The signal path 522-6 includes the bump 524-13 (Tb7-3 or Ta1-1), the via 523-13 connected to the bump 524-13, and the pad 525-13 connected to the via 523-13. In the pad 525-13, a region which is directly opposite the region connected to the via 523-13 and is exposed to the upper surface of the element layer 521 is a first region which is not directly connected to another chip. In the pad 525-13, for example, a region which extends from the first region which is not directly connected to another chip and is exposed to the upper surface of the element layer 521 is a second region (that is, an another-chip connection region) which is directly connected to another chip.

The signal path 522-6 includes the bump 524-14 (Tb7-2 or Ta1-2), the via 523-14 connected to the bump 524-14, and the pad 525-14 connected to the via 523-14. In the pad 525-14, a region which is directly opposite the region connected to the via 523-14 and is exposed to the upper surface of the element layer 521 is a first region which is not directly connected to another chip. In the pad 525-14, for example, a region which extends from the first region which is not directly connected to another chip and is exposed to the upper surface of the element layer 521 is a second region (that is, an another-chip connection region) which is directly connected to another chip.

The signal path 522-6 includes the bump 524-15 (Tb7-1 or Ta1-3), the via 523-15 connected to the bump 524-15, and the pad 525-15 connected to the via 523-15. In the pad 525-15, a region which is directly opposite the region connected to the via 523-15 and is exposed to the upper surface of the element layer 521 is a first region which is not directly connected to another chip. In the pad 525-15, for example, a region which extends from the first region which is not directly connected to another chip and is exposed to the upper surface of the element layer 521 is a second region (that is, an another-chip connection region) which is directly connected to another chip.

The signal path 522-7 includes the bump 524-16 (Tb7-3 or Ta1-1), the via 523-16 connected to the bump 524-16, and the pad 525-16 connected to the via 523-16. In the pad 525-16, a region which is directly opposite the region connected to the via 523-16 and is exposed to the upper surface of the element layer 521 is a first region which is not directly connected to another chip. In the pad 525-16, for example, a region which extends from the first region which is not directly connected to another chip and is exposed to the upper surface of the element layer 521 is a second region (that is, an another-chip connection region) which is directly connected to another chip.

The signal path 522-7 includes the bump 524-17 (Tb7-2 or Ta1-2), the via 523-17 connected to the bump 524-17, and the pad 525-17 connected to the via 523-17. In the pad 525-17, a region which is directly opposite the region connected to the via 523-17 and is exposed to the upper surface of the element layer 521 is a first region which is not directly connected to another chip. In the pad 525-17, for example, a region which extends from the first region which is not directly connected to another chip and is exposed to the upper surface of the element layer 521 is a second region (that is, an another-chip connection region) which is directly connected to another chip.

The signal path 522-7 includes the bump 524-18 (Tb7-1 or Ta1-3), the via 523-18 connected to the bump 524-18, and the pad 525-18 connected to the via 523-18. In the pad 525-18, a region which is directly opposite the region connected to the via 523-18 and is exposed to the upper surface of the element layer 521 is a first region which is not directly connected to another chip. In the pad 525-18, for example, a region which extends from the first region which is not directly connected to another chip and is exposed to the upper surface of the element layer 521 is a second region (that is, an another-chip connection region) which is directly connected to another chip.

The signal path 522-8 includes the bump 524-19 (Tb4-2 or Ta4-1), the via 523-19 connected to the bump 524-19, and the pad 525-19 connected to the via 523-19. In the pad 525-19, a region which is directly opposite the region connected to the via 523-19 and is exposed to the upper surface of the element layer 521 is a first region which is not directly connected to another chip. In the pad 525-19, for example, a region which extends from the first region which is not directly connected to another chip and is exposed to the upper surface of the element layer 521 is a second region (that is, an another-chip connection region) which is directly connected to another chip.

The signal path 522-8 includes the bump 524-20 (Tb4-1 or Ta4-2), the via 523-20 connected to the bump 524-20, and the pad 525-20 connected to the via 523-20. In the pad 525-20, a region which is directly opposite the region connected to the via 523-20 and is exposed to the upper surface of the element layer 521 is a first region which is not directly connected to another chip. In the pad 525-20, for example, a region which extends from the first region which is not directly connected to another chip and is exposed to the upper surface of the element layer 521 is a second region (that is, an another-chip connection region) which is directly connected to another chip.

A lower surface of the sub-chip SC1 is to be stacked on a lower surface of another sub-chip SC1. Thus, vias of the sub-chip SC1 are designed in mirror-image symmetry with respect to the lower surface of another sub-chip SC1. In other words, in the sub-chip SC1, the vias are provided in mirror-image symmetry with respect to the center of the sub-chip SC1 in the x axis direction in the xz plane.

The wiring pattern of the sub-chip SC1 disposed as mentioned above is correlated with a symbol P14 illustrated in FIG. 46.

Although not illustrated here, the respective pads 525 may be connected to the internal circuits.

3-3-1-1-4. Upper Surface of Sub-Chip SC1

Figure 47:
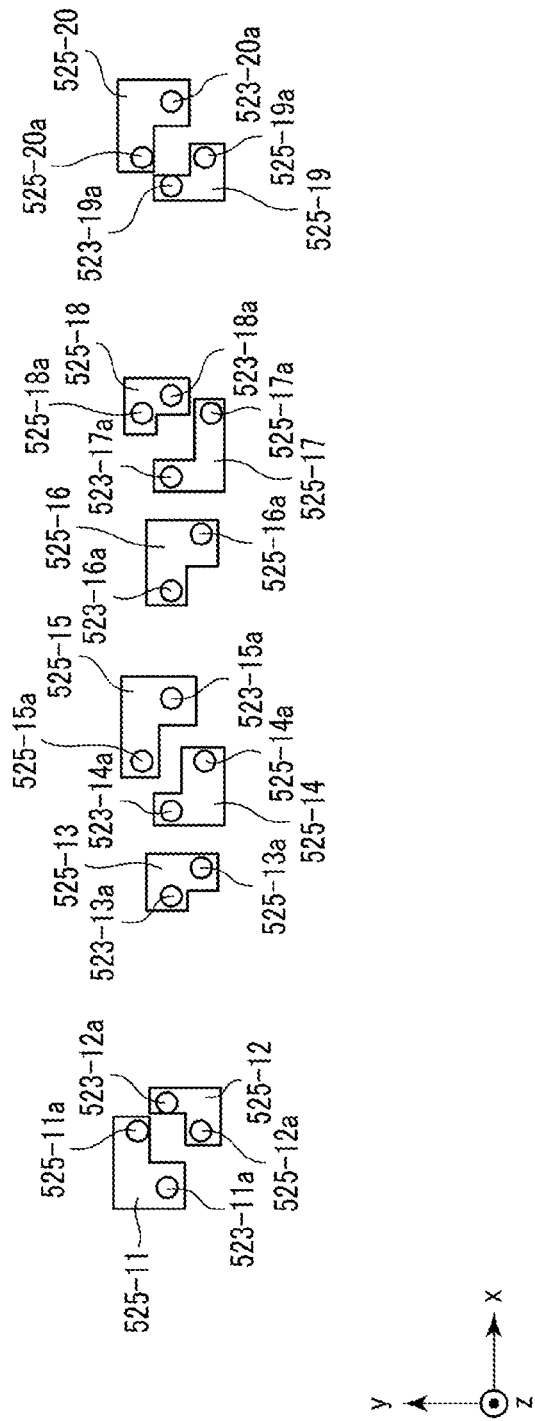
FIG. 47 is a top view illustrating an example of a wiring pattern of the sub-chips of the semiconductor device according to the modification example of the third embodiment.

With reference to FIG. 47, a description will be made of an example of a wiring pattern of the sub-chip of the semiconductor device according to the modification example of the third embodiment. FIG. 47 is a top view illustrating an example of a wiring pattern of the sub-chip of the semiconductor device according to the modification example of the third embodiment.

FIG. 47 illustrates a relationship between the pad 525-11 and the pad 525-12 in the xy plane.

As illustrated in FIG. 47, in the xy plane, the pad 525-11 has a polygonal shape (an L shape in FIG. 47). In the xy plane, the pad 525-12 has a polygonal shape (an inverse L shape in FIG. 47).

The pad 525-11 is connected to the via 523-11 in a via connection region 523-11*a*. The pad 525-11 is connected to another chip through an another-chip connection region 525-11*a*.

The pad 525-12 is connected to the via 523-12 in a via connection region 523-12*a*. The pad 525-12 is connected to another chip through an another-chip connection region 525-12*a*.

In the example illustrated in FIG. 47, the via connection region 523-11*a* and via connection region 523-12*a* are located on the same line along the x axis direction. The another-chip connection region 525-11*a* and the another-chip connection region 525-12*a* are located on the same line along the y axis direction.

FIG. 47 illustrates a relationship among the pads 525-13, 525-14, and 525-15 in the xy plane.

As illustrated in FIG. 47, in the xy plane, the pad 525-13 has a polygonal shape (an L shape in FIG. 47). In the xy plane, the pad 525-14 has a polygonal shape (an L shape in FIG. 47). In the xy plane, the pad 525-15 has a polygonal shape (an inverse L shape in FIG. 47).

The pad 525-13 is connected to the via 523-13 in a via connection region 523-13*a*. The pad 525-13 is connected to another chip through an another-chip connection region 525-13*a*.

The pad 525-14 is connected to the via 523-14 in a via connection region 523-14*a*. The pad 525-14 is connected to another chip through an another-chip connection region 525-14*a*.

The pad 525-15 is connected to the via 523-15 in a via connection region 523-15*a*. The pad 525-15 is connected to another chip through an another-chip connection region 525-15*a*.

In the example illustrated in FIG. 47, the via connection region 523-13*a*, the via connection region 523-14*a*, and via connection region 523-15*a* are located on the same line along the x axis direction. The another-chip connection region 525-13*a* and the another-chip connection region 525-14*a* are located on the same line along the x axis direction. The another-chip connection region 525-14*a* and the another-chip connection region 525-15*a* are located on the same line along the y axis direction.

FIG. 47 illustrates a relationship among the pad 525-16, the pad 525-17, and the pad 525-18 in the xy plane.

As illustrated in FIG. 47, in the xy plane, the pad 525-16 has a polygonal shape (an L shape in FIG. 47). In the xy plane, the pad 525-17 has a polygonal shape (an L shape in FIG. 47). In the xy plane, the pad 525-18 has a polygonal shape (an inverse L shape in FIG. 47).

The pad 525-16 is connected to the via 523-16 in a via connection region 523-16*a*. The pad 525-16 is connected to another chip through an another-chip connection region 525-16*a*.

The pad 525-17 is connected to the via 523-17 in a via connection region 523-17*a*. The pad 525-17 is connected to another chip through an another-chip connection region 525-17*a*.

The pad 525-18 is connected to the via 523-18 in a via connection region 523-18*a*. The pad 525-18 is connected to another chip through an another-chip connection region 525-18*a*.

In the example illustrated in FIG. 47, the via connection region 523-16*a*, the via connection region 523-17*a*, and via connection region 523-18*a* are located on the same line along the x axis direction. The another-chip connection region 525-16*a* and the another-chip connection region 525-17*a* are located on the same line along the x axis direction, and the another-chip connection region 525-16*a* and the another-chip connection region 525-18*a* are located on the same line along the y axis direction.

FIG. 47 illustrates a relationship between the pad 525-19 and the pad 525-20 in the xy plane.

As illustrated in FIG. 47, in the xy plane, the pad 525-19 has a polygonal shape (an L shape in FIG. 47). In the xy plane, the pad 525-20 has a polygonal shape (an inverse L shape in FIG. 47).

The pad 525-19 is connected to the via 523-19 in a via connection region 523-19*a*. The pad 525-19 is connected to another chip through an another-chip connection region 525-19*a*.

The pad 525-20 is connected to the via 523-20 in a via connection region 523-20*a*. The pad 525-20 is connected to another chip through an another-chip connection region 525-20*a*.

In the example illustrated in FIG. 47, the via connection region 523-19*a* and via connection region 523-20*a* are located on the same line along the x axis direction. The another-chip connection region 525-19*a* and the another-chip connection region 525-20*a* are located on the same line along the y axis direction.

A lower surface of the sub-chip SC0 is to be stacked on a lower surface of another sub-chip SC0. Thus, vias of the sub-chip SC0 are designed in mirror-image symmetry with respect to the lower surface of another sub-chip SC0.

The pattern of the pads 525 of the sub-chip SC1 disposed as mentioned above is correlated with a symbol Pa14 illustrated in FIG. 47.

3-3-1-2. Stacking Structure

Figure 48:
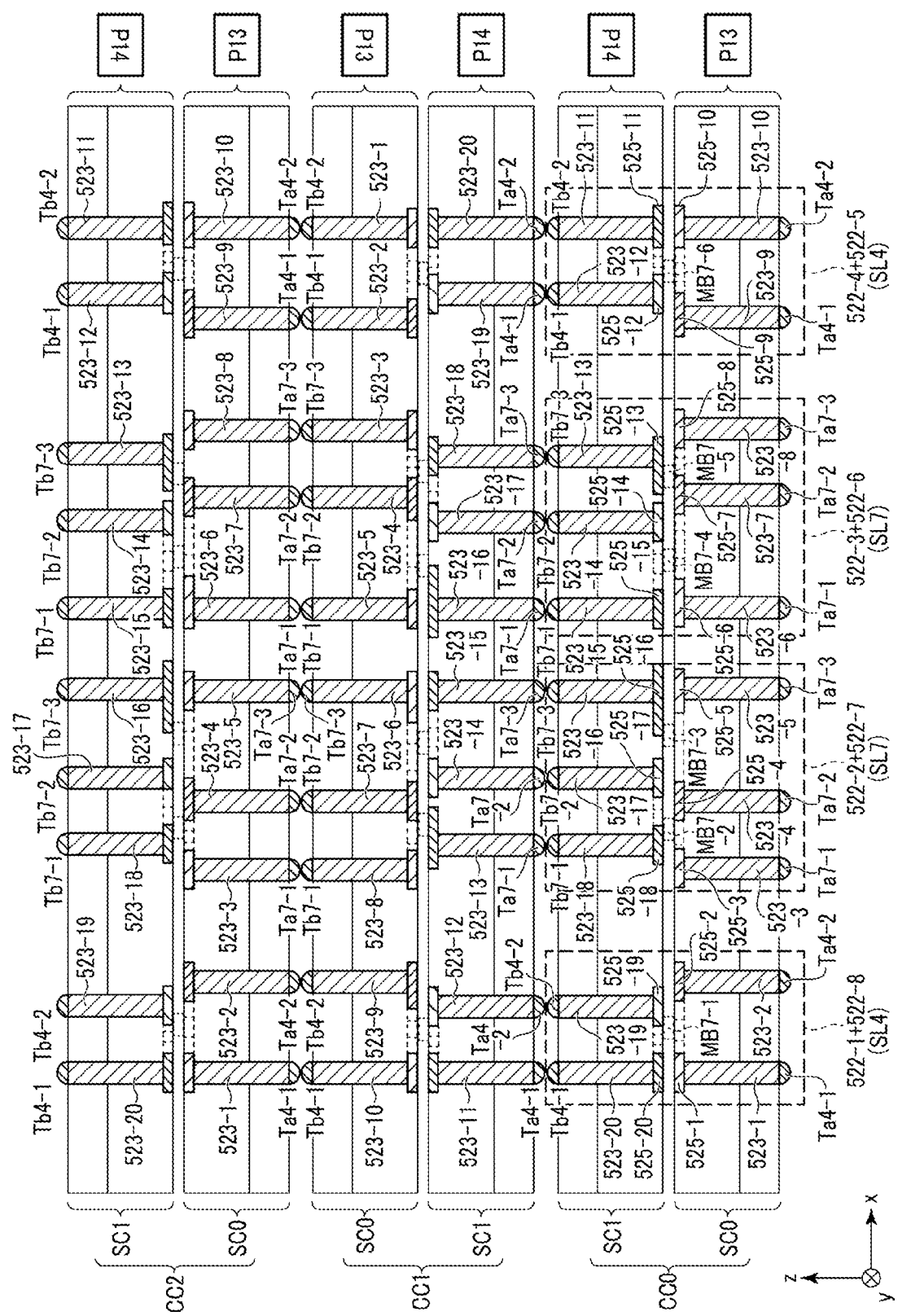
FIG. 48 is a sectional view illustrating a stacking structure of a core chip group of the semiconductor device according to the modification example of the third embodiment.

Next, with reference to FIG. 48, a description will be made of a stacking structure of the core chip group of the semiconductor device according to the modification example of the third embodiment. FIG. 48 is a sectional view illustrating a stacking structure of the core chip group of the semiconductor device according to the modification example of the third embodiment. FIG. 48 illustrates a structure in which three pairs of the sub-chips SC0 and SC1 illustrated in FIGS. 44 to 47 are stacked.

As illustrated in FIG. 48, the upper surface of the sub-chip SC0 is stacked on the upper surface of the sub-chip SC1. A position of each of the pads 525 having another-chip connection regions of the sub-chip SC0 matches a position of each of the pads 525 having another-chip connection regions of the sub-chip SC1. Specifically, positions of the pads 525-1 to 525-10 of the sub-chip SC0 respectively match positions of the pads 525-20 to 525-11 of the sub-chip SC1.

The lower surface of the sub-chip SC0 is stacked on the lower surface of another sub-chip SC0. Positions of the vias 523 of the sub-chip SC0 and positions of the vias 523 of another sub-chip SC0 are designed in mirror-image symmetry with respect to a plane where upper surfaces thereof face each other. Thus, positions of the vias 523-1 to 523-10 of the sub-chip SC0 respectively match positions of the vias 523-10 to 523-1 of another sub-chip SC0.

The lower surface of the sub-chip SC1 is stacked on the lower surface of another sub-chip SC1. Positions of the vias 523 of the sub-chip SC1 and positions of the vias 523 of another sub-chip SC1 are designed in mirror-image symmetry with respect to a plane where upper surfaces thereof face each other. Thus, positions of the vias 523-11 to 523-20 of the sub-chip SC1 respectively match positions of the vias 523-20 to 523-11 of another sub-chip SC1.

The signal path 522-1 of the sub-chip SC0 and the signal path 522-8 of the sub-chip SC1 are electrically connected to each other through a micro-bump MB7-1(1) provided between the pad 525-1 and the pad 525-19, and are electrically connected to each other through a micro-bump MB7-1(2) provided between the pad 525-2 and the pad 525-20, and thus form the signal path SL4 for performing communication with each internal circuit.

As mentioned above, in the signal path 522-1 of the sub-chip SC0 and the signal path 522-8 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 522-1 and the signal path 522-8, the signal path SL4 is provided by using shapes of the pads.

Figure 49:
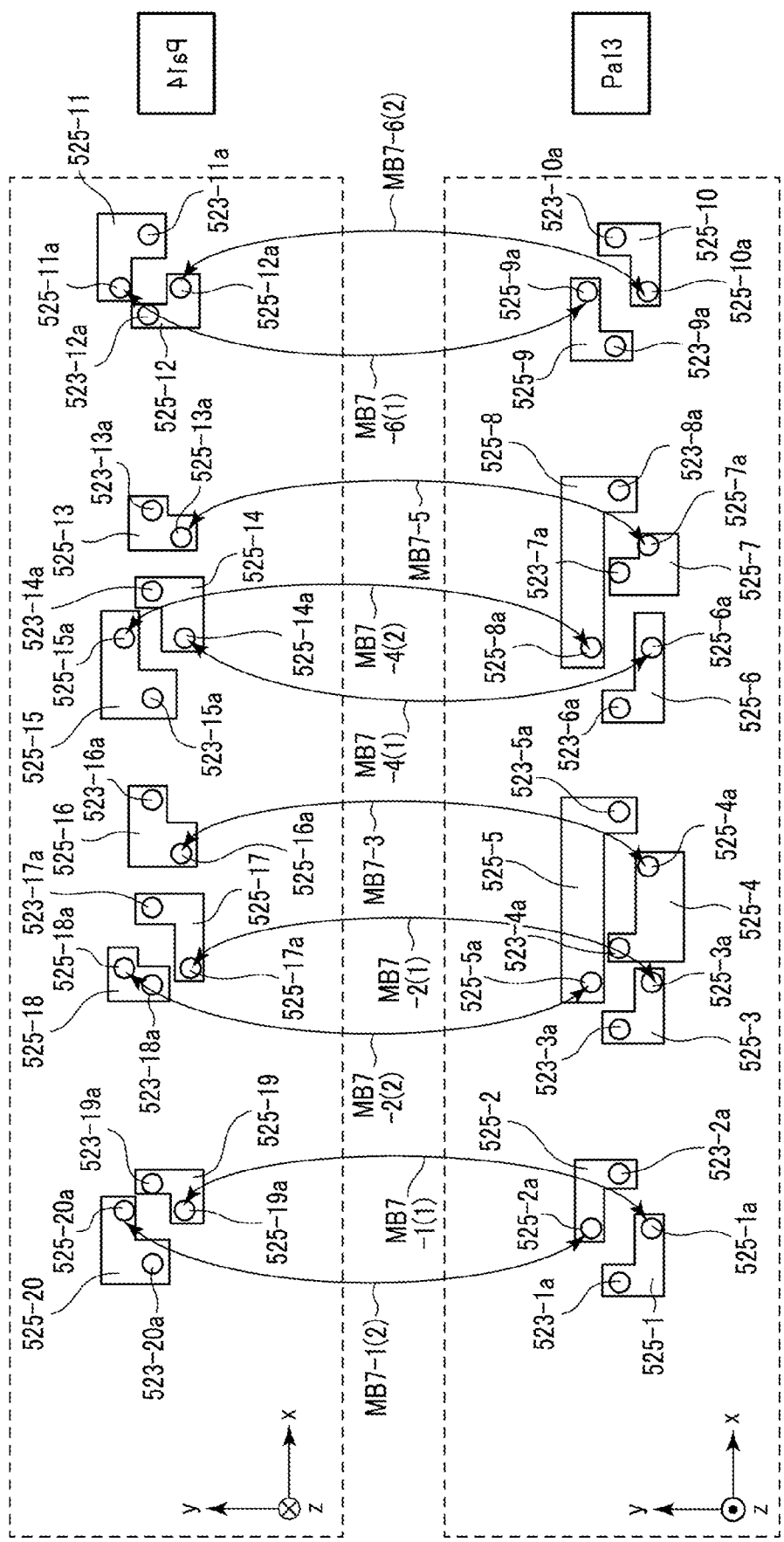
FIG. 49 is a diagram illustrating a relationship between pads of the two sub-chips of the semiconductor device according to the modification example of the third embodiment before they are stacked.

Here, with reference to FIG. 49, a description will be made of a connection method for the pads 525-1 and 525-19 and a connection method for the pads 525-2 and 525-20. FIG. 49 is a diagram illustrating a relationship between pads of the two sub-chips of the semiconductor device according to the modification example of the third embodiment before they are stacked. FIG. 49 is a diagram illustrating an xy plane of the pads 525-1 and 525-2 and an xy plane of the pads 525-19 and 525-20 before the sub-chips are stacked.

As illustrated in FIG. 49, the sub-chip SC0 and the sub-chip SC1 are stacked back to back. Thus, in FIG. 49, the pattern of the pads 525-9 and 525-10 of the sub-chip SC1 is illustrated in a state in which the pattern illustrated in FIG. 47 is horizontally rotated by 180 degrees.

The connection region 525-19a of the pad 525-19 is located over the connection region 525-1a of the pad 525-1 in the z axis direction. The connection region 525-1a of the pad 525-1 is connected to the connection region 525-19a of the pad 525-19 through the micro-bump MB7-1(1).

The connection region 525-20a of the pad 525-20 is located over the connection region 525-2a of the pad 525-2 in the z axis direction. The connection region 525-2a of the pad 525-2 is connected to the connection region 525-20a of the pad 525-20 through the micro-bump MB7-1(2).

In other words, in the two sub-chips, two pads directly connected to TSVs not facing each other on the mutual upper surfaces are electrically connected to each other indirectly.

Next, with reference to FIG. 48 again, a description will be made of another signal path. The signal path 522-2 of the sub-chip SC0 and the signal path 522-7 of the sub-chip SC1 are electrically connected to each other through a micro-bump MB7-2(1) provided between the pad 525-3 and the pad 525-17, are electrically connected to each other through a micro-bump MB7-3 provided between the pad 525-4 and the pad 525-16, and are electrically connected to each other through a micro-bump MB7-2(2) provided between the pad 525-5 and the pad 525-18, and thus form the signal path SL7 for performing communication with each internal circuit.

As mentioned above, in the signal path 522-2 of the sub-chip SC0 and the signal path 522-7 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 522-2 and the signal path 522-7, the signal path SL7 is provided by using shapes of the pads.

Here, with reference to FIG. 49, a description will be made of a connection method for the pads 525-3 and 525-17, a connection method for the pads 525-4 and 525-16, and a connection method for the pads 525-5 and 525-18. FIG. 49 is a diagram illustrating an xy plane of the pads 525-3, 525-4, and 525-5, and an xy plane of the pads 525-16, 525-17, and 525-18 before the sub-chips are stacked.

As illustrated in FIG. 49, the sub-chip SC0 and the sub-chip SC1 are stacked back to back. Thus, in FIG. 49, the pattern of the pads 525-16, 525-17, and 525-18 of the sub-chip SC1 is illustrated in a state in which the pattern illustrated in FIG. 47 is horizontally rotated by 180 degrees.

The connection region 525-17a of the pad 525-17 is located over the connection region 525-3a of the pad 525-3 in the z axis direction. The connection region 525-3a of the pad 525-3 is connected to the connection region 525-17a of the pad 525-17 through the micro-bump MB7-2(1).

The connection region 525-16a of the pad 525-16 is located over the connection region 525-4a of the pad 525-4 in the z axis direction. The connection region 525-4a of the pad 525-4 is connected to the connection region 525-16a of the pad 525-16 through the micro-bump MB7-3.

The connection region 525-18a of the pad 525-18 is located over the connection region 525-5a of the pad 525-5 in the z axis direction. The connection region 525-5a of the pad 525-5 is connected to the connection region 525-18a of the pad 525-18 through the micro-bump MB7-2(2).

In other words, in the two sub-chips, two pads directly connected to TSVs not facing each other on the mutual upper surfaces are electrically connected to each other indirectly.

Next, with reference to FIG. 48 again, a description will be made of another signal path. The signal path 522-3 of the sub-chip SC0 and the signal path 522-6 of the sub-chip SC1 are electrically connected to each other through a micro-bump MB7-4(1) provided between the pad 525-6 and the pad 525-14, are electrically connected to each other through a micro-bump MB7-5 provided between the pad 525-7 and the pad 525-13, and are electrically connected to each other through a micro-bump MB7-4(2) provided between the pad 525-8 and the pad 525-15, and thus form the signal path SL7 for performing communication with each internal circuit.

As mentioned above, in the signal path 522-3 of the sub-chip SC0 and the signal path 522-6 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 522-3 and the signal path 522-6, the signal path SL7 is provided by using shapes of the pads.

Here, with reference to FIG. 49, a description will be made of a connection method for the pads 525-6 and 525-14, a connection method for the pads 525-7 and 525-13, and a connection method for the pads 525-8 and 525-15. FIG. 49 is a diagram illustrating an xy plane of the pads 525-6, 525-7, and 525-8, and an xy plane of the pads 525-13, 525-14, and 525-15 before the sub-chips are stacked.

As illustrated in FIG. 49, the sub-chip SC0 and the sub-chip SC1 are stacked back to back. Thus, in FIG. 49, the pattern of the pads 525-13, 525-14, and 525-15 of the sub-chip SC1 is illustrated in a state in which the pattern illustrated in FIG. 47 is horizontally rotated by 180 degrees.

The connection region 525-13a of the pad 525-13 is located over the connection region 525-3a of the pad 525-6 in the z axis direction. The connection region 525-6a of the pad 525-6 is connected to the connection region 525-13a of the pad 525-13 through the micro-bump MB7-4(1).

The connection region 525-13a of the pad 525-13 is located over the connection region 525-7a of the pad 525-7 in the z axis direction. The connection region 525-7a of the pad 525-7 is connected to the connection region 525-13a of the pad 525-13 through the micro-bump MB7-5.

The connection region 525-15a of the pad 525-15 is located over the connection region 525-8a of the pad 525-8 in the z axis direction. The connection region 525-8a of the pad 525-8 is connected to the connection region 525-15a of the pad 525-15 through the micro-bump MB7-4(2).

In other words, in the two sub-chips, two pads directly connected to TSVs not facing each other on the mutual upper surfaces are electrically connected to each other indirectly.

Next, with reference to FIG. 48 again, a description will be made of another signal path. The signal path 522-4 of the sub-chip SC0 and the signal path 522-5 of the sub-chip SC1 are electrically connected to each other through a micro-bump MB7-6(1) provided between the pad 525-9 and the pad 525-11, and are electrically connected to each other through a micro-bump MB7-6(2) provided between the pad 525-10 and the pad 525-12, and thus form the signal path SL4 for performing communication with each internal circuit.

As mentioned above, in the signal path 522-4 of the sub-chip SC0 and the signal path 522-5 of the sub-chip SC1, a signal path is bypassed such that pads directly connected to TSVs are not connected to each other by extending a pad, and thus it is possible to insert a logic element layer and also to change assignment of a terminal to which a signal or power is input for each chip. According to the signal path 522-4 and the signal path 522-5, the signal path SL4 is provided by using shapes of the pads.

Here, with reference to FIG. 49, a description will be made of a connection method for the pads 525-9 and 525-11 and a connection method for the pads 525-10 and 525-12. FIG. 49 is a diagram illustrating an xy plane of the pads 525-9 and 525-10 and an xy plane of the pads 525-11 and 525-12 before the sub-chips are stacked.

As illustrated in FIG. 49, the sub-chip SC0 and the sub-chip SC1 are stacked back to back. Thus, in FIG. 49, the pattern of the pads 525-11 and 525-12 of the sub-chip SC1 is illustrated in a state in which the pattern illustrated in FIG. 47 is horizontally rotated by 180 degrees.

The connection region 525-11a of the pad 525-11 is located over the connection region 525-9a of the pad 525-9 in the z axis direction. The connection region 525-9a of the pad 525-9 is connected to the connection region 525-11a of the pad 525-11 through the micro-bump MB7-6(1).

The connection region 525-12a of the pad 525-12 is located over the connection region 525-10a of the pad 525-10 in the z axis direction. The connection region 525-10a of the pad 525-10 is connected to the connection region 525-12a of the pad 525-12 through the micro-bump MB7-6(2).

3-3-1-3. Flow of Signal or Power

Figure 50:
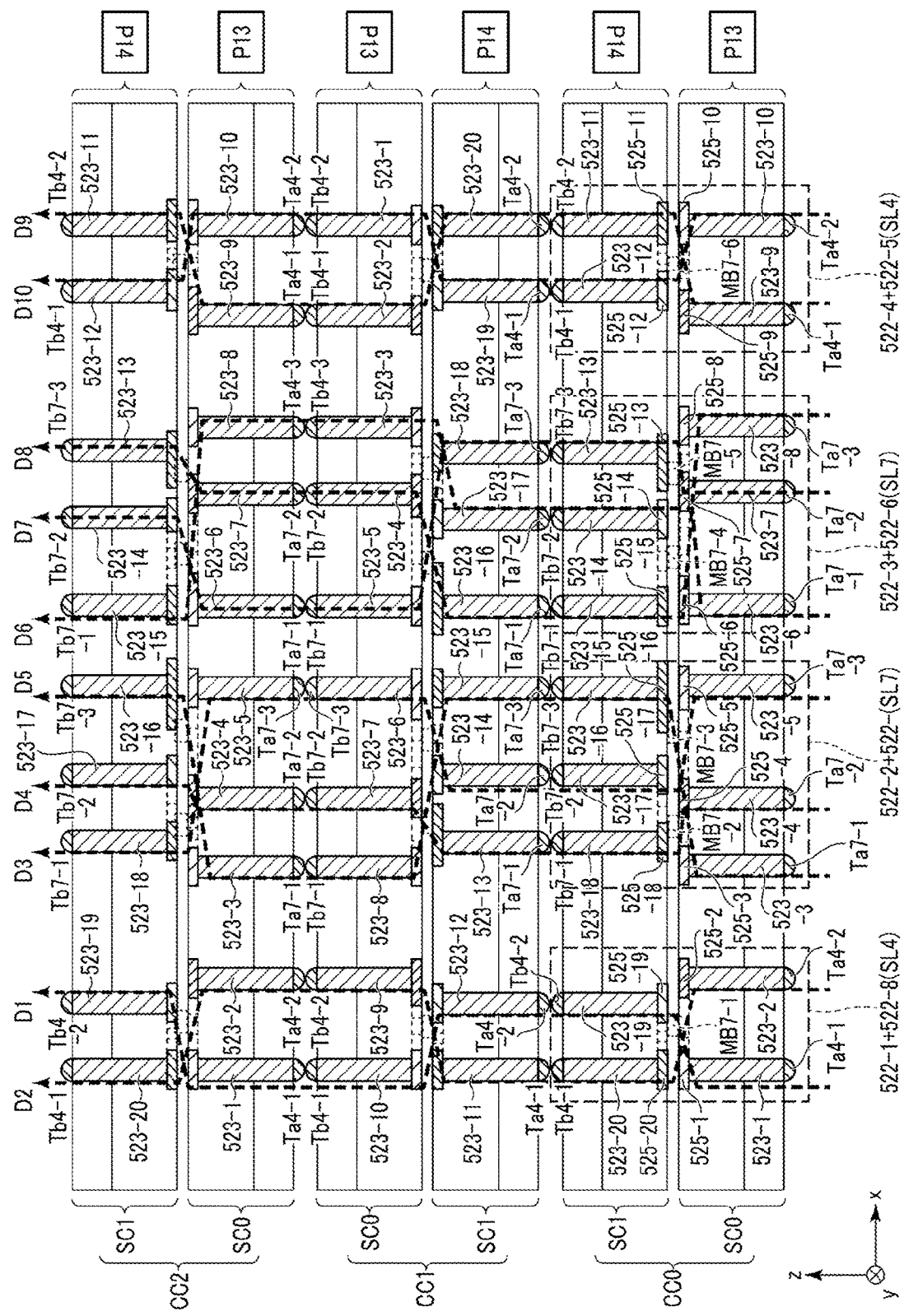
FIG. 50 is a sectional view illustrating a flow of a signal or power in the stacking structure of the core chip group of the semiconductor device according to the modification example of the third embodiment.

Here, with reference to FIG. 50, a description will be made of a flow of a signal or power. FIG. 50 is a sectional view illustrating a flow of a signal or power in the stacking structure of the core chip group of the semiconductor device according to the third embodiment. Herein, for simplification, terminals (bumps) and vias through which a signal or power flows will be focused on.

First, a description will be made of a path including the signal paths 522-1 and 522-8 by referring to arrows D1 and D2. In the core chip CC0, a signal or power which is input to the terminal Ta4-1 is output from the terminal Tb4-2 through the via 523-1 and the via 523-19. In the core chip CC1, a signal or power which is input to the terminal Ta4-1 is output from the terminal Tb4-2 through the via 523-11 and the via 523-9. In the core chip CC0, a signal or power which is input to the terminal Tb4-2 is output from the terminal Ta4-1 through the via 523-19 and the via 523-1. In the core chip CC1, a signal or power which is input to the terminal Tb4-2 is output from the terminal Ta4-1 through the via 523-9 and the via 523-11. In the core chip CC0, a signal or power which is input to the terminal Ta4-2 is output from the terminal Tb4-1 through the via 523-2 and the via 523-20. In the core chip CC1, a signal or power which is input to the terminal Ta4-2 is output from the terminal Tb4-1 through the via 523-12 and the via 523-10. In the core chip CC0, a signal or power which is input to the terminal Tb4-1 is output from the terminal Ta4-2 through the via 523-20 and the via 523-2. In the core chip CC1, a signal or power which is input to the terminal Tb4-1 is output from the terminal Ta4-2 through the via 523-10 and the via 523-12. As mentioned above, in the present embodiment, it is possible to provide the signal path SL4 in which a terminal to which a signal or power is input is changed for each chip.

A description will be made of a path including the signal paths 522-2 and 522-7 by referring to arrows D3 to D5. In the core chip CC0, a signal or power which is input to the terminal Ta1-1 is output from the terminal Tb7-2 through the via 523-3 and the via 523-17. In the core chip CC1, a signal or power which is input to the terminal Ta7-1 is output from the terminal Tb7-2 through the via 523-13 and the via 523-7. In the core chip CC0, a signal or power which is input to the terminal Tb7-2 is output from the terminal Ta1-1 through the via 523-17 and the via 523-3. In the core chip CC1, a signal or power which is input to the terminal Tb7-2 is output from the terminal Ta1-1 through the via 523-7 and the via 523-13. In the core chip CC0, a signal or power which is input to the terminal Ta1-2 is output from the terminal Tb7-3 through the via 523-4 and the via 523-16. In the core chip CC1, a signal or power which is input to the terminal Ta1-2 is output from the terminal Tb7-3 through the via 523-14 and the via 523-6. In the core chip CC0, a signal or power which is input to the terminal Tb7-3 is output from the terminal Ta1-2 through the via 523-16 and the via 523-4. In the core chip CC1, a signal or power which is input to the terminal Tb7-3 is output from the terminal Ta1-2 through the via 523-6 and the via 523-14. In the core chip CC0, a signal or power which is input to the terminal Ta1-3 is output from the terminal Tb7-1 through the via 523-5 and the via 523-18. In the core chip CC1, a signal or power which is input to the terminal Ta1-3 is output from the terminal Tb7-1 through the via 523-15 and the via 523-8. In the core chip CC0, a signal or power which is input to the terminal Tb7-1 is output from the terminal Ta1-3 through the via 523-18 and the via 523-5. In the core chip CC1, a signal or power which is input to the terminal Tb7-1 is output from the terminal Ta1-3 through the via 523-8 and the via 523-15. As mentioned above, in the present embodiment, it is possible to provide the signal path SL7 in which a terminal to which a signal or power is input is changed for each chip.

A description will be made of a path including the signal paths 522-3 and 522-6 by referring to arrows D6 to D8. In the core chip CC0, a signal or power which is input to the terminal Ta1-1 is output from the terminal Tb7-2 through the via 523-6 and the via 523-14. In the core chip CC1, a signal or power which is input to the terminal Ta7-1 is output from the terminal Tb7-2 through the via 523-16 and the via 523-4. In the core chip CC0, a signal or power which is input to the terminal Tb7-2 is output from the terminal Ta1-1 through the via 523-14 and the via 523-6. In the core chip CC1, a signal or power which is input to the terminal Tb7-2 is output from the terminal Ta1-1 through the via 523-4 and the via 523-16. In the core chip CC0, a signal or power which is input to the terminal Ta1-2 is output from the terminal Tb7-3 through the via 523-7 and the via 523-13. In the core chip CC1, a signal or power which is input to the terminal Ta1-2 is output from the terminal Tb7-3 through the via 523-17 and the via 523-3. In the core chip CC0, a signal or power which is input to the terminal Tb7-3 is output from the terminal Ta1-2 through the via 523-13 and the via 523-7. In the core chip CC1, a signal or power which is input to the terminal Tb7-3 is output from the terminal Ta1-2 through the via 523-3 and the via 523-17. In the core chip CC0, a signal or power which is input to the terminal Ta1-3 is output from the terminal Tb7-1 through the via 523-8 and the via 523-15. In the core chip CC1, a signal or power which is input to the terminal Ta1-3 is output from the terminal Tb7-1 through the via 523-18 and the via 523-5. In the core chip CC0, a signal or power which is input to the terminal Tb7-1 is output from the terminal Ta1-3 through the via 523-15 and the via 523-8. In the core chip CC1, a signal or power which is input to the terminal Tb7-1 is output from the terminal Ta1-3 through the via 523-18 and the via 523-5. As mentioned above, in the present embodiment, it is possible to provide the signal path SL7 in which a terminal to which a signal or power is input is changed for each chip.

A description will be made of a path including the signal paths 522-4 and 522-5 by referring to arrows D9 and D10. In the core chip CC0, a signal or power which is input to the terminal Ta4-1 is output from the terminal Tb4-2 through the via 523-9 and the via 523-11. In the core chip CC1, a signal or power which is input to the terminal Ta4-1 is output from the terminal Tb4-2 through the via 523-19 and the via 523-1. In the core chip CC0, a signal or power which is input to the terminal Tb4-2 is output from the terminal Ta4-1 through the via 523-11 and the via 523-9. In the core chip CC1, a signal or power which is input to the terminal Tb4-2 is output from the terminal Ta4-1 through the via 523-1 and the via 523-19. In the core chip CC0, a signal or power which is input to the terminal Ta4-2 is output from the terminal Tb4-1 through the via 523-10 and the via 523-12. In the core chip CC1, a signal or power which is input to the terminal Ta4-2 is output from the terminal Tb4-1 through the via 523-20 and the via 523-2. In the core chip CC0, a signal or power which is input to the terminal Tb4-1 is output from the terminal Ta4-2 through the via 523-12 and the via 523-10. In the core chip CC1, a signal or power which is input to the terminal Tb4-1 is output from the terminal Ta4-2 through the via 523-2 and the via 523-20. As mentioned above, in the present embodiment, it is possible to provide the signal path SL4 in which a terminal to which a signal or power is input is changed for each chip.

As illustrated in FIG. 50, in the signal paths 522-1 and 522-8, a signal flows from the via 523-1 to the via 523-19, flows from the via 523-19 to the via 523-12, flows from the via 523-12 to the via 523-10, and flows from the via 523-10 to the via 523-1 (refer to the arrow D1). In the signal paths 522-1 and 522-8, a signal flows from the via 523-2 to the via 523-20, flows from the via 523-20 to the via 523-11, flows from the via 523-11 to the via 523-9, and flows from the via 523-9 to the via 523-2 (refer to the arrow D2). As mentioned above, in the present embodiment, it is possible to provide the signal path SL4 in which a TSV to which a signal is input is changed for each chip.

In the signal paths 522-2 and 522-7, a signal flows from the via 523-3 to the via 523-17, flows from the via 523-17 to the via 523-14, flows from the via 523-14 to the via 523-6, flows from the via 523-6 to the via 523-5, flows from the via 523-5 to the via 523-18, flows from the via 523-18 to the via 523-13, flows from the via 523-13 to the via 523-7, flows from the via 523-7 to the via 523-4, flows from the via 523-4 to the via 523-16, flows from the via 523-16 to the via 523-15, flows from the via 523-15 to the via 523-8, and flows from the via 523-8 to the via 523-3 (refer to the arrows D3 to D5). As mentioned above, in the present embodiment, it is possible to provide the signal path SL7 in which a TSV to which a signal is input is changed for each chip.

In the signal paths 522-3 and 522-6, a signal flows from the via 523-6 to the via 523-14, flows from the via 523-14 to the via 523-17, flows from the via 523-17 to the via 523-3, flows from the via 523-3 to the via 523-8, flows from the via 523-8 to the via 523-15, flows from the via 523-15 to the via 523-16, flows from the via 523-16 to the via 523-4, flows from the via 523-4 to the via 523-7, flows from the via 523-7 to the via 523-13, flows from the via 523-13 to the via 523-18, flows from the via 523-18 to the via 523-5, and flows from the via 523-5 to the via 523-6 (refer to the arrows D6 to D8). As mentioned above, in the present embodiment, it is possible to provide the signal path SL7 in which a TSV to which a signal is input is changed for each chip.

In the signal paths 522-4 and 522-5, a signal flows from the via 523-9 to the via 523-11, flows from the via 523-11 to the via 523-20, flows from the via 523-20 to the via 523-2, and flows from the via 523-2 to the via 523-9 (refer to the arrow D9). In the signal paths 522-4 and 522-5, a signal flows from the via 523-10 to the via 523-12, flows from the via 523-12 to the via 523-19, flows from the via 523-19 to the via 523-1, and flows from the via 523-1 to the via 523-10 (refer to the arrow D10). As mentioned above, in the present embodiment, it is possible to provide the signal path SL4 in which a TSV to which a signal is input is changed for each chip.

3-3-2. Effects

According to the embodiment, it is possible to achieve the same effects as those in the first embodiment.

4. Others

In the above-described respective embodiments, a description will be made of examples for providing the signal paths SL1 to SL7. The above-described respective embodiments may be combined with each other. For example, the first to third embodiments may be combined with each other. For example, Modification Example 1 and Modification Example 2 of the first embodiment, the modification example of the second embodiment, and the modification example of the third embodiment may be combined with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first chip that has
a first substrate,
a first element layer on a first surface of the first substrate,
a plurality of pads, including a first pad, that are exposed from a first surface of the first element layer, and
a plurality of vias, including a first via, that penetrate through the first substrate and the first element layer, each via being exposed from a second surface of the first substrate and being directly connected to one of the pads of the first chip; and
a second chip that has
a second substrate,
a second element layer on a first surface of the second substrate,
a plurality of pads, including a second pad and a third pad, that are exposed from a first surface of the second element layer, and
a plurality of vias, including a second via, that penetrate through the second substrate and the second element layer, each via being exposed from a second surface of the second substrate and being directly connected to one of the pads of the second chip,
wherein the first pad is directly connected to the first via and the second pad is directly connected to the second via, and a first wiring provided in the second element layer electrically connects the second pad and the third pad,
wherein the first chip and the second chip are stacked on each other such that the first surface of the first element layer faces the first surface of the second element layer, and a first conductor is in direct contact with the first pad and the third pad,
wherein the first pad extends in a first direction parallel to the first surface of the first element layer and has a first portion aligned with the first via along a second direction that is perpendicular to the first surface of the first element layer and a second portion aligned with the third pad along the second direction, and
wherein the first via and the second via are aligned along the second direction.

2. The semiconductor device according to claim 1, further comprising:
an insulator between the first portion of the first pad and the second pad in the first second direction.

3. A semiconductor device comprising:
a first chip that has
a first substrate,
a first element layer on a first surface of the first substrate,
a plurality of pads, including a first pad, that are exposed from a first surface of the first element layer, and
a plurality of vias, including a first via, that penetrate through the first substrate and the first element layer, each via being exposed from a second surface of the first substrate and being directly connected to one of the pads of the first chip;
a second chip that has
a second substrate,
a second element layer on a first surface of the second substrate,
a plurality of pads, including a second pad and a third pad, that are exposed from a first surface of the second element layer, and
a plurality of vias, including a second via, that penetrate through the second substrate and the second element layer, each via being exposed from a second surface of the second substrate and being directly connected to one of the pads of the second chip; and
a first logic element that is directly connected to a first wiring provided in the second element layer and is in an electrical path between the second pad and the third pad,
wherein the first pad is directly connected to the first via and the second pad is directly connected to the second via, and the first wiring electrically connects the second pad and the third pad,
wherein the first chip and the second chip are stacked on each other such that the first surface of the first element layer faces the first surface of the second element layer, and a first conductor is in direct contact with the first pad and the third pad,
wherein the first pad extends in a first direction parallel to the first surface of the first element layer and has a first portion aligned with the first via along a second direction that is perpendicular to the first surface of the first element layer and a second portion aligned with the third pad along the second direction,
wherein the plurality of vias of the first chip include a third via aligned with the second via along the second direction, and the plurality of pads of the first chip include a fourth pad directly connected to the third via, aligned with the third via along the second direction, and electrically isolated from the second pad, and
wherein the plurality of vias of the second chip include a fourth via aligned with the first via along the second direction, and the plurality of pads of the second chip include a fifth pad directly connected to the fourth via, aligned with fourth via along the second direction, and electrically isolated from the first pad.

4. The semiconductor device according to claim 3,
wherein the plurality of pads of the first chip include a sixth pad between the first pad and fourth pad in the first direction, and
wherein the sixth pad is electrically connected to the fifth pad through a second conductor and to the fourth pad through a second wiring provided in the first element layer.

5. A semiconductor device comprising:
a first chip that has
a first substrate,
a first element layer on a first surface of the first substrate,
a plurality of pads, including a first pad, that are exposed from a first surface of the first element layer, and
a plurality of vias, including a first via, that penetrate through the first substrate and the first element layer, each via being exposed from a second surface of the first substrate and being directly connected to one of the pads of the first chip; and
a second chip that has
a second substrate,
a second element layer on a first surface of the second substrate, a plurality of pads, including a second pad and a third pad, that are exposed from a first surface of the second element layer, and a plurality of vias, including a second via, that penetrate through the second substrate and the second element layer, each via being exposed from a second surface of the second substrate and being directly connected to one of the pads of the second chip, wherein the first pad is directly connected to the first via and the second pad is directly connected to the second via, and a first wiring provided in the second element layer electrically connects the second pad and the third pad, wherein the first chip and the second chip are stacked on each other such that the first surface of the first element layer faces the first surface of the second element layer, and a first conductor is in direct contact with the first pad and the third pad, wherein the first pad extends in a first direction parallel to the first surface of the first element layer and has a first portion aligned with the first via along a second direction that is perpendicular to the first surface of the first element layer and a second portion aligned with the third pad along the second direction, wherein the plurality of vias of the first chip include a third via, and the plurality of pads of the first chip include a fourth pad directly connected to the third via and aligned with the third via along the second direction, and wherein the plurality of vias of the second chip include a fourth via, and the plurality of pads of the second chip include a fifth pad directly connected to the fourth via, aligned with the fourth via and the fourth pad along the second direction, and connected to the fourth pad through a second conductor.

6. The semiconductor device according to claim 5, wherein the third and fourth vias and the fourth and fifth pads are electrically connected to a power supply terminal.

7. The semiconductor device according to claim 6, wherein the first, second, third and fourth vias have substantially the same length in the second direction.

* * * * *